US012580547B2

(12) United States Patent
Yamauchi et al.

(10) Patent No.: US 12,580,547 B2
(45) Date of Patent: Mar. 17, 2026

(54) ACOUSTIC WAVE DEVICE

(71) Applicant: Murata Manufacturing Co., Ltd.,
Nagaokakyo (JP)

(72) Inventors: Junji Yamauchi, Nagaokakyo (JP);
Kentaro Nakamura, Nagaokakyo (JP);
Katsuya Daimon, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 277 days.

(21) Appl. No.: 18/131,389

(22) Filed: Apr. 6, 2023

(65) Prior Publication Data

US 2023/0246627 A1     Aug. 3, 2023

Related U.S. Application Data

(63) Continuation of application No.
PCT/JP2021/038418, filed on Oct. 18, 2021.

(30) Foreign Application Priority Data

Oct. 19, 2020     (JP) ................................. 2020-175299

(51) Int. Cl.
*H03H 9/25* (2006.01)
*H03H 9/02* (2006.01)
*H03H 9/64* (2006.01)

(52) U.S. Cl.
CPC .... *H03H 9/02574* (2013.01); *H03H 9/02015*
(2013.01); *H03H 9/25* (2013.01); *H03H 9/64*
(2013.01)

(58) Field of Classification Search
CPC ........ H03H 9/25; H03H 9/02574; H03H 9/64;
H03H 9/02015

USPC .................................................... 333/186, 193
See application file for complete search history.

(56) References Cited

U.S. PATENT DOCUMENTS

| | | | | |
|---|---|---|---|---|
| 2015/0028720 A1* | 1/2015 | Kando | ................... | H10N 30/04 |
| | | | | 156/230 |
| 2015/0280689 A1* | 10/2015 | Nakamura | ......... | H03H 9/02834 |
| | | | | 333/195 |
| 2019/0074819 A1 | 3/2019 | Goto et al. | | |
| 2019/0393855 A1 | 12/2019 | Nakagawa et al. | | |
| | (Continued) | | | |

FOREIGN PATENT DOCUMENTS

| | | |
|---|---|---|
| JP | 2019036963 A | 3/2019 |
| JP | 2019186655 A | 10/2019 |
| | (Continued) | |

OTHER PUBLICATIONS

International Search Report in PCT/JP2021/038418, mailed Dec.
28, 2021, 3 pages.

(Continued)

*Primary Examiner* — Rakesh B Patel
(74) *Attorney, Agent, or Firm* — Keating & Bennett, LLP

(57) ABSTRACT

An acoustic wave device includes a support substrate, a
quartz-crystal layer provided directly or indirectly on the
support substrate, a piezoelectric layer on the quartz-crystal
layer, and an IDT electrode on the piezoelectric layer. When
λ represents a wavelength defined by an electrode finger
pitch of the IDT electrode, a thickness of the quartz-crystal
layer is about 0.2λ or more and about 0.4λ or less, and the
piezoelectric layer has a thickness smaller than the thickness
of the quartz-crystal layer.

18 Claims, 8 Drawing Sheets

(56)              References Cited

U.S. PATENT DOCUMENTS

| | | |
|---|---|---|
| 2020/0067480 A1 | 2/2020 | Tai et al. |
| 2021/0036679 A1* | 2/2021 | Kishino ............. H03H 9/02157 |
| 2021/0399712 A1 | 12/2021 | Daimon |
| 2022/0123711 A1* | 4/2022 | Taniguchi .......... H03H 9/02574 |

FOREIGN PATENT DOCUMENTS

| | | |
|---|---|---|
| WO | 2018164211 A1 | 9/2018 |
| WO | 2018203430 A1 | 11/2018 |
| WO | 2020184621 A1 | 9/2020 |

OTHER PUBLICATIONS

Written Opinion in PCT/JP2021/038418, mailed Dec. 28, 2021, 4 pages.

\* cited by examiner

ACOUSTIC WAVE DEVICE

CROSS REFERENCE TO RELATED APPLICATIONS

This application claims the benefit of priority to Japanese Patent Application No. 2020-175299 filed on Oct. 19, 2020 and is a Continuation Application of PCT Application No. PCT/JP2021/038418 filed on Oct. 18, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used in, for example, filters of cellular phones. International Publication No. 2018/164211 discloses an example of a multiplexer in which an acoustic wave filter including an acoustic wave device is used. The acoustic wave device described in International Publication No. 2018/164211 includes an IDT (Interdigital Transducer) electrode disposed on a multilayer substrate. The multilayer substrate includes a silicon substrate, a silicon oxide layer, and a piezoelectric body that are stacked in this order. In the multiplexer, adjustment is performed so that a frequency of a higher-order mode is positioned outside a pass band of the acoustic wave filter.

SUMMARY OF THE INVENTION

However, the acoustic wave device described in International Publication No. 2018/164211 has difficulty in sufficiently suppressing a ripple itself due to the higher-order mode.

Preferred embodiments of the present invention provide acoustic wave devices each being capable of suppressing a higher-order mode in a wide band.

An acoustic wave device according to a preferred embodiment of the present disclosure includes a support substrate, a silicon oxide layer provided directly or indirectly on the support substrate and having crystallinity, a piezoelectric layer on the silicon oxide layer having crystallinity, and an IDT electrode on the piezoelectric layer. When A represents a wavelength defined by an electrode finger pitch of the IDT electrode, a thickness of the silicon oxide layer having crystallinity is about 0.2λ or more and about 0.4λ or less, and the piezoelectric layer has a thickness smaller than the thickness of the silicon oxide layer having crystallinity.

With the acoustic wave devices according to preferred embodiments of the present disclosure, a higher-order mode can be suppressed in a wide band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through the description of specific preferred embodiments thereof, with reference to the drawings.

Note that preferred embodiments in the present description are examples, and the configurations in the different preferred embodiments can be partially replaced from one to another or combined with one another.

Figure 1:
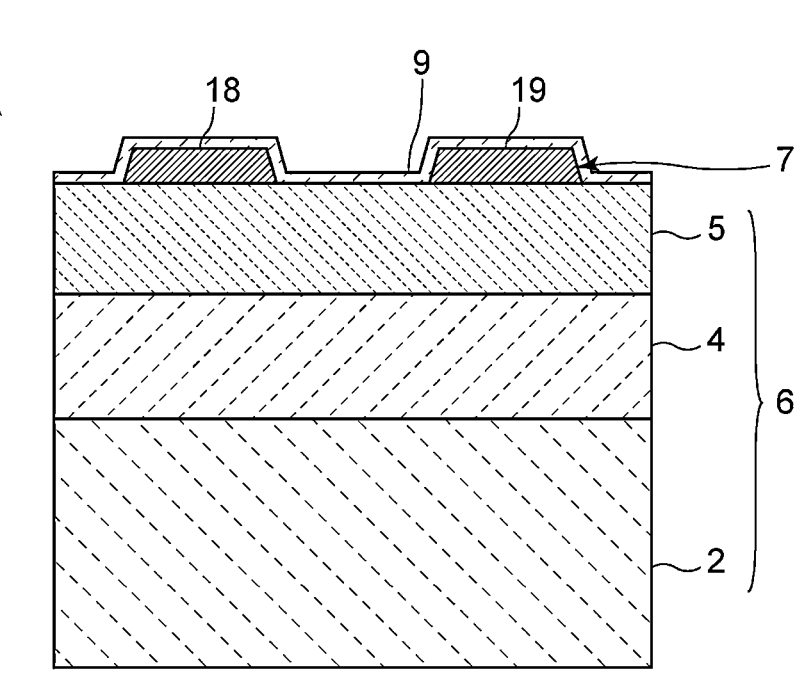
FIG. 1 is a front sectional view of a portion of an acoustic wave device according to a first preferred embodiment of the present invention.
Figure 2:
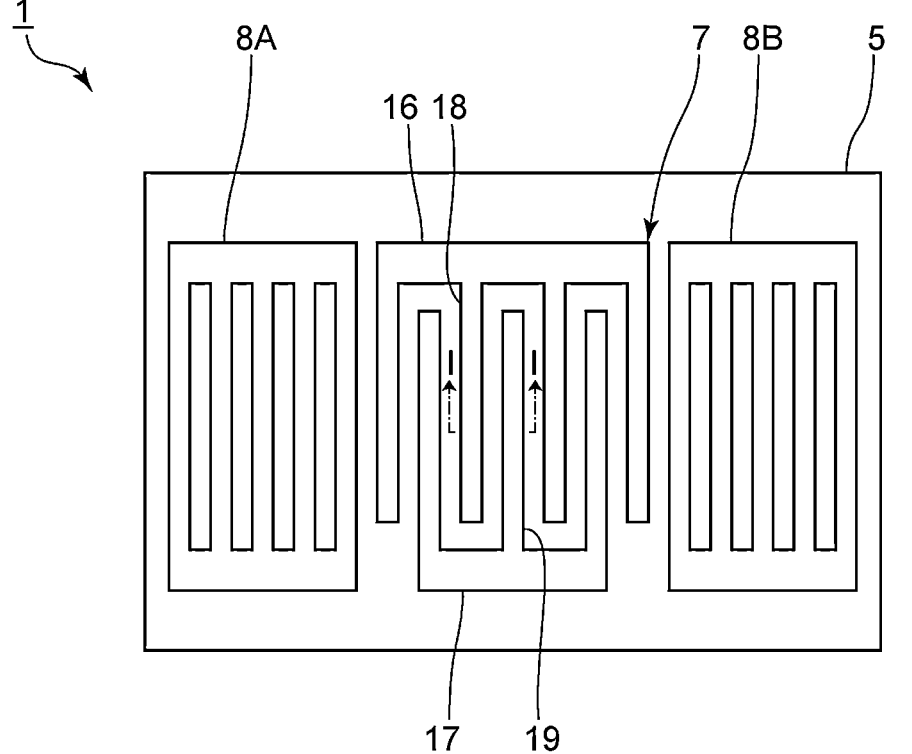
FIG. 2 is a plan view of the acoustic wave device according to the first preferred embodiment of the present invention.

FIG. 1 is a front sectional view of a portion of an acoustic wave device according to a first preferred embodiment of the present disclosure. FIG. 2 is a plan view of the acoustic wave device according to the first preferred embodiment. Note that FIG. 1 is a sectional view taken along line I-I in FIG. 2. In FIG. 2, illustration of a protective film, which will be described later, is omitted.

As FIG. 1 illustrates, an acoustic wave device 1 includes a multilayer substrate 6. The multilayer substrate 6 includes a support substrate 2, a quartz-crystal layer 4, and a piezoelectric layer 5. More specifically, the quartz-crystal layer 4 is disposed on the support substrate 2. The piezoelectric layer 5 is disposed on the quartz-crystal layer 4.

In the present preferred embodiment, the support substrate 2 is a silicon substrate. However, the material for the support substrate 2 is not limited to the above-described material. The quartz-crystal layer 4 corresponds to a silicon oxide layer having crystallinity in the present disclosure. More specifically, the quartz-crystal layer 4 is a monocrystalline quartz-crystal layer in the present preferred embodiment. However, a layer corresponding to the quartz-crystal layer 4 may be any silicon oxide layer having crystallinity. In the present description, such a silicon oxide layer having crystallinity is regarded as equivalent to a silicon oxide layer having anisotropy in the material constants thereof. Examples of the silicon oxide layer having crystallinity include a silicon oxide layer having no piezoelectricity. Note that such a state of having anisotropy in the material constants means that anisotropy is exhibited in at least one of the elastic constant, the permittivity, the piezoelectric constant, the coefficient of linear expansion, and the thermal conductivity. The silicon oxide layer having crystallinity may contain a crystal phase of, for example, tridymite, cristobalite, or coesite. When, inside the silicon oxide layer having crystallinity, the percentage of orientation in a specific direction is about 50% or more, the silicon oxide layer having crystallinity exhibits physical properties similar to those of quartz crystal and exhibits Euler angle dependence as with quartz crystal. Thus, when the silicon oxide layer having crystallinity is used, effects similar to those exhibited when quartz crystal is used are also obtained even when the silicon oxide layer having crystallinity is not quartz crystal. The crystallinity of the silicon oxide can be evaluated by using the following methods. That is, for analyzing the crystal structure, there can be used an X-ray diffraction method, electron diffraction, electron backscattered diffraction (EBSD: Electron BackScatter Diffraction), an Automated Crystal Orientation Mapping-TEM method (ACOM-TEM method), or a synchrotron radiation diffraction method enabling analysis on a very minute structure.

In the present preferred embodiment, the piezoelectric layer 5 is a lithium tantalate (LiTaO3) layer. However, the material for the piezoelectric layer 5 is not limited to the above-described material. Examples of the material for the piezoelectric layer 5 include lithium niobate.

Here, in the piezoelectric layer 5, (XLT, YLT, ZLT) represent the crystallographic axes, and ($\varphi$LT, $\theta$LT, $\psi$LT) represent the azimuthal angles, and, in the quartz-crystal layer 4, (Xq, Yq, Zq) represent the crystallographic axes, and ($\varphi$q, $\theta$q, $\psi$q) represent the azimuthal angles. In the present preferred embodiment, the piezoelectric layer 5 and the quartz-crystal layer 4 are stacked so that, when ($\varphi$LT, $\theta$LT, $\psi$LT) are (0°, 0°, 0°), and ($\varphi$q, $\theta$q, $\psi$q) are (0°, 0°, 0°), (XLT, YLT, ZLT) coincide with (Xq, Yq, Zq). Note that, in the present description, the azimuthal angles are given in Euler angle notation.

An IDT electrode 7 is disposed on the piezoelectric layer 5. An alternating voltage is applied to the IDT electrode 7, and an acoustic wave is thereby excited. As FIG. 2 illustrates, a pair of reflectors 8A and 8B is disposed on the piezoelectric layer 5 on both sides, in a propagation direction of an acoustic wave, of the IDT electrode 7. As described above, the acoustic wave device 1 of the present preferred embodiment is a surface acoustic wave resonator. Note that the acoustic wave devices according to the present disclosure are not limited thereto and may be, for example, a filter device including plural surface acoustic wave resonators or a multiplexer.

As FIG. 2 illustrates, the IDT electrode 7 includes a first busbar 16, a second busbar 17, plural first electrode fingers 18, and plural second electrode fingers 19. The first busbar 16 and the second busbar 17 face one another. One end of each of the first electrode fingers 18 is connected to the first busbar 16. One end of each of the second electrode fingers 19 is connected to the second busbar 17. The plural first electrode fingers 18 and the plural second electrode fingers 19 interdigitate with one another.

Each of the IDT electrode 7 and the reflectors 8A and 8B may include a multilayer metal film or a single-layer metal film.

Here, when $\lambda$ represents a wavelength defined by the electrode finger pitch of the IDT electrode 7, the thickness of the quartz-crystal layer 4 is about 0.2$\lambda$ or more and about 0.4$\lambda$ or less, for example. Moreover, the piezoelectric layer 5 has a thickness smaller than the thickness of the quartz-crystal layer 4. Note that the electrode finger pitch refers to a distance between the centers of adjacent ones of the electrode fingers. Specifically, the electrode finger pitch refers to a distance between the center points, in the propagation direction of the acoustic wave, of adjacent ones of the electrode fingers.

Referring back to FIG. 1, a protective film 9 is disposed on the piezoelectric layer 5 so as to cover the IDT electrode 7. The IDT electrode 7 is hardly broken with the protective film 9. As for the protective film 9, an appropriate dielectric can be used. For example, when silicon oxide is used for the protective film 9, a temperature coefficient of frequency (TCF) can be increased. When silicon nitride is used for the protective film 9, a frequency can be easily adjusted through adjustment of the thickness of the protective film 9. However, the protective film 9 is not necessarily disposed.

Some of the unique features of the present preferred embodiment include, in the multilayer substrate 6, the support substrate 2, the quartz-crystal layer 4, and the piezoelectric layer 5 are stacked, the quartz-crystal layer 4 has a thickness of about 0.2$\lambda$ or more and about 0.4$\lambda$ or less, and the piezoelectric layer 5 has a thickness smaller than the thickness of the quartz-crystal layer 4. However, as described above, a layer corresponding to the quartz-crystal layer 4 may be the silicon oxide layer having crystallinity. With the configuration, a higher-order mode can be suppressed in a wide band. Such suppression of a higher-order mode in a wide band will be demonstrated below through comparison between the present preferred embodiment and a comparative example. Note that the comparative example differs from the present preferred embodiment in that a multilayer substrate has no quartz-crystal layer. More specifically, the multilayer substrate of the comparative example is a multilayer body including a support substrate, a silicon nitride film, a silicon oxide film, and a piezoelectric layer.

The phase characteristics of an acoustic wave device having the configuration of the present preferred embodiment and the phase characteristics of an acoustic wave device of the comparative example were measured. The design parameters of the acoustic wave device having the configuration of the present preferred embodiment are as follows.

Support substrate 2; material . . . Si

Quartz-crystal layer 4; material . . . monocrystalline SiO2, thickness . . . 600 nm, azimuthal angles ($\varphi$q, $\theta$q, $\psi$q) . . . (45°, 90°, 90°)

Piezoelectric layer 5; material . . . LiTaO3, thickness . . . 400 nm, cut angle . . . 40° Y IDT electrode 7; material . . . Ti/AlCu/Ti, thickness 12 nm/100 nm/4 nm Wavelength $\lambda$ of IDT electrode 7; 2 $\mu$m FIG. 3 illustrates the phase characteristics of the acoustic wave device having the configuration of the first preferred embodiment and the phase characteristics of the acoustic wave device of the comparative example.

Figure 3:
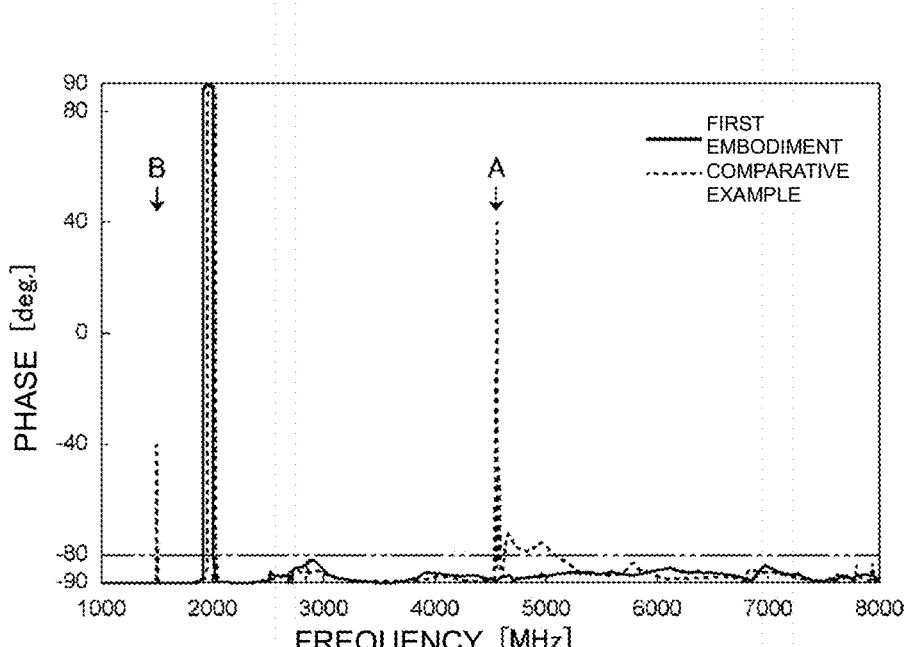
FIG. 3 illustrates the phase characteristics of an acoustic wave device having the configuration of the first preferred embodiment of the present invention and the phase characteristics of an acoustic wave device of a comparative example.

From FIG. 3, it is clear that, in the comparative example, a large spurious emission due to a higher-order mode occurs in the vicinity of the frequency indicated by arrow A. Specifically, at the frequency indicated by arrow A, the phase of the higher-order mode in the comparative example is 40 deg. In contrast, in the first preferred embodiment, the higher-order mode in the vicinity of the frequency indicated by arrow A is suppressed. Moreover, it is clear that, in the first preferred embodiment, the higher-order mode is suppressed to less than about −80 deg. in a wide band.

In addition, in the comparative example, a large spurious emission due to a Rayleigh wave occurs at the frequency indicated by arrow B. In contrast, it is clear that, in the first preferred embodiment, such a Rayleigh wave can also be suppressed.

Moreover, it will be demonstrated below that the higher-order mode can be suppressed by the quartz-crystal layer having a thickness of about 0.2$\lambda$ or more and about 0.4$\lambda$ or less. In the acoustic wave device having a multilayer substrate whose layer configuration is similar to that of the first preferred embodiment, the phase of the higher-order mode was measured while the thickness of the quartz-crystal layer was changed. The thickness of the quartz-crystal layer was changed in a range of about 200 nm or more and about 1300 nm or less in increments of about 100 nm, for example. Note that, because the wavelength $\lambda$ is defined as about 2 $\mu$m, the thickness of the quartz-crystal layer varies in a range of about 0.1$\lambda$ or more and about 0.65$\lambda$ or less in increments of about 0.05$\lambda$, for example.

Figure 4:
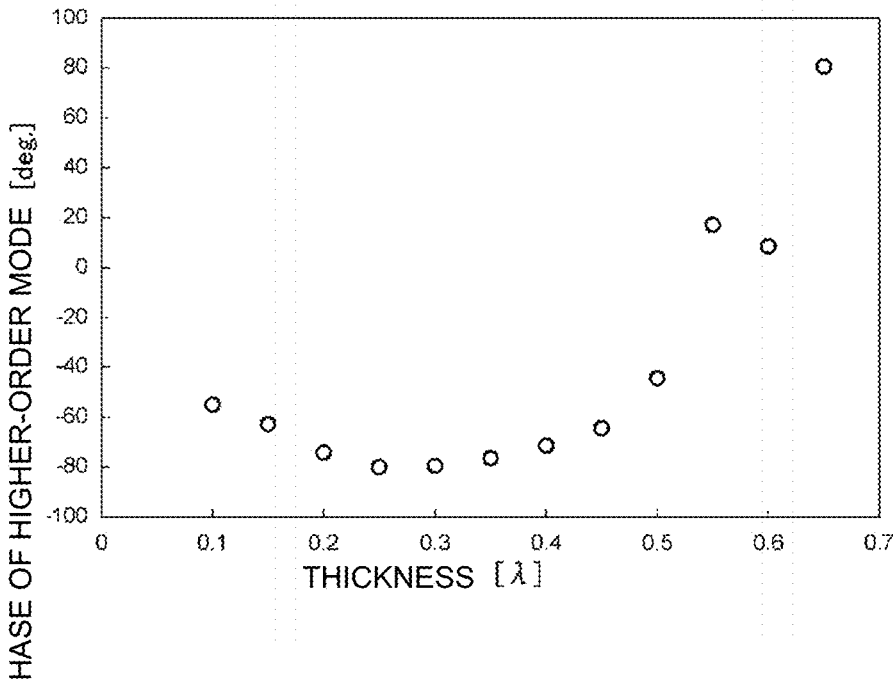
FIG. 4 illustrates the relationship between the thickness of a quartz-crystal layer and the phase of a higher-order mode.
Figure 5:
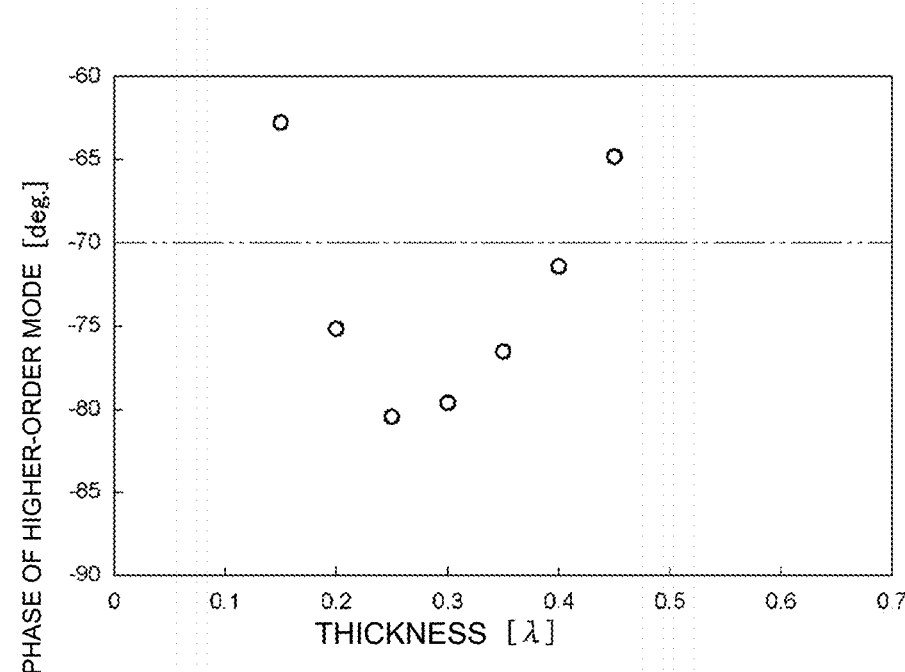
FIG. 5 is an enlarged view of FIG. 4.

FIG. 4 illustrates the relationship between the thickness of the quartz-crystal layer and the phase of the higher-order mode. FIG. 5 is an enlarged view of FIG. 4.

From FIG. 4 and FIG. 5, it is clear that, when the thickness of the quartz-crystal layer is less than about 0.2$\lambda$ and is more than about 0.4$\lambda$, the values of the phase of the higher-order mode are larger than about −70 deg, for example. In contrast, it is clear that, when the thickness of the quartz-crystal layer is about 0.2$\lambda$ or more and about 0.4$\lambda$ or less as in the first preferred embodiment, the higher-order mode is suppressed to less than about −70 deg, for example. Thus, in the first preferred embodiment, the higher-order mode can be effectively suppressed. In addition, when the thickness of the quartz-crystal layer is about 0.2$\lambda$ or more and about 0.4$\lambda$ or less, for example, the piezoelectric layer has a thickness smaller than the thickness of the quartz-crystal layer.

As described above, in the first preferred embodiment, in addition to the higher-order mode, the Rayleigh wave can also be suppressed. The study conducted by the inventors of the present application has revealed that, when the cut angle of the piezoelectric body of the piezoelectric layer 5 is changed, the azimuthal angles of the quartz-crystal layer 4 at which the Rayleigh wave can be suppressed are also changed. At this point, there was obtained the relationship between the cut angle of the piezoelectric body of the piezoelectric layer 5 and the azimuthal angles of the quartz-crystal layer 4; and the phase of the Rayleigh wave. Note that, regarding the azimuthal angles of the quartz-crystal layer 4, $\varphi$q, $\theta$q, and $\psi$q in ($\varphi$q, 10°, 0°), (0°, $\theta$q, 0°), and (0°, 10°, $\psi$q) were changed. The cut angle of lithium tantalate of the piezoelectric layer 5 was about 30° Y, about 50° Y, or about 70° Y.

Figure 6:
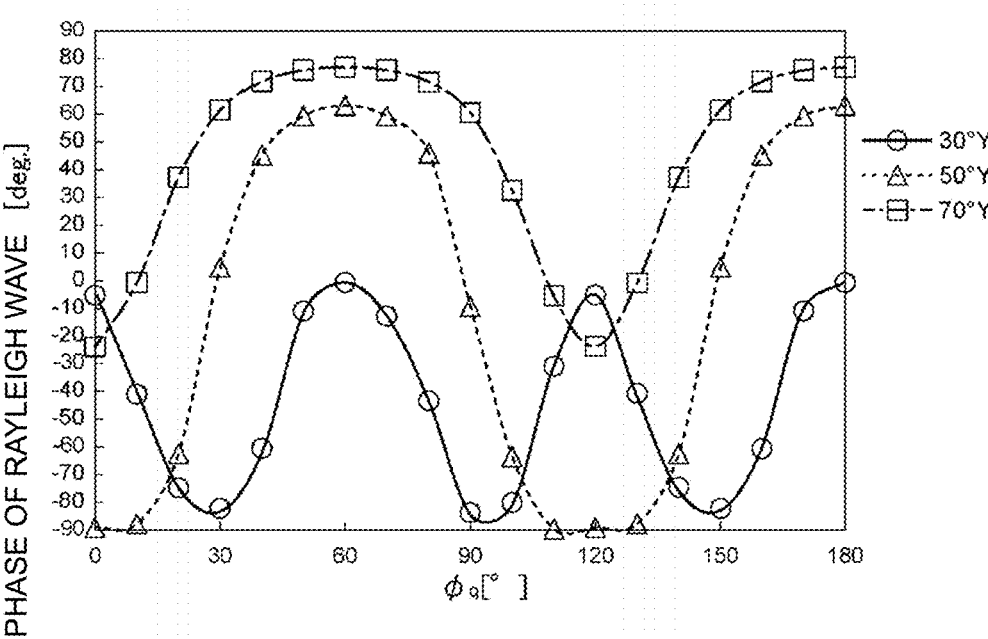
FIG. 6 illustrates the relationship between $\varphi_q$ in the azimuthal angles of the quartz-crystal layer, the cut angle of lithium tantalate of a piezoelectric layer, and the phase of a Rayleigh wave.

FIG. 6 illustrates the relationship between $\varphi$q in the azimuthal angles of the quartz-crystal layer, the cut angle of the lithium tantalate of the piezoelectric layer, and the phase of the Rayleigh wave.

As FIG. 6 illustrates, when the cut angle is about 30° Y, the Rayleigh wave is effectively suppressed in the ranges of about 10°≤$\varphi$q≤about 45°, about 80°≤$\varphi$q≤about 105°, and about 130° ≤$\varphi$q≤about 165°. Note that, here, such a state of effectively suppressing the Rayleigh wave refers to a state where values of the phase of the Rayleigh wave are within the range from the minimum value of the phase of the Rayleigh wave to a value about 40 deg. larger than the minimum value. Except where specifically noted, the same applies to the following description. When the cut angle is about 50° Y, the Rayleigh wave is effectively suppressed in the ranges of about 0°≤$\varphi$q≤about 25° and about 95°≤$\varphi$q≤about 145°. When the cut angle is 70° Y, the Rayleigh wave is effectively suppressed in the ranges of about 0°≤$\varphi$q≤about 15° and about 100°≤$\varphi$q≤about 135°, for example.

Figure 7:
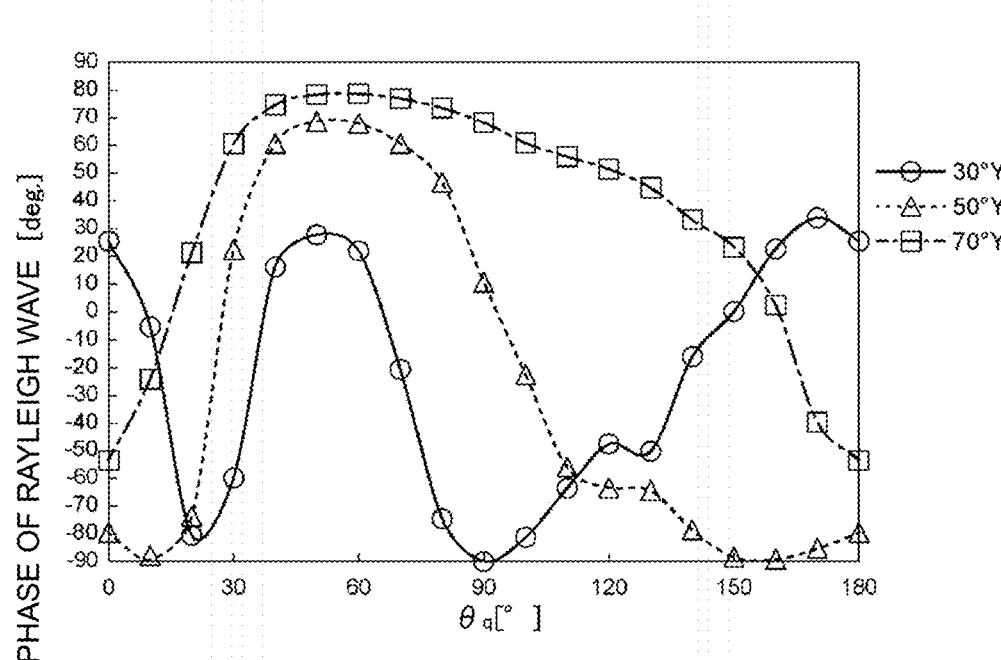
FIG. 7 illustrates the relationship between $\theta_q$ in the azimuthal angles of the quartz-crystal layer, the cut angle of the lithium tantalate of the piezoelectric layer, and the phase of the Rayleigh wave.

FIG. 7 illustrates the relationship between $\theta$q in the azimuthal angles of the quartz-crystal layer, the cut angle of the lithium tantalate of the piezoelectric layer, and the phase of the Rayleigh wave.

As FIG. 7 illustrates, when the cut angle is about 30° Y, the Rayleigh wave is effectively suppressed in the ranges of about 15°≤$\theta$q≤about 35° and about 75°≤$\theta$q≤about 115°. When the cut angle is about 50° Y, the Rayleigh wave is effectively suppressed in the ranges of about 0°≤$\theta$q≤about 25° and about 110°≤$\theta$q≤about 180°, for example. When the cut angle is about 70° Y, the Rayleigh wave is effectively suppressed in the ranges of about 0°≤$\theta$q≤about 15° and about 160°≤$\theta$q≤about 180°, for example.

Figure 8:
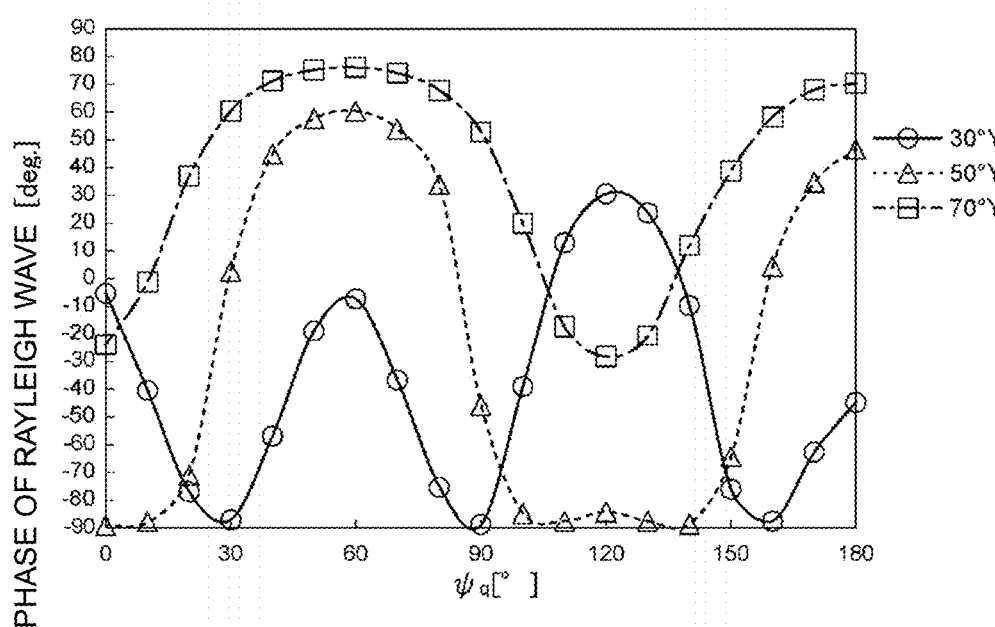
FIG. 8 illustrates the relationship between $\psi_q$ in the azimuthal angles of the quartz-crystal layer, the cut angle of the lithium tantalate of the piezoelectric layer, and the phase of the Rayleigh wave.

FIG. 8 illustrates the relationship between $\psi$q in the azimuthal angles of the quartz-crystal layer, the cut angle of the lithium tantalate of the piezoelectric layer, and the phase of the Rayleigh wave.

As FIG. 8 illustrates, when the cut angle is about 30° Y, the Rayleigh wave is effectively suppressed in the ranges of about 10°≤$\psi$q≤about 40°, about 70° $\psi$q about 100°, and about 145° ≤$\psi$q≤about 180°, for example. When the cut angle is about 50° Y, the Rayleigh wave is effectively suppressed in the ranges of about 0°≤$\psi$q≤about 25° and about 90°≤$\psi$q≤about 150°, for example. When the cut angle is about 70° Y, the Rayleigh wave is effectively suppressed in the ranges of about 0°≤$\psi$q≤about 20° and about 100°≤$\psi$q≤about 140°, for example.

In the above-described comparative example, as FIG. 3 illustrates, the phase of the higher-order mode is 40 deg. In contrast, with the configuration of the multilayer substrate 6 in the first preferred embodiment, the higher-order mode can be suppressed even when $\varphi$q, $\theta$q, and $\psi$q in the azimuthal angles of the quartz-crystal layer 4 are changed. Such suppression of the higher-order mode will be demonstrated below. Note that the measurement of the phase of the higher-order mode was conducted under conditions similar to the conditions under which the relationships in FIGS. 6 to 8 were obtained.

Figure 9:
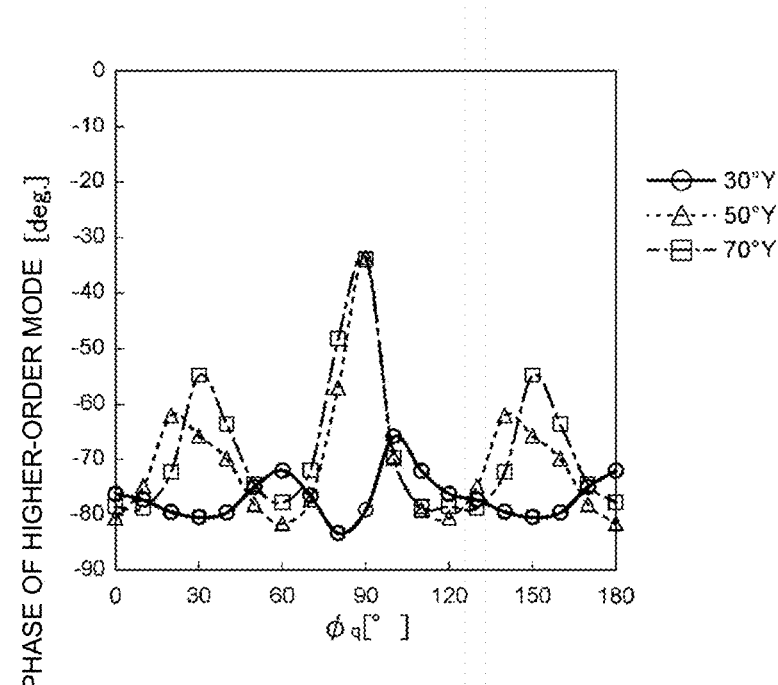
FIG. 9 illustrates the relationship between $\varphi_q$ in the azimuthal angles of the quartz-crystal layer, the cut angle of the lithium tantalate of the piezoelectric layer, and the phase of a higher-order mode.
Figure 10:
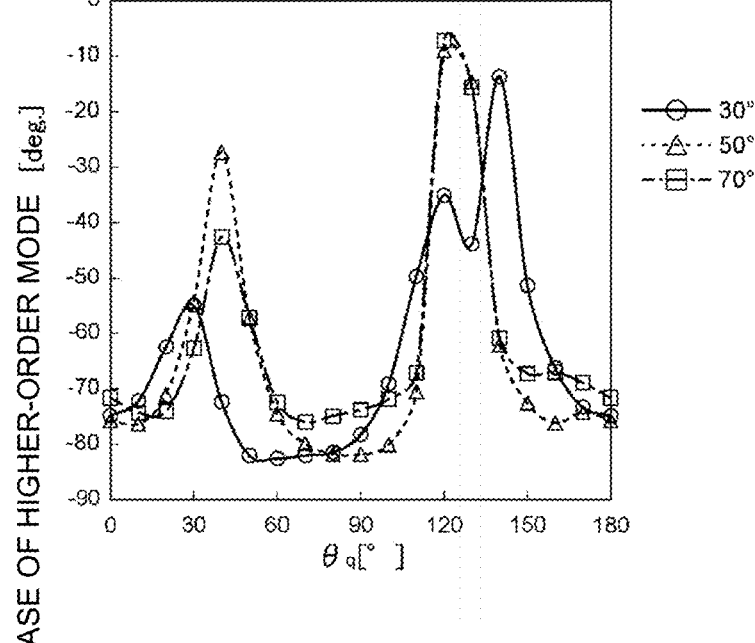
FIG. 10 illustrates the relationship between $\theta_q$ in the azimuthal angles of the quartz-crystal layer, the cut angle of the lithium tantalate of the piezoelectric layer, and the phase of the higher-order mode.
Figure 11:
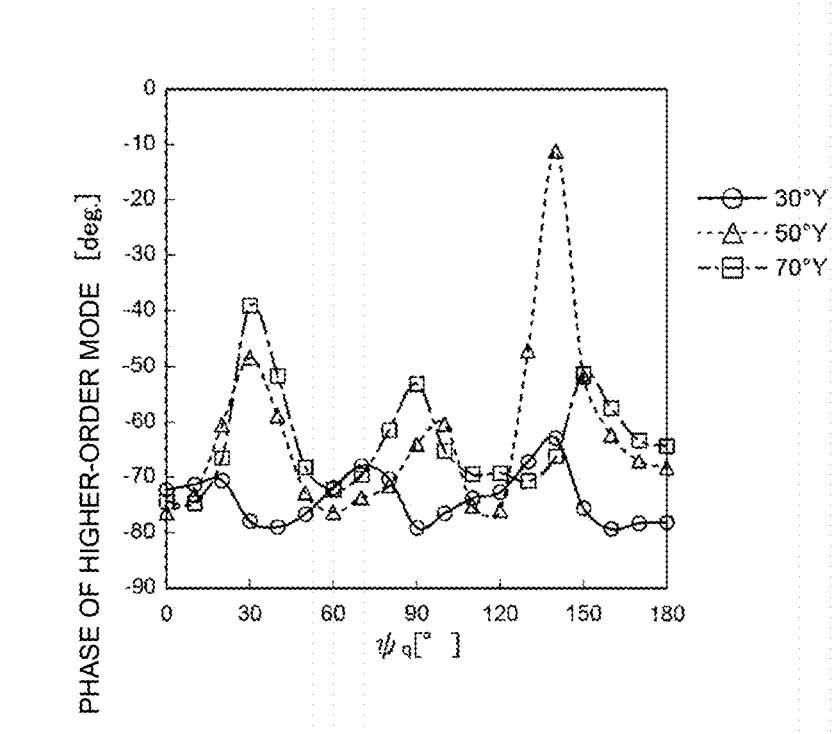
FIG. 11 illustrates the relationship between $\psi_q$ in the azimuthal angles of the quartz-crystal layer, the cut angle of the lithium tantalate of the piezoelectric layer, and the phase of the higher-order mode.

FIG. 9 illustrates the relationship between $\varphi$q in the azimuthal angles of the quartz-crystal layer, the cut angle of the lithium tantalate of the piezoelectric layer, and the phase of the higher-order mode. FIG. 10 illustrates the relationship between θq in the azimuthal angles of the quartz-crystal layer, the cut angle of the lithium tantalate of the piezoelectric layer, and the phase of the higher-order mode. FIG. 11 illustrates the relationship between ψq in the azimuthal angles of the quartz-crystal layer, the cut angle of the lithium tantalate of the piezoelectric layer, and the phase of the higher-order mode.

From FIG. 9, it is clear that, regardless of φq in the azimuthal angles of the quartz-crystal layer 4, the higher-order mode can be suppressed to less than about 40 deg., more specifically, less than about −30 deg, for example. Similarly, from FIG. 10 and FIG. 11, it is clear that, regardless of θq and ψq, the higher-order mode can be further suppressed than in the above-described comparative example.

As described above, the higher-order mode can be suppressed in the first preferred embodiment. Moreover, the Rayleigh wave can also be effectively suppressed through adjustment of the azimuthal angles of the quartz-crystal layer 4.

At this point, it was confirmed that the phase of the Rayleigh wave has low dependency on the thickness of the quartz-crystal layer 4. More specifically, the phase of the Rayleigh wave was measured in each of the cases of about 0.2λ, about 0.3λ, and about 0.4λ in thicknesses of the quartz-crystal layer 4, while an azimuthal angle was changed. Note that, regarding the azimuthal angles of the quartz-crystal layer 4, φq, θq, and ψq in (φq, 120°, 90°, (70°, θq, 90°), and (70°, 120°, ψq) were changed.

Figure 12:
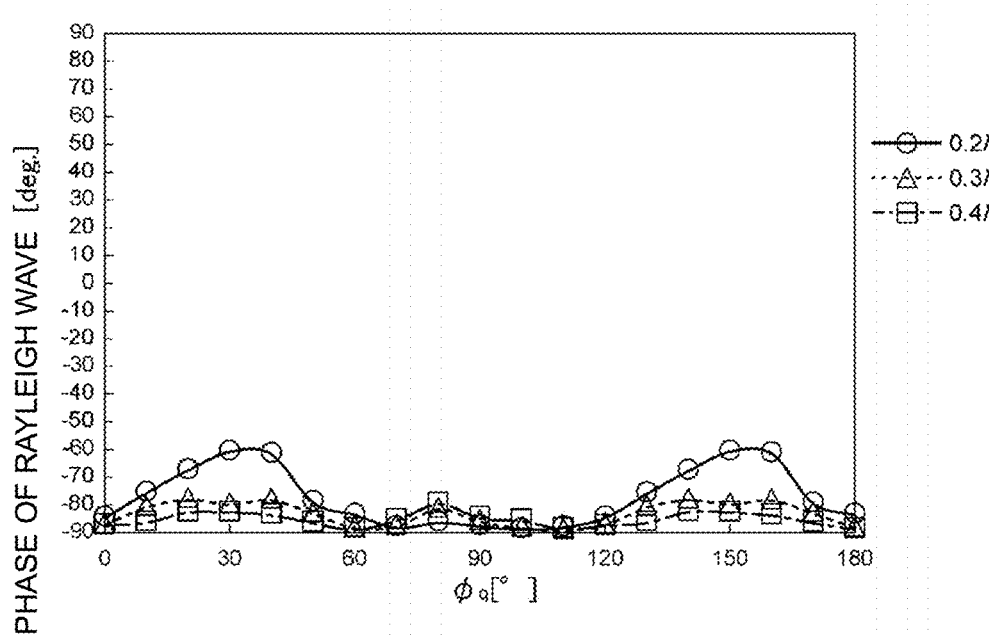
FIG. 12 illustrates the relationship between $\varphi_q$ in the azimuthal angles of the quartz-crystal layer, the thickness of the quartz-crystal layer, and the phase of the Rayleigh wave.
Figure 13:
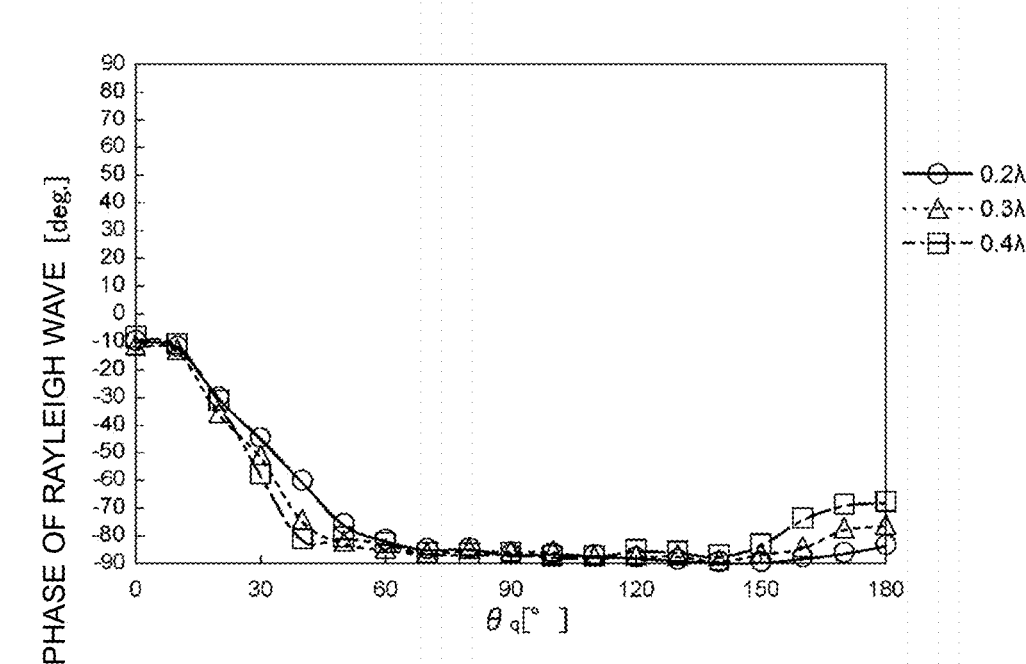
FIG. 13 illustrates the relationship between $\theta_q$ in the azimuthal angles of the quartz-crystal layer, the thickness of the quartz-crystal layer, and the phase of the Rayleigh wave.
Figure 14:
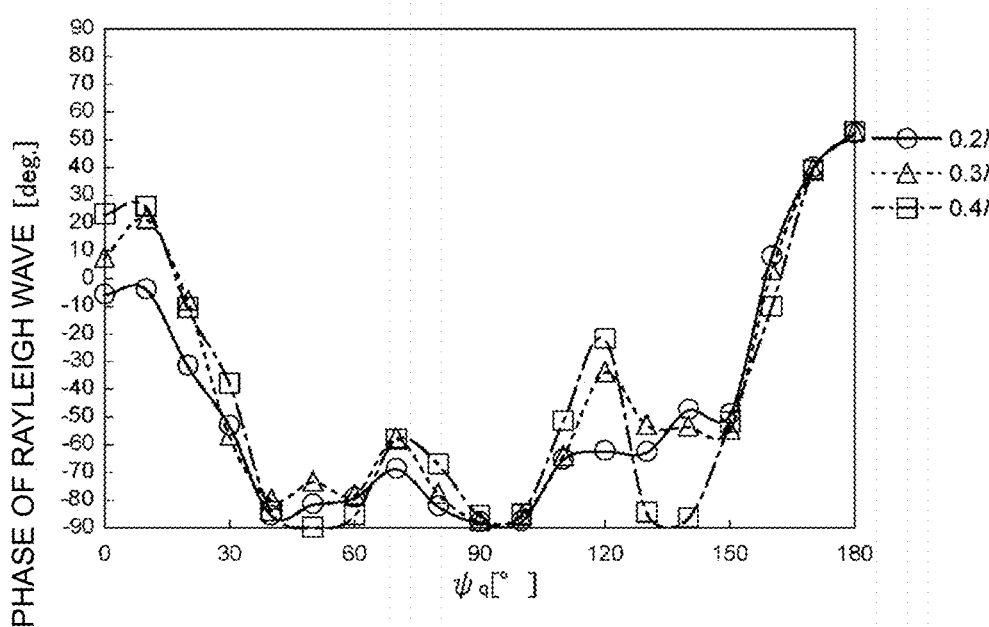
FIG. 14 illustrates the relationship between $\psi_q$ in the azimuthal angles of the quartz-crystal layer, the thickness of the quartz-crystal layer, and the phase of the Rayleigh wave.

FIG. 12 illustrates the relationship between φq in the azimuthal angles of the quartz-crystal layer, the thickness of the quartz-crystal layer, and the phase of the Rayleigh wave. FIG. 13 illustrates the relationship between θq in the azimuthal angles of the quartz-crystal layer, the thickness of the quartz-crystal layer, and the phase of the Rayleigh wave. FIG. 14 illustrates the relationship between ψ4 in the azimuthal angles of the quartz-crystal layer, the thickness of the quartz-crystal layer, and the phase of the Rayleigh wave.

From FIG. 12, it is clear that, when the thickness of the quartz-crystal layer 4 is about 0.2λ or more and about 0.4λ or less, the relationship between: φq in the azimuthal angles of the quartz-crystal layer 4; and the phase of the Rayleigh wave does not vary greatly. Similarly, from FIG. 13 and FIG. 14, it is clear that, when the thickness of the quartz-crystal layer 4 is about 0.2λ or more and about 0.4λ or less, the relationships between: θq and ψq in the azimuthal angles of the quartz-crystal layer 4; and the phase of the Rayleigh wave do not vary greatly.

Examples of the relationship between an azimuthal angle of the quartz-crystal layer 4, the cut angle of the lithium tantalate of the piezoelectric layer 5, and the phase of the Rayleigh wave are given above. The relationship will be further detailed below.

Figure 15:
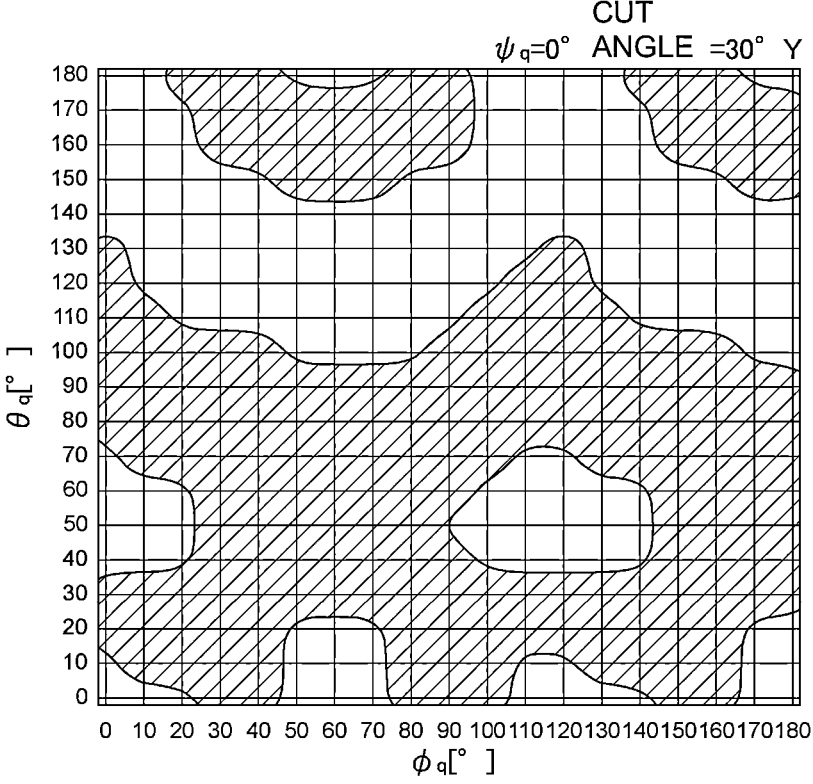
FIG. 15 illustrates the ranges of $\varphi_q$ and $\theta_q$ in the azimuthal angles of the quartz-crystal layer, in which the Rayleigh wave can be suppressed.

FIG. 15 illustrates the ranges of φq and θq in the azimuthal angles of the quartz-crystal layer, in which the Rayleigh wave can be suppressed. Note that the ranges in FIG. 15 are each a range when ψq in the azimuthal angles of the quartz-crystal layer 4 is about 0°, and the cut angle of the lithium tantalate of the piezoelectric layer 5 is about 30° Y.

When the cut angle of the lithium tantalate of the piezoelectric layer 5 is about 30° Y, the Rayleigh wave can be effectively suppressed in the ranges of (φq, θq, 0°) represented by the hatched areas in FIG. 15. The relationship is given in Table 1. Here, it has been clear that, when the cut angle is about 20° Y or more and less than about 40° Y, for example, the Rayleigh wave can also be suppressed in ranges of the azimuthal angles, similar to the ranges of the azimuthal angles in the case of about 30° Y in cut angle. Thus, in Table 1, the case where the cut angle is about 20° Y or more and less than about 40° Y is given, for example. Moreover, the Rayleigh wave can also be suppressed in a similar manner within the range of about ±5° or ±10° of each of φq, θq, and ψq, for example. Thus, the range of about ±5° or ±10° of each of φq, θq, and ψq is given in the tables in the present description, for example.

Similarly, the ranges of φq and θq in which the Rayleigh wave can be suppressed were obtained while the cut angle of the lithium tantalate of the piezoelectric layer 5 and ψq in the azimuthal angles of the quartz-crystal layer 4 were changed. The results therefrom are given in Tables 2 to 10.

The Rayleigh wave can be suppressed when the cut angle of the lithium tantalate of the piezoelectric layer 5 is about 20° Y or more and less than about 40° Y and if φq, θq, and ψq in the azimuthal angles of the quartz-crystal layer 4 are in any one of the combinations in Tables 1 to 10. Note that the quartz-crystal layer 4 is a monocrystalline quartz-crystal layer.

TABLE 1

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $15 \le \theta_q \le 35$ | $-10 \le \psi_q < 10$ |
| 2 | $-5 \le \varphi_q < 5$ | $75 \le \theta_q \le 135$ | $-10 \le \psi_q < 10$ |
| 3 | $5 \le \varphi_q < 15$ | $5 \le \theta_q \le 35$ | $-10 \le \psi_q < 10$ |
| 4 | $5 \le \varphi_q < 15$ | $65 \le \theta_q \le 115$ | $-10 \le \psi_q < 10$ |
| 5 | $15 \le \varphi_q < 25$ | $5 \le \theta_q \le 35$ | $-10 \le \psi_q < 10$ |
| 6 | $15 \le \varphi_q < 25$ | $65 \le \theta_q \le 105$ | $-10 \le \psi_q < 10$ |
| 7 | $15 \le \varphi_q < 25$ | $175 \le \theta_q \le 185$ | $-10 \le \psi_q < 10$ |
| 8 | $25 \le \varphi_q < 35$ | $-5 \le \theta_q \le 105$ | $-10 \le \psi_q < 10$ |
| 9 | $25 \le \varphi_q < 35$ | $155 \le \theta_q \le 185$ | $-10 \le \psi_q < 10$ |
| 10 | $35 \le \varphi_q < 45$ | $-5 \le \theta_q \le 105$ | $-10 \le \psi_q < 10$ |
| 11 | $35 \le \varphi_q < 45$ | $155 \le \theta_q \le 185$ | $-10 \le \psi_q < 10$ |
| 12 | $45 \le \varphi_q < 55$ | $25 \le \theta_q \le 95$ | $-10 \le \psi_q < 10$ |
| 13 | $45 \le \varphi_q < 55$ | $145 \le \theta_q \le 175$ | $-10 \le \psi_q < 10$ |
| 14 | $55 \le \varphi_q < 65$ | $25 \le \theta_q \le 95$ | $-10 \le \psi_q < 10$ |
| 15 | $55 \le \varphi_q < 65$ | $145 \le \theta_q \le 175$ | $-10 \le \psi_q < 10$ |
| 16 | $65 \le \varphi_q < 75$ | $25 \le \theta_q \le 95$ | $-10 \le \psi_q < 10$ |
| 17 | $65 \le \varphi_q < 75$ | $145 \le \theta_q \le 175$ | $-10 \le \psi_q < 10$ |
| 18 | $75 \le \varphi_q < 85$ | $-5 \le \theta_q \le 95$ | $-10 \le \psi_q < 10$ |
| 19 | $75 \le \varphi_q < 85$ | $155 \le \theta_q \le 185$ | $-10 \le \psi_q < 10$ |
| 20 | $85 \le \varphi_q < 95$ | $-5 \le \theta_q \le 45$ | $-10 \le \psi_q < 10$ |
| 21 | $85 \le \varphi_q < 95$ | $55 \le \theta_q \le 105$ | $-10 \le \psi_q < 10$ |
| 22 | $85 \le \varphi_q < 95$ | $155 \le \theta_q \le 185$ | $-10 \le \psi_q < 10$ |
| 23 | $95 \le \varphi_q < 105$ | $-5 \le \theta_q \le 35$ | $-10 \le \psi_q < 10$ |
| 24 | $95 \le \varphi_q < 105$ | $65 \le \theta_q \le 115$ | $-10 \le \psi_q < 10$ |
| 25 | $105 \le \varphi_q < 115$ | $15 \le \theta_q \le 35$ | $-10 \le \psi_q < 10$ |
| 26 | $105 \le \varphi_q < 115$ | $75 \le \theta_q \le 125$ | $-10 \le \psi_q < 10$ |
| 27 | $115 \le \varphi_q < 125$ | $15 \le \theta_q \le 35$ | $-10 \le \psi_q < 10$ |
| 28 | $115 \le \varphi_q < 125$ | $75 \le \theta_q \le 135$ | $-10 \le \psi_q < 10$ |
| 29 | $125 \le \varphi_q < 135$ | $5 \le \theta_q \le 35$ | $-10 \le \psi_q < 10$ |
| 30 | $125 \le \varphi_q < 135$ | $65 \le \theta_q \le 115$ | $-10 \le \psi_q < 10$ |
| 31 | $135 \le \varphi_q < 145$ | $5 \le \theta_q \le 35$ | $-10 \le \psi_q < 10$ |
| 32 | $135 \le \varphi_q < 145$ | $65 \le \theta_q \le 105$ | $-10 \le \psi_q < 10$ |
| 33 | $135 \le \varphi_q < 145$ | $175 \le \theta_q \le 185$ | $-10 \le \psi_q < 10$ |
| 34 | $145 \le \varphi_q < 155$ | $-5 \le \theta_q \le 105$ | $-10 \le \psi_q < 10$ |
| 35 | $145 \le \varphi_q < 155$ | $155 \le \theta_q \le 185$ | $-10 \le \psi_q < 10$ |
| 36 | $155 \le \varphi_q < 165$ | $-5 \le \theta_q \le 105$ | $-10 \le \psi_q < 10$ |
| 37 | $155 \le \varphi_q < 165$ | $155 \le \theta_q \le 185$ | $-10 \le \psi_q < 10$ |
| 38 | $165 \le \varphi_q < 175$ | $25 \le \theta_q \le 95$ | $-10 \le \psi_q < 10$ |
| 39 | $165 \le \varphi_q < 175$ | $145 \le \theta_q \le 175$ | $-10 \le \psi_q < 10$ |
| 40 | $175 \le \varphi_q \le 185$ | $25 \le \theta_q \le 95$ | $-10 \le \psi_q < 10$ |
| 41 | $175 \le \varphi_q \le 185$ | $145 \le \theta_q \le 175$ | $-10 \le \psi_q < 10$ |

TABLE 2

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $5 \le \theta_q \le 35$ | $10 \le \psi_q < 30$ |
| 2 | $-5 \le \varphi_q < 5$ | $65 \le \theta_q \le 145$ | $10 \le \psi_q < 30$ |
| 3 | $5 \le \varphi_q < 15$ | $-5 \le \theta_q \le 145$ | $10 \le \psi_q < 30$ |
| 4 | $15 \le \varphi_q < 25$ | $-5 \le \theta_q \le 135$ | $10 \le \psi_q < 30$ |
| 5 | $25 \le \varphi_q < 35$ | $25 \le \theta_q \le 135$ | $10 \le \psi_q < 30$ |
| 6 | $35 \le \varphi_q < 45$ | $25 \le \theta_q \le 125$ | $10 \le \psi_q < 30$ |
| 7 | $35 \le \varphi_q < 45$ | $175 \le \theta_q \le 185$ | $10 \le \psi_q < 30$ |
| 8 | $45 \le \varphi_q < 55$ | $25 \le \theta_q \le 105$ | $10 \le \psi_q < 30$ |
| 9 | $45 \le \varphi_q < 55$ | $165 \le \theta_q \le 185$ | $10 \le \psi_q < 30$ |
| 10 | $55 \le \varphi_q < 65$ | $-5 \le \theta_q \le 105$ | $10 \le \psi_q < 30$ |
| 11 | $55 \le \varphi_q < 65$ | $155 \le \theta_q \le 185$ | $10 \le \psi_q < 30$ |
| 12 | $65 \le \varphi_q < 75$ | $-5 \le \theta_q \le 105$ | $10 \le \psi_q < 30$ |
| 13 | $65 \le \varphi_q < 75$ | $145 \le \theta_q \le 175$ | $10 \le \psi_q < 30$ |
| 14 | $75 \le \varphi_q < 85$ | $-5 \le \theta_q \le 45$ | $10 \le \psi_q < 30$ |
| 15 | $75 \le \varphi_q < 85$ | $75 \le \theta_q \le 95$ | $10 \le \psi_q < 30$ |
| 16 | $75 \le \varphi_q < 85$ | $145 \le \theta_q \le 165$ | $10 \le \psi_q < 30$ |
| 17 | $85 \le \varphi_q < 95$ | $15 \le \theta_q \le 35$ | $10 \le \psi_q < 30$ |
| 18 | $85 \le \varphi_q < 95$ | $75 \le \theta_q \le 95$ | $10 \le \psi_q < 30$ |
| 19 | $85 \le \varphi_q < 95$ | $145 \le \theta_q \le 175$ | $10 \le \psi_q < 30$ |
| 20 | $95 \le \varphi_q < 105$ | $15 \le \theta_q \le 35$ | $10 \le \psi_q < 30$ |
| 21 | $95 \le \varphi_q < 105$ | $65 \le \theta_q \le 95$ | $10 \le \psi_q < 30$ |
| 22 | $95 \le \varphi_q < 105$ | $145 \le \theta_q \le 185$ | $10 \le \psi_q < 30$ |
| 23 | $105 \le \varphi_q < 115$ | $15 \le \theta_q \le 35$ | $10 \le \psi_q < 30$ |
| 24 | $105 \le \varphi_q < 115$ | $65 \le \theta_q \le 95$ | $10 \le \psi_q < 30$ |
| 25 | $105 \le \varphi_q < 115$ | $145 \le \theta_q \le 185$ | $10 \le \psi_q < 30$ |
| 26 | $115 \le \varphi_q < 125$ | $5 \le \theta_q \le 35$ | $10 \le \psi_q < 30$ |
| 27 | $115 \le \varphi_q < 125$ | $65 \le \theta_q \le 145$ | $10 \le \psi_q < 30$ |
| 28 | $125 \le \varphi_q < 135$ | $-5 \le \theta_q \le 145$ | $10 \le \psi_q < 30$ |
| 29 | $135 \le \varphi_q < 145$ | $-5 \le \theta_q \le 135$ | $10 \le \psi_q < 30$ |
| 30 | $145 \le \varphi_q < 155$ | $25 \le \theta_q \le 135$ | $10 \le \psi_q < 30$ |
| 31 | $155 \le \varphi_q < 165$ | $25 \le \theta_q \le 115$ | $10 \le \psi_q < 30$ |
| 32 | $155 \le \varphi_q < 165$ | $175 \le \theta_q \le 185$ | $10 \le \psi_q < 30$ |
| 33 | $165 \le \varphi_q < 175$ | $25 \le \theta_q \le 105$ | $10 \le \psi_q < 30$ |
| 34 | $165 \le \varphi_q < 175$ | $165 \le \theta_q \le 185$ | $10 \le \psi_q < 30$ |
| 35 | $175 \le \varphi_q \le 185$ | $-5 \le \theta_q \le 105$ | $10 \le \psi_q < 30$ |
| 36 | $175 \le \varphi_q \le 185$ | $155 \le \theta_q \le 185$ | $10 \le \psi_q < 30$ |

TABLE 3

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 85$ | $30 \le \psi_q < 50$ |
| 2 | $-5 \le \varphi_q < 5$ | $125 \le \theta_q \le 185$ | $30 \le \psi_q < 50$ |
| 3 | $5 \le \varphi_q < 15$ | $25 \le \theta_q \le 75$ | $30 \le \psi_q < 50$ |
| 4 | $5 \le \varphi_q < 15$ | $125 \le \theta_q \le 185$ | $30 \le \psi_q < 50$ |
| 5 | $15 \le \varphi_q < 25$ | $25 \le \theta_q \le 55$ | $30 \le \psi_q < 50$ |
| 6 | $15 \le \varphi_q < 25$ | $65 \le \theta_q \le 85$ | $30 \le \psi_q < 50$ |
| 7 | $15 \le \varphi_q < 25$ | $125 \le \theta_q \le 155$ | $30 \le \psi_q < 50$ |
| 8 | $25 \le \varphi_q < 35$ | $15 \le \theta_q \le 55$ | $30 \le \psi_q < 50$ |
| 9 | $25 \le \varphi_q < 35$ | $115 \le \theta_q \le 145$ | $30 \le \psi_q < 50$ |
| 10 | $35 \le \varphi_q < 45$ | $-5 \le \theta_q \le 45$ | $30 \le \psi_q < 50$ |
| 11 | $35 \le \varphi_q < 45$ | $75 \le \theta_q \le 145$ | $30 \le \psi_q < 50$ |
| 12 | $45 \le \varphi_q < 55$ | $-5 \le \theta_q \le 65$ | $30 \le \psi_q < 50$ |
| 13 | $45 \le \varphi_q < 55$ | $75 \le \theta_q \le 135$ | $30 \le \psi_q < 50$ |
| 14 | $55 \le \varphi_q < 65$ | $-5 \le \theta_q \le 65$ | $30 \le \psi_q < 50$ |
| 15 | $55 \le \varphi_q < 65$ | $85 \le \theta_q \le 135$ | $30 \le \psi_q < 50$ |
| 16 | $55 \le \varphi_q < 65$ | $175 \le \theta_q \le 185$ | $30 \le \psi_q < 50$ |
| 17 | $65 \le \varphi_q < 75$ | $15 \le \theta_q \le 45$ | $30 \le \psi_q < 50$ |
| 18 | $65 \le \varphi_q < 75$ | $75 \le \theta_q \le 115$ | $30 \le \psi_q < 50$ |
| 19 | $65 \le \varphi_q < 75$ | $155 \le \theta_q \le 185$ | $30 \le \psi_q < 50$ |
| 20 | $75 \le \varphi_q < 85$ | $15 \le \theta_q \le 45$ | $30 \le \psi_q < 50$ |
| 21 | $75 \le \varphi_q < 85$ | $75 \le \theta_q \le 105$ | $30 \le \psi_q < 50$ |
| 22 | $75 \le \varphi_q < 85$ | $145 \le \theta_q \le 185$ | $30 \le \psi_q < 50$ |
| 23 | $85 \le \varphi_q < 95$ | $15 \le \theta_q \le 45$ | $30 \le \psi_q < 50$ |
| 24 | $85 \le \varphi_q < 95$ | $55 \le \theta_q \le 95$ | $30 \le \psi_q < 50$ |
| 25 | $85 \le \varphi_q < 95$ | $145 \le \theta_q \le 165$ | $30 \le \psi_q < 50$ |
| 26 | $95 \le \varphi_q < 105$ | $5 \le \theta_q \le 95$ | $30 \le \psi_q < 50$ |
| 27 | $95 \le \varphi_q < 105$ | $145 \le \theta_q \le 165$ | $30 \le \psi_q < 50$ |
| 28 | $105 \le \varphi_q < 115$ | $-5 \le \theta_q \le 85$ | $30 \le \psi_q < 50$ |
| 29 | $105 \le \varphi_q < 115$ | $135 \le \theta_q \le 175$ | $30 \le \psi_q < 50$ |
| 30 | $115 \le \varphi_q < 125$ | $-5 \le \theta_q \le 85$ | $30 \le \psi_q < 50$ |
| 31 | $115 \le \varphi_q < 125$ | $125 \le \theta_q \le 185$ | $30 \le \psi_q < 50$ |
| 32 | $125 \le \varphi_q < 135$ | $25 \le \theta_q \le 75$ | $30 \le \psi_q < 50$ |

TABLE 3-continued

| CONDITION | $\varphi_q$ RANGE[°] | $\theta_q$ RANGE[°] | $\psi_q$ RANGE[°] |
|---|---|---|---|
| 33 | $125 \le \varphi_q < 135$ | $125 \le \theta_q \le 185$ | $30 \le \psi_q < 50$ |
| 34 | $135 \le \varphi_q < 145$ | $25 \le \theta_q \le 55$ | $30 \le \psi_q < 50$ |
| 35 | $135 \le \varphi_q < 145$ | $65 \le \theta_q \le 85$ | $30 \le \psi_q < 50$ |
| 36 | $135 \le \varphi_q < 145$ | $125 \le \theta_q \le 155$ | $30 \le \psi_q < 50$ |
| 37 | $145 \le \varphi_q < 155$ | $15 \le \theta_q \le 55$ | $30 \le \psi_q < 50$ |
| 38 | $145 \le \varphi_q < 155$ | $65 \le \theta_q \le 75$ | $30 \le \psi_q < 50$ |
| 39 | $145 \le \varphi_q < 155$ | $115 \le \theta_q \le 145$ | $30 \le \psi_q < 50$ |
| 40 | $155 \le \varphi_q < 165$ | $-5 \le \theta_q \le 45$ | $30 \le \psi_q < 50$ |
| 41 | $155 \le \varphi_q < 165$ | $75 \le \theta_q \le 145$ | $30 \le \psi_q < 50$ |
| 42 | $165 \le \varphi_q < 175$ | $-5 \le \theta_q \le 65$ | $30 \le \psi_q < 50$ |
| 43 | $165 \le \varphi_q < 175$ | $75 \le \theta_q \le 135$ | $30 \le \psi_q < 50$ |
| 44 | $175 \le \varphi_q \le 185$ | $-5 \le \theta_q \le 65$ | $30 \le \psi_q < 50$ |
| 45 | $175 \le \varphi_q \le 185$ | $85 \le \theta_q \le 135$ | $30 \le \psi_q < 50$ |
| 46 | $175 \le \varphi_q \le 185$ | $175 \le \theta_q \le 185$ | $30 \le \psi_q < 50$ |

TABLE 4

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $25 \le \theta_q \le 65$ | $50 \le \psi_q < 70$ |
| 2 | $-5 \le \varphi_q < 5$ | $125 \le \theta_q \le 165$ | $50 \le \psi_q < 70$ |
| 3 | $5 \le \varphi_q < 15$ | $15 \le \theta_q \le 65$ | $50 \le \psi_q < 70$ |
| 4 | $5 \le \varphi_q < 15$ | $105 \le \theta_q \le 165$ | $50 \le \psi_q < 70$ |
| 5 | $15 \le \varphi_q < 25$ | $-5 \le \theta_q \le 65$ | $50 \le \psi_q < 70$ |
| 6 | $15 \le \varphi_q < 25$ | $75 \le \theta_q \le 185$ | $50 \le \psi_q < 70$ |
| 7 | $25 \le \varphi_q < 35$ | $-5 \le \theta_q \le 185$ | $50 \le \psi_q < 70$ |
| 8 | $35 \le \varphi_q < 45$ | $-5 \le \theta_q \le 175$ | $50 \le \psi_q < 70$ |
| 9 | $45 \le \varphi_q < 55$ | $25 \le \theta_q \le 85$ | $50 \le \psi_q < 70$ |
| 10 | $45 \le \varphi_q < 55$ | $95 \le \theta_q \le 145$ | $50 \le \psi_q < 70$ |
| 11 | $55 \le \varphi_q < 65$ | $25 \le \theta_q \le 65$ | $50 \le \psi_q < 70$ |
| 12 | $55 \le \varphi_q < 65$ | $75 \le \theta_q \le 145$ | $50 \le \psi_q < 70$ |
| 13 | $65 \le \varphi_q < 75$ | $15 \le \theta_q \le 135$ | $50 \le \psi_q < 70$ |
| 14 | $75 \le \varphi_q < 85$ | $5 \le \theta_q \le 125$ | $50 \le \psi_q < 70$ |
| 15 | $75 \le \varphi_q < 85$ | $175 \le \theta_q \le 185$ | $50 \le \psi_q < 70$ |
| 16 | $85 \le \varphi_q < 95$ | $-5 \le \theta_q \le 105$ | $50 \le \psi_q < 70$ |
| 17 | $85 \le \varphi_q < 95$ | $145 \le \theta_q \le 185$ | $50 \le \psi_q < 70$ |
| 18 | $95 \le \varphi_q < 105$ | $-5 \le \theta_q \le 85$ | $50 \le \psi_q < 70$ |
| 19 | $95 \le \varphi_q < 105$ | $135 \le \theta_q \le 185$ | $50 \le \psi_q < 70$ |
| 20 | $105 \le \varphi_q < 115$ | $25 \le \theta_q \le 75$ | $50 \le \psi_q < 70$ |
| 21 | $105 \le \varphi_q < 115$ | $125 \le \theta_q \le 165$ | $50 \le \psi_q < 70$ |
| 22 | $115 \le \varphi_q < 125$ | $25 \le \theta_q \le 65$ | $50 \le \psi_q < 70$ |
| 23 | $115 \le \varphi_q < 125$ | $125 \le \theta_q \le 165$ | $50 \le \psi_q < 70$ |
| 24 | $125 \le \varphi_q < 135$ | $15 \le \theta_q \le 65$ | $50 \le \psi_q < 70$ |
| 25 | $125 \le \varphi_q < 135$ | $105 \le \theta_q \le 165$ | $50 \le \psi_q < 70$ |
| 26 | $135 \le \varphi_q < 145$ | $-5 \le \theta_q \le 65$ | $50 \le \psi_q < 70$ |
| 27 | $135 \le \varphi_q < 145$ | $75 \le \theta_q \le 185$ | $50 \le \psi_q < 70$ |
| 28 | $145 \le \varphi_q < 155$ | $-5 \le \theta_q \le 185$ | $50 \le \psi_q < 70$ |
| 29 | $155 \le \varphi_q < 165$ | $-5 \le \theta_q \le 175$ | $50 \le \psi_q < 70$ |
| 30 | $165 \le \varphi_q < 175$ | $25 \le \theta_q \le 85$ | $50 \le \psi_q < 70$ |
| 31 | $165 \le \varphi_q < 175$ | $95 \le \theta_q \le 145$ | $50 \le \psi_q < 70$ |
| 32 | $175 \le \varphi_q \le 185$ | $25 \le \theta_q \le 145$ | $50 \le \psi_q < 70$ |

TABLE 5

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 95$ | $70 \le \psi_q < 90$ |
| 2 | $-5 \le \varphi_q < 5$ | $105 \le \theta_q \le 185$ | $70 \le \psi_q < 90$ |
| 3 | $5 \le \varphi_q < 15$ | $-5 \le \theta_q \le 165$ | $70 \le \psi_q < 90$ |
| 4 | $15 \le \varphi_q < 25$ | $-5 \le \theta_q \le 155$ | $70 \le \psi_q < 90$ |
| 5 | $25 \le \varphi_q < 35$ | $35 \le \theta_q \le 165$ | $70 \le \psi_q < 90$ |
| 6 | $35 \le \varphi_q < 45$ | $35 \le \theta_q \le 185$ | $70 \le \psi_q < 90$ |
| 7 | $45 \le \varphi_q < 55$ | $25 \le \theta_q \le 185$ | $70 \le \psi_q < 90$ |
| 8 | $55 \le \varphi_q < 65$ | $5 \le \theta_q \le 175$ | $70 \le \psi_q < 90$ |
| 9 | $65 \le \varphi_q < 75$ | $-5 \le \theta_q \le 145$ | $70 \le \psi_q < 90$ |
| 10 | $75 \le \varphi_q < 85$ | $-5 \le \theta_q \le 135$ | $70 \le \psi_q < 90$ |
| 11 | $85 \le \varphi_q < 95$ | $25 \le \theta_q \le 135$ | $70 \le \psi_q < 90$ |
| 12 | $95 \le \varphi_q < 105$ | $25 \le \theta_q \le 155$ | $70 \le \psi_q < 90$ |
| 13 | $95 \le \varphi_q < 105$ | $175 \le \theta_q \le 185$ | $70 \le \psi_q < 90$ |
| 14 | $105 \le \varphi_q < 115$ | $15 \le \theta_q \le 95$ | $70 \le \psi_q < 90$ |

TABLE 5-continued

| CONDITION | $\varphi_q$ RANGE[°] | $\theta_q$ RANGE[°] | $\psi_q$ RANGE[°] |
|---|---|---|---|
| 15 | $105 \le \varphi_q < 115$ | $105 \le \theta_q \le 185$ | $70 \le \psi_q < 90$ |
| 16 | $115 \le \varphi_q < 125$ | $-5 \le \theta_q \le 95$ | $70 \le \psi_q < 90$ |
| 17 | $115 \le \varphi_q < 125$ | $105 \le \theta_q \le 185$ | $70 \le \psi_q < 90$ |
| 18 | $125 \le \varphi_q < 135$ | $-5 \le \theta_q \le 165$ | $70 \le \psi_q < 90$ |
| 19 | $135 \le \varphi_q < 145$ | $-5 \le \theta_q \le 155$ | $70 \le \psi_q < 90$ |
| 20 | $145 \le \varphi_q < 155$ | $35 \le \theta_q \le 165$ | $70 \le \psi_q < 90$ |
| 21 | $155 \le \varphi_q < 165$ | $35 \le \theta_q \le 185$ | $70 \le \psi_q < 90$ |
| 22 | $165 \le \varphi_q < 175$ | $25 \le \theta_q \le 185$ | $70 \le \psi_q < 90$ |
| 23 | $175 \le \varphi_q \le 185$ | $5 \le \theta_q \le 175$ | $70 \le \psi_q < 90$ |

TABLE 6

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 5$ | $90 \le \psi_q < 110$ |
| 2 | $-5 \le \varphi_q < 5$ | $15 \le \theta_q \le 185$ | $90 \le \psi_q < 110$ |
| 3 | $5 \le \varphi_q < 15$ | $25 \le \theta_q \le 185$ | $90 \le \psi_q < 110$ |
| 4 | $15 \le \varphi_q < 25$ | $35 \le \theta_q \le 185$ | $90 \le \psi_q < 110$ |
| 5 | $25 \le \varphi_q < 35$ | $45 \le \theta_q \le 155$ | $90 \le \psi_q < 110$ |
| 6 | $35 \le \varphi_q < 45$ | $5 \le \theta_q \le 15$ | $90 \le \psi_q < 110$ |
| 7 | $35 \le \varphi_q < 45$ | $25 \le \theta_q \le 155$ | $90 \le \psi_q < 110$ |
| 8 | $45 \le \varphi_q < 55$ | $-5 \le \theta_q \le 165$ | $90 \le \psi_q < 110$ |
| 9 | $55 \le \varphi_q < 65$ | $-5 \le \theta_q \le 75$ | $90 \le \psi_q < 110$ |
| 10 | $55 \le \varphi_q < 65$ | $95 \le \theta_q \le 185$ | $90 \le \psi_q < 110$ |
| 11 | $65 \le \varphi_q < 75$ | $15 \le \theta_q \le 185$ | $90 \le \psi_q < 110$ |
| 12 | $75 \le \varphi_q < 85$ | $25 \le \theta_q \le 175$ | $90 \le \psi_q < 110$ |
| 13 | $85 \le \varphi_q < 95$ | $15 \le \theta_q \le 155$ | $90 \le \psi_q < 110$ |
| 14 | $95 \le \varphi_q < 105$ | $-5 \le \theta_q \le 145$ | $90 \le \psi_q < 110$ |
| 15 | $105 \le \varphi_q < 115$ | $-5 \le \theta_q \le 155$ | $90 \le \psi_q < 110$ |
| 16 | $115 \le \varphi_q < 125$ | $-5 \le \theta_q \le 5$ | $90 \le \psi_q < 110$ |
| 17 | $115 \le \varphi_q < 125$ | $15 \le \theta_q \le 185$ | $90 \le \psi_q < 110$ |
| 18 | $125 \le \varphi_q < 135$ | $25 \le \theta_q \le 185$ | $90 \le \psi_q < 110$ |
| 19 | $135 \le \varphi_q < 145$ | $35 \le \theta_q \le 185$ | $90 \le \psi_q < 110$ |
| 20 | $145 \le \varphi_q < 155$ | $45 \le \theta_q \le 155$ | $90 \le \psi_q < 110$ |
| 21 | $155 \le \varphi_q < 165$ | $5 \le \theta_q \le 15$ | $90 \le \psi_q < 110$ |
| 22 | $155 \le \varphi_q < 165$ | $25 \le \theta_q \le 155$ | $90 \le \psi_q < 110$ |
| 23 | $165 \le \varphi_q < 175$ | $-5 \le \theta_q \le 165$ | $90 \le \psi_q < 110$ |
| 24 | $175 \le \varphi_q \le 185$ | $-5 \le \theta_q \le 75$ | $90 \le \psi_q < 110$ |
| 25 | $175 \le \varphi_q \le 185$ | $95 \le \theta_q \le 185$ | $90 \le \psi_q < 110$ |

TABLE 7

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $35 \le \theta_q \le 95$ | $110 \le \psi_q < 130$ |
| 2 | $-5 \le \varphi_q < 5$ | $105 \le \theta_q \le 155$ | $110 \le \psi_q < 130$ |
| 3 | $5 \le \varphi_q < 15$ | $45 \le \theta_q \le 165$ | $110 \le \psi_q < 130$ |
| 4 | $15 \le \varphi_q < 25$ | $45 \le \theta_q \le 185$ | $110 \le \psi_q < 130$ |
| 5 | $25 \le \varphi_q < 35$ | $-5 \le \theta_q \le 35$ | $110 \le \psi_q < 130$ |
| 6 | $25 \le \varphi_q < 35$ | $65 \le \theta_q \le 185$ | $110 \le \psi_q < 130$ |
| 7 | $35 \le \varphi_q < 45$ | $-5 \le \theta_q \le 45$ | $110 \le \psi_q < 130$ |
| 8 | $35 \le \varphi_q < 45$ | $85 \le \theta_q \le 185$ | $110 \le \psi_q < 130$ |
| 9 | $45 \le \varphi_q < 55$ | $15 \le \theta_q \le 45$ | $110 \le \psi_q < 130$ |
| 10 | $45 \le \varphi_q < 55$ | $105 \le \theta_q \le 155$ | $110 \le \psi_q < 130$ |
| 11 | $55 \le \varphi_q < 65$ | $15 \le \theta_q \le 55$ | $110 \le \psi_q < 130$ |
| 12 | $55 \le \varphi_q < 65$ | $115 \le \theta_q \le 155$ | $110 \le \psi_q < 130$ |
| 13 | $65 \le \varphi_q < 75$ | $5 \le \theta_q \le 65$ | $110 \le \psi_q < 130$ |
| 14 | $65 \le \varphi_q < 75$ | $125 \le \theta_q \le 165$ | $110 \le \psi_q < 130$ |
| 15 | $75 \le \varphi_q < 85$ | $-5 \le \theta_q \le 75$ | $110 \le \psi_q < 130$ |
| 16 | $75 \le \varphi_q < 85$ | $125 \le \theta_q \le 185$ | $110 \le \psi_q < 130$ |
| 17 | $85 \le \varphi_q < 95$ | $-5 \le \theta_q \le 185$ | $110 \le \psi_q < 130$ |
| 18 | $95 \le \varphi_q < 105$ | $-5 \le \theta_q \le 5$ | $110 \le \psi_q < 130$ |
| 19 | $95 \le \varphi_q < 105$ | $15 \le \theta_q \le 85$ | $110 \le \psi_q < 130$ |
| 20 | $95 \le \varphi_q < 105$ | $95 \le \theta_q \le 175$ | $110 \le \psi_q < 130$ |
| 21 | $105 \le \varphi_q < 115$ | $25 \le \theta_q \le 155$ | $110 \le \psi_q < 130$ |
| 22 | $115 \le \varphi_q < 125$ | $35 \le \theta_q \le 95$ | $110 \le \psi_q < 130$ |
| 23 | $115 \le \varphi_q < 125$ | $105 \le \theta_q \le 155$ | $110 \le \psi_q < 130$ |
| 24 | $125 \le \varphi_q < 135$ | $45 \le \theta_q \le 165$ | $110 \le \psi_q < 130$ |
| 25 | $135 \le \varphi_q < 145$ | $45 \le \theta_q \le 185$ | $110 \le \psi_q < 130$ |
| 26 | $145 \le \varphi_q < 155$ | $-5 \le \theta_q \le 35$ | $110 \le \psi_q < 130$ |

TABLE 7-continued

| CONDITION | $\varphi_q$ RANGE[°] | $\theta_q$ RANGE[°] | $\psi_q$ RANGE[°] |
|---|---|---|---|
| 27 | $145 \le \varphi_q < 155$ | $65 \le \theta_q \le 185$ | $110 \le \psi_q < 130$ |
| 28 | $155 \le \varphi_q < 165$ | $-5 \le \theta_q \le 45$ | $110 \le \psi_q < 130$ |
| 29 | $155 \le \varphi_q < 165$ | $85 \le \theta_q \le 185$ | $110 \le \psi_q < 130$ |
| 30 | $165 \le \varphi_q < 175$ | $15 \le \theta_q \le 45$ | $110 \le \psi_q < 130$ |
| 31 | $165 \le \varphi_q < 175$ | $105 \le \theta_q \le 155$ | $110 \le \psi_q < 130$ |
| 32 | $175 \le \varphi_q \le 185$ | $15 \le \theta_q \le 55$ | $110 \le \psi_q < 130$ |
| 33 | $175 \le \varphi_q \le 185$ | $115 \le \theta_q \le 155$ | $110 \le \psi_q < 130$ |

TABLE 8

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $45 \le \theta_q \le 105$ | $130 \le \psi_q < 150$ |
| 2 | $-5 \le \varphi_q < 5$ | $115 \le \theta_q \le 175$ | $130 \le \psi_q < 150$ |
| 3 | $5 \le \varphi_q < 15$ | $-5 \le \theta_q \le 25$ | $130 \le \psi_q < 150$ |
| 4 | $5 \le \varphi_q < 15$ | $65 \le \theta_q \le 105$ | $130 \le \psi_q < 150$ |
| 5 | $5 \le \varphi_q < 15$ | $125 \le \theta_q \le 165$ | $130 \le \psi_q < 150$ |
| 6 | $15 \le \varphi_q < 25$ | $-5 \le \theta_q \le 35$ | $130 \le \psi_q < 150$ |
| 7 | $15 \le \varphi_q < 25$ | $65 \le \theta_q \le 105$ | $130 \le \psi_q < 150$ |
| 8 | $15 \le \varphi_q < 25$ | $135 \le \theta_q \le 165$ | $130 \le \psi_q < 150$ |
| 9 | $25 \le \varphi_q < 35$ | $5 \le \theta_q \le 35$ | $130 \le \psi_q < 150$ |
| 10 | $25 \le \varphi_q < 35$ | $75 \le \theta_q \le 115$ | $130 \le \psi_q < 150$ |
| 11 | $25 \le \varphi_q < 35$ | $135 \le \theta_q \le 165$ | $130 \le \psi_q < 150$ |
| 12 | $35 \le \varphi_q < 45$ | $15 \le \theta_q \le 35$ | $130 \le \psi_q < 150$ |
| 13 | $35 \le \varphi_q < 45$ | $85 \le \theta_q \le 125$ | $130 \le \psi_q < 150$ |
| 14 | $35 \le \varphi_q < 45$ | $145 \le \theta_q \le 185$ | $130 \le \psi_q < 150$ |
| 15 | $45 \le \varphi_q < 55$ | $5 \le \theta_q \le 45$ | $130 \le \psi_q < 150$ |
| 16 | $45 \le \varphi_q < 55$ | $95 \le \theta_q \le 185$ | $130 \le \psi_q < 150$ |
| 17 | $55 \le \varphi_q < 65$ | $-5 \le \theta_q \le 45$ | $130 \le \psi_q < 150$ |
| 18 | $55 \le \varphi_q < 65$ | $95 \le \theta_q \le 145$ | $130 \le \psi_q < 150$ |
| 19 | $55 \le \varphi_q < 65$ | $165 \le \theta_q \le 185$ | $130 \le \psi_q < 150$ |
| 20 | $65 \le \varphi_q < 75$ | $-5 \le \theta_q \le 55$ | $130 \le \psi_q < 150$ |
| 21 | $65 \le \varphi_q < 75$ | $105 \le \theta_q \le 155$ | $130 \le \psi_q < 150$ |
| 22 | $75 \le \varphi_q < 85$ | $-5 \le \theta_q \le 5$ | $130 \le \psi_q < 150$ |
| 23 | $75 \le \varphi_q < 85$ | $15 \le \theta_q \le 55$ | $130 \le \psi_q < 150$ |
| 24 | $75 \le \varphi_q < 85$ | $65 \le \theta_q \le 85$ | $130 \le \psi_q < 150$ |
| 25 | $75 \le \varphi_q < 85$ | $95 \le \theta_q \le 105$ | $130 \le \psi_q < 150$ |
| 26 | $75 \le \varphi_q < 85$ | $115 \le \theta_q \le 155$ | $130 \le \psi_q < 150$ |
| 27 | $85 \le \varphi_q < 95$ | $35 \le \theta_q \le 65$ | $130 \le \psi_q < 150$ |
| 28 | $85 \le \varphi_q < 95$ | $85 \le \theta_q \le 95$ | $130 \le \psi_q < 150$ |
| 29 | $85 \le \varphi_q < 95$ | $115 \le \theta_q \le 125$ | $130 \le \psi_q < 150$ |
| 30 | $85 \le \varphi_q < 95$ | $135 \le \theta_q \le 165$ | $130 \le \psi_q < 150$ |
| 31 | $95 \le \varphi_q < 105$ | $35 \le \theta_q \le 95$ | $130 \le \psi_q < 150$ |
| 32 | $95 \le \varphi_q < 105$ | $115 \le \theta_q \le 185$ | $130 \le \psi_q < 150$ |
| 33 | $105 \le \varphi_q < 115$ | $45 \le \theta_q \le 95$ | $130 \le \psi_q < 150$ |
| 34 | $105 \le \varphi_q < 115$ | $135 \le \theta_q \le 185$ | $130 \le \psi_q < 150$ |
| 35 | $115 \le \varphi_q < 125$ | $45 \le \theta_q \le 105$ | $130 \le \psi_q < 150$ |
| 36 | $115 \le \varphi_q < 125$ | $115 \le \theta_q \le 175$ | $130 \le \psi_q < 150$ |
| 37 | $125 \le \varphi_q < 135$ | $-5 \le \theta_q \le 25$ | $130 \le \psi_q < 150$ |
| 38 | $125 \le \varphi_q < 135$ | $65 \le \theta_q \le 105$ | $130 \le \psi_q < 150$ |
| 39 | $125 \le \varphi_q < 135$ | $125 \le \theta_q \le 165$ | $130 \le \psi_q < 150$ |
| 40 | $135 \le \varphi_q < 145$ | $-5 \le \theta_q \le 35$ | $130 \le \psi_q < 150$ |
| 41 | $135 \le \varphi_q < 145$ | $65 \le \theta_q \le 105$ | $130 \le \psi_q < 150$ |
| 42 | $135 \le \varphi_q < 145$ | $135 \le \theta_q \le 165$ | $130 \le \psi_q < 150$ |
| 43 | $145 \le \varphi_q < 155$ | $5 \le \theta_q \le 35$ | $130 \le \psi_q < 150$ |
| 44 | $145 \le \varphi_q < 155$ | $75 \le \theta_q \le 115$ | $130 \le \psi_q < 150$ |
| 45 | $145 \le \varphi_q < 155$ | $135 \le \theta_q \le 165$ | $130 \le \psi_q < 150$ |
| 46 | $155 \le \varphi_q < 165$ | $15 \le \theta_q \le 35$ | $130 \le \psi_q < 150$ |
| 47 | $155 \le \varphi_q < 165$ | $85 \le \theta_q \le 125$ | $130 \le \psi_q < 150$ |
| 48 | $155 \le \varphi_q < 165$ | $145 \le \theta_q \le 185$ | $130 \le \psi_q < 150$ |
| 49 | $165 \le \varphi_q < 175$ | $5 \le \theta_q \le 45$ | $130 \le \psi_q < 150$ |
| 50 | $165 \le \varphi_q < 175$ | $95 \le \theta_q \le 185$ | $130 \le \psi_q < 150$ |
| 51 | $175 \le \varphi_q \le 185$ | $-5 \le \theta_q \le 45$ | $130 \le \psi_q < 150$ |
| 52 | $175 \le \varphi_q \le 185$ | $95 \le \theta_q \le 145$ | $130 \le \psi_q < 150$ |
| 53 | $175 \le \varphi_q \le 185$ | $165 \le \theta_q \le 185$ | $130 \le \psi_q < 150$ |

TABLE 9

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 35$ | $150 \le \psi_q < 170$ |
| 2 | $-5 \le \varphi_q < 5$ | $75 \le \theta_q \le 185$ | $150 \le \psi_q < 170$ |
| 3 | $5 \le \varphi_q < 15$ | $5 \le \theta_q \le 35$ | $150 \le \psi_q < 170$ |
| 4 | $5 \le \varphi_q < 15$ | $75 \le \theta_q \le 185$ | $150 \le \psi_q < 170$ |
| 5 | $15 \le \varphi_q < 25$ | $5 \le \theta_q \le 35$ | $150 \le \psi_q < 170$ |
| 6 | $15 \le \varphi_q < 25$ | $75 \le \theta_q \le 105$ | $150 \le \psi_q < 170$ |
| 7 | $15 \le \varphi_q < 25$ | $135 \le \theta_q \le 175$ | $150 \le \psi_q < 170$ |
| 8 | $25 \le \varphi_q < 35$ | $5 \le \theta_q \le 35$ | $150 \le \psi_q < 170$ |
| 9 | $25 \le \varphi_q < 35$ | $75 \le \theta_q \le 105$ | $150 \le \psi_q < 170$ |
| 10 | $25 \le \varphi_q < 35$ | $145 \le \theta_q \le 165$ | $150 \le \psi_q < 170$ |
| 11 | $35 \le \varphi_q < 45$ | $-5 \le \theta_q \le 35$ | $150 \le \psi_q < 170$ |
| 12 | $35 \le \varphi_q < 45$ | $85 \le \theta_q \le 115$ | $150 \le \psi_q < 170$ |
| 13 | $35 \le \varphi_q < 45$ | $145 \le \theta_q \le 165$ | $150 \le \psi_q < 170$ |
| 14 | $45 \le \varphi_q < 55$ | $-5 \le \theta_q \le 35$ | $150 \le \psi_q < 170$ |
| 15 | $45 \le \varphi_q < 55$ | $85 \le \theta_q \le 115$ | $150 \le \psi_q < 170$ |
| 16 | $45 \le \varphi_q < 55$ | $145 \le \theta_q \le 165$ | $150 \le \psi_q < 170$ |
| 17 | $55 \le \varphi_q < 65$ | $-5 \le \theta_q \le 5$ | $150 \le \psi_q < 170$ |
| 18 | $55 \le \varphi_q < 65$ | $65 \le \theta_q \le 115$ | $150 \le \psi_q < 170$ |
| 19 | $55 \le \varphi_q < 65$ | $145 \le \theta_q \le 185$ | $150 \le \psi_q < 170$ |
| 20 | $65 \le \varphi_q < 75$ | $45 \le \theta_q \le 125$ | $150 \le \psi_q < 170$ |
| 21 | $65 \le \varphi_q < 75$ | $155 \le \theta_q \le 185$ | $150 \le \psi_q < 170$ |
| 22 | $75 \le \varphi_q < 85$ | $45 \le \theta_q \le 145$ | $150 \le \psi_q < 170$ |
| 23 | $75 \le \varphi_q < 85$ | $155 \le \theta_q \le 185$ | $150 \le \psi_q < 170$ |
| 24 | $85 \le \varphi_q < 95$ | $45 \le \theta_q \le 155$ | $150 \le \psi_q < 170$ |
| 25 | $95 \le \varphi_q < 105$ | $65 \le \theta_q \le 155$ | $150 \le \psi_q < 170$ |
| 26 | $105 \le \varphi_q < 115$ | $-5 \le \theta_q \le 15$ | $150 \le \psi_q < 170$ |
| 27 | $105 \le \varphi_q < 115$ | $75 \le \theta_q \le 165$ | $150 \le \psi_q < 170$ |
| 28 | $115 \le \varphi_q < 125$ | $-5 \le \theta_q \le 35$ | $150 \le \psi_q < 170$ |
| 29 | $115 \le \varphi_q < 125$ | $75 \le \theta_q \le 185$ | $150 \le \psi_q < 170$ |
| 30 | $125 \le \varphi_q < 135$ | $5 \le \theta_q \le 35$ | $150 \le \psi_q < 170$ |
| 31 | $125 \le \varphi_q < 135$ | $75 \le \theta_q \le 185$ | $150 \le \psi_q < 170$ |
| 32 | $135 \le \varphi_q < 145$ | $5 \le \theta_q \le 35$ | $150 \le \psi_q < 170$ |
| 33 | $135 \le \varphi_q < 145$ | $75 \le \theta_q \le 105$ | $150 \le \psi_q < 170$ |
| 34 | $135 \le \varphi_q < 145$ | $135 \le \theta_q \le 175$ | $150 \le \psi_q < 170$ |
| 35 | $145 \le \varphi_q < 155$ | $5 \le \theta_q \le 35$ | $150 \le \psi_q < 170$ |
| 36 | $145 \le \varphi_q < 155$ | $75 \le \theta_q \le 105$ | $150 \le \psi_q < 170$ |
| 37 | $145 \le \varphi_q < 155$ | $145 \le \theta_q \le 165$ | $150 \le \psi_q < 170$ |
| 38 | $155 \le \varphi_q < 165$ | $-5 \le \theta_q \le 35$ | $150 \le \psi_q < 170$ |
| 39 | $155 \le \varphi_q < 165$ | $85 \le \theta_q \le 115$ | $150 \le \psi_q < 170$ |
| 40 | $155 \le \varphi_q < 165$ | $145 \le \theta_q \le 165$ | $150 \le \psi_q < 170$ |
| 41 | $165 \le \varphi_q < 175$ | $-5 \le \theta_q \le 35$ | $150 \le \psi_q < 170$ |
| 42 | $165 \le \varphi_q < 175$ | $85 \le \theta_q \le 115$ | $150 \le \psi_q < 170$ |
| 43 | $165 \le \varphi_q < 175$ | $145 \le \theta_q \le 165$ | $150 \le \psi_q < 170$ |
| 44 | $175 \le \varphi_q \le 185$ | $-5 \le \theta_q \le 5$ | $150 \le \psi_q < 170$ |
| 45 | $175 \le \varphi_q \le 185$ | $55 \le \theta_q \le 115$ | $150 \le \psi_q < 170$ |
| 46 | $175 \le \varphi_q \le 185$ | $145 \le \theta_q \le 185$ | $150 \le \psi_q < 170$ |

TABLE 10

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $5 \le \theta_q \le 35$ | $170 \le \psi_q \le 190$ |
| 2 | $-5 \le \varphi_q < 5$ | $85 \le \theta_q \le 155$ | $170 \le \psi_q \le 190$ |
| 3 | $5 \le \varphi_q < 15$ | $5 \le \theta_q \le 35$ | $170 \le \psi_q \le 190$ |
| 4 | $5 \le \varphi_q < 15$ | $85 \le \theta_q \le 155$ | $170 \le \psi_q \le 190$ |
| 5 | $15 \le \varphi_q < 25$ | $-5 \le \theta_q \le 25$ | $170 \le \psi_q \le 190$ |
| 6 | $15 \le \varphi_q < 25$ | $75 \le \theta_q \le 185$ | $170 \le \psi_q \le 190$ |
| 7 | $25 \le \varphi_q < 35$ | $-5 \le \theta_q \le 25$ | $170 \le \psi_q \le 190$ |
| 8 | $25 \le \varphi_q < 35$ | $75 \le \theta_q \le 185$ | $170 \le \psi_q \le 190$ |
| 9 | $35 \le \varphi_q < 45$ | $-5 \le \theta_q \le 5$ | $170 \le \psi_q \le 190$ |
| 10 | $35 \le \varphi_q < 45$ | $75 \le \theta_q \le 115$ | $170 \le \psi_q \le 190$ |
| 11 | $35 \le \varphi_q < 45$ | $145 \le \theta_q \le 175$ | $170 \le \psi_q \le 190$ |
| 12 | $45 \le \varphi_q < 55$ | $65 \le \theta_q \le 115$ | $170 \le \psi_q \le 190$ |
| 13 | $45 \le \varphi_q < 55$ | $145 \le \theta_q \le 175$ | $170 \le \psi_q \le 190$ |
| 14 | $55 \le \varphi_q < 65$ | $45 \le \theta_q \le 105$ | $170 \le \psi_q \le 190$ |
| 15 | $55 \le \varphi_q < 65$ | $145 \le \theta_q \le 165$ | $170 \le \psi_q \le 190$ |
| 16 | $65 \le \varphi_q < 75$ | $55 \le \theta_q \le 105$ | $170 \le \psi_q \le 190$ |
| 17 | $65 \le \varphi_q < 75$ | $145 \le \theta_q \le 165$ | $170 \le \psi_q \le 190$ |
| 18 | $75 \le \varphi_q < 85$ | $65 \le \theta_q \le 115$ | $170 \le \psi_q \le 190$ |
| 19 | $75 \le \varphi_q < 85$ | $145 \le \theta_q \le 185$ | $170 \le \psi_q \le 190$ |

TABLE 10-continued

| CONDITION | $\varphi_q$ RANGE[°] | $\theta_q$ RANGE[°] | $\psi_q$ RANGE[°] |
|---|---|---|---|
| 20 | $85 \le \varphi_q < 95$ | $-5 \le \theta_q \le 25$ | $170 \le \psi_q \le 190$ |
| 21 | $85 \le \varphi_q < 95$ | $75 \le \theta_q \le 125$ | $170 \le \psi_q \le 190$ |
| 22 | $85 \le \varphi_q < 95$ | $135 \le \theta_q \le 185$ | $170 \le \psi_q \le 190$ |
| 23 | $105 \le \varphi_q \le 115$ | $5 \le \theta_q \le 35$ | $170 \le \psi_q \le 190$ |

On the other hand, it has been clear that the Rayleigh wave can be suppressed when the cut angle of the lithium tantalate of the piezoelectric layer 5 is about 40° Y or more and about 90° Y or less, in similar ranges of the azimuthal angles of the quartz-crystal layer 4, for example. Thus, in Tables 11 to 20, there are given the ranges of the azimuthal angles in which the Rayleigh wave can be suppressed when the cut angle is about 40° Y or more and about 90° Y or less, for example.

The Rayleigh wave can be suppressed when the cut angle of the lithium tantalate of the piezoelectric layer 5 is about 40° Y or more and about 90° Y or less and if $\varphi_q$, $\theta_q$, and $\psi_q$ in the azimuthal angles of the quartz-crystal layer 4 are in any one of the combinations in Tables 11 to 20, for example. Note that the quartz-crystal layer 4 is a monocrystalline quartz-crystal layer.

TABLE 11

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 25$ | $-10 \le \psi_q < 10$ |
| 2 | $-5 \le \varphi_q < 5$ | $105 \le \theta_q \le 185$ | $-10 \le \psi_q < 10$ |
| 3 | $5 \le \varphi_q < 15$ | $-5 \le \theta_q \le 25$ | $-10 \le \psi_q < 10$ |
| 4 | $5 \le \varphi_q < 15$ | $105 \le \theta_q \le 185$ | $-10 \le \psi_q < 10$ |
| 5 | $15 \le \varphi_q < 25$ | $-5 \le \theta_q \le 15$ | $-10 \le \psi_q < 10$ |
| 6 | $15 \le \varphi_q < 25$ | $95 \le \theta_q \le 185$ | $-10 \le \psi_q < 10$ |
| 7 | $25 \le \varphi_q < 35$ | $95 \le \theta_q \le 175$ | $-10 \le \psi_q < 10$ |
| 8 | $35 \le \varphi_q < 45$ | $95 \le \theta_q \le 165$ | $-10 \le \psi_q < 10$ |
| 9 | $45 \le \varphi_q < 55$ | $95 \le \theta_q \le 155$ | $-10 \le \psi_q < 10$ |
| 10 | $55 \le \varphi_q < 65$ | $95 \le \theta_q \le 155$ | $-10 \le \psi_q < 10$ |
| 11 | $65 \le \varphi_q < 75$ | $95 \le \theta_q \le 155$ | $-10 \le \psi_q < 10$ |
| 12 | $75 \le \varphi_q < 85$ | $95 \le \theta_q \le 165$ | $-10 \le \psi_q < 10$ |
| 13 | $85 \le \varphi_q < 95$ | $95 \le \theta_q \le 175$ | $-10 \le \psi_q < 10$ |
| 14 | $95 \le \varphi_q < 105$ | $-5 \le \theta_q \le 15$ | $-10 \le \psi_q < 10$ |
| 15 | $95 \le \varphi_q < 105$ | $95 \le \theta_q \le 185$ | $-10 \le \psi_q < 10$ |
| 16 | $105 \le \varphi_q < 115$ | $-5 \le \theta_q \le 25$ | $-10 \le \psi_q < 10$ |
| 17 | $105 \le \varphi_q < 115$ | $95 \le \theta_q \le 185$ | $-10 \le \psi_q < 10$ |
| 18 | $115 \le \varphi_q < 125$ | $-5 \le \theta_q \le 25$ | $-10 \le \psi_q < 10$ |
| 19 | $115 \le \varphi_q < 125$ | $105 \le \theta_q \le 185$ | $-10 \le \psi_q < 10$ |
| 20 | $125 \le \varphi_q < 135$ | $-5 \le \theta_q \le 25$ | $-10 \le \psi_q < 10$ |
| 21 | $125 \le \varphi_q < 135$ | $105 \le \theta_q \le 185$ | $-10 \le \psi_q < 10$ |
| 22 | $135 \le \varphi_q < 145$ | $-5 \le \theta_q \le 15$ | $-10 \le \psi_q < 10$ |
| 23 | $135 \le \varphi_q < 145$ | $95 \le \theta_q \le 185$ | $-10 \le \psi_q < 10$ |
| 24 | $145 \le \varphi_q < 155$ | $95 \le \theta_q \le 175$ | $-10 \le \psi_q < 10$ |
| 25 | $155 \le \varphi_q < 165$ | $95 \le \theta_q \le 165$ | $-10 \le \psi_q < 10$ |
| 26 | $165 \le \varphi_q < 175$ | $95 \le \theta_q \le 155$ | $-10 \le \psi_q < 10$ |
| 27 | $175 \le \varphi_q < 185$ | $95 \le \theta_q \le 155$ | $-10 \le \psi_q < 10$ |

TABLE 12

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 15$ | $10 \le \psi_q < 30$ |
| 2 | $-5 \le \varphi_q < 5$ | $95 \le \theta_q \le 185$ | $10 \le \psi_q < 30$ |
| 3 | $5 \le \varphi_q < 15$ | $115 \le \theta_q \le 185$ | $10 \le \psi_q < 30$ |
| 4 | $15 \le \varphi_q < 25$ | $105 \le \theta_q \le 115$ | $10 \le \psi_q < 30$ |
| 5 | $15 \le \varphi_q < 25$ | $125 \le \theta_q \le 185$ | $10 \le \psi_q < 30$ |
| 6 | $25 \le \varphi_q < 35$ | $115 \le \theta_q \le 185$ | $10 \le \psi_q < 30$ |
| 7 | $35 \le \varphi_q < 45$ | $105 \le \theta_q \le 185$ | $10 \le \psi_q < 30$ |
| 8 | $45 \le \varphi_q < 55$ | $95 \le \theta_q \le 175$ | $10 \le \psi_q < 30$ |
| 9 | $55 \le \varphi_q < 65$ | $95 \le \theta_q \le 165$ | $10 \le \psi_q < 30$ |

15

TABLE 12-continued

| CONDITION | $\varphi_q$ RANGE[°] | $\theta_q$ RANGE[°] | $\psi_q$ RANGE[°] |
|---|---|---|---|
| 10 | $65 \le \varphi_q < 75$ | $95 \le \theta_q \le 155$ | $10 \le \psi_q < 30$ |
| 11 | $75 \le \varphi_q < 85$ | $-5 \le \theta_q \le 25$ | $10 \le \psi_q < 30$ |
| 12 | $75 \le \varphi_q < 85$ | $95 \le \theta_q \le 155$ | $10 \le \psi_q < 30$ |
| 13 | $85 \le \varphi_q < 95$ | $-5 \le \theta_q \le 25$ | $10 \le \psi_q < 30$ |
| 14 | $85 \le \varphi_q < 95$ | $95 \le \theta_q \le 155$ | $10 \le \psi_q < 30$ |
| 15 | $95 \le \varphi_q < 105$ | $-5 \le \theta_q \le 25$ | $10 \le \psi_q < 30$ |
| 16 | $95 \le \varphi_q < 105$ | $95 \le \theta_q \le 155$ | $10 \le \psi_q < 30$ |
| 17 | $105 \le \varphi_q < 115$ | $-5 \le \theta_q \le 25$ | $10 \le \psi_q < 30$ |
| 18 | $105 \le \varphi_q < 115$ | $95 \le \theta_q \le 175$ | $10 \le \psi_q < 30$ |
| 19 | $115 \le \varphi_q < 125$ | $-5 \le \theta_q \le 15$ | $10 \le \psi_q < 30$ |
| 20 | $115 \le \varphi_q < 125$ | $95 \le \theta_q \le 185$ | $10 \le \psi_q < 30$ |
| 21 | $125 \le \varphi_q < 135$ | $115 \le \theta_q \le 185$ | $10 \le \psi_q < 30$ |
| 22 | $135 \le \varphi_q < 145$ | $105 \le \theta_q \le 115$ | $10 \le \psi_q < 30$ |
| 23 | $135 \le \varphi_q < 145$ | $125 \le \theta_q \le 185$ | $10 \le \psi_q < 30$ |
| 24 | $145 \le \varphi_q < 155$ | $115 \le \theta_q \le 185$ | $10 \le \psi_q < 30$ |
| 25 | $155 \le \varphi_q < 165$ | $105 \le \theta_q \le 185$ | $10 \le \psi_q < 30$ |
| 26 | $165 \le \varphi_q < 175$ | $95 \le \theta_q \le 175$ | $10 \le \psi_q < 30$ |
| 27 | $175 \le \varphi_q < 185$ | $95 \le \theta_q \le 165$ | $10 \le \psi_q < 30$ |

TABLE 13

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $75 \le \theta_q \le 105$ | $30 \le \psi_q < 50$ |
| 2 | $-5 \le \varphi_q < 5$ | $115 \le \theta_q \le 155$ | $30 \le \psi_q < 50$ |
| 3 | $5 \le \varphi_q < 15$ | $65 \le \theta_q \le 95$ | $30 \le \psi_q < 50$ |
| 4 | $5 \le \varphi_q < 15$ | $115 \le \theta_q \le 175$ | $30 \le \psi_q < 50$ |
| 5 | $15 \le \varphi_q < 25$ | $65 \le \theta_q \le 75$ | $30 \le \psi_q < 50$ |
| 6 | $15 \le \varphi_q < 25$ | $145 \le \theta_q \le 185$ | $30 \le \psi_q < 50$ |
| 7 | $25 \le \varphi_q < 35$ | $55 \le \theta_q \le 65$ | $30 \le \psi_q < 50$ |
| 8 | $25 \le \varphi_q < 35$ | $135 \le \theta_q \le 185$ | $30 \le \psi_q < 50$ |
| 9 | $35 \le \varphi_q < 45$ | $135 \le \theta_q \le 185$ | $30 \le \psi_q < 50$ |
| 10 | $45 \le \varphi_q < 55$ | $125 \le \theta_q \le 185$ | $30 \le \psi_q < 50$ |
| 11 | $55 \le \varphi_q < 65$ | $-5 \le \theta_q \le 25$ | $30 \le \psi_q < 50$ |
| 12 | $55 \le \varphi_q < 65$ | $115 \le \theta_q \le 185$ | $30 \le \psi_q < 50$ |
| 13 | $65 \le \varphi_q < 75$ | $-5 \le \theta_q \le 35$ | $30 \le \psi_q < 50$ |
| 14 | $65 \le \varphi_q < 75$ | $115 \le \theta_q \le 175$ | $30 \le \psi_q < 50$ |
| 15 | $75 \le \varphi_q < 85$ | $-5 \le \theta_q \le 25$ | $30 \le \psi_q < 50$ |
| 16 | $75 \le \varphi_q < 85$ | $95 \le \theta_q \le 165$ | $30 \le \psi_q < 50$ |
| 17 | $85 \le \varphi_q < 95$ | $-5 \le \theta_q \le 25$ | $30 \le \psi_q < 50$ |
| 18 | $85 \le \varphi_q < 95$ | $95 \le \theta_q \le 155$ | $30 \le \psi_q < 50$ |
| 19 | $95 \le \varphi_q < 105$ | $-5 \le \theta_q \le 15$ | $30 \le \psi_q < 50$ |
| 20 | $95 \le \varphi_q < 105$ | $85 \le \theta_q \le 155$ | $30 \le \psi_q < 50$ |
| 21 | $105 \le \varphi_q < 115$ | $85 \le \theta_q \le 145$ | $30 \le \psi_q < 50$ |
| 22 | $115 \le \varphi_q < 125$ | $75 \le \theta_q \le 105$ | $30 \le \psi_q < 50$ |
| 23 | $115 \le \varphi_q < 125$ | $115 \le \theta_q \le 155$ | $30 \le \psi_q < 50$ |
| 24 | $125 \le \varphi_q < 135$ | $65 \le \theta_q \le 95$ | $30 \le \psi_q < 50$ |
| 25 | $125 \le \varphi_q < 135$ | $115 \le \theta_q \le 175$ | $30 \le \psi_q < 50$ |
| 26 | $135 \le \varphi_q < 145$ | $65 \le \theta_q \le 75$ | $30 \le \psi_q < 50$ |
| 27 | $135 \le \varphi_q < 145$ | $145 \le \theta_q \le 185$ | $30 \le \psi_q < 50$ |
| 28 | $145 \le \varphi_q < 155$ | $55 \le \theta_q \le 65$ | $30 \le \psi_q < 50$ |
| 29 | $145 \le \varphi_q < 155$ | $135 \le \theta_q \le 185$ | $30 \le \psi_q < 50$ |
| 30 | $155 \le \varphi_q < 165$ | $135 \le \theta_q \le 185$ | $30 \le \psi_q < 50$ |
| 31 | $165 \le \varphi_q < 175$ | $125 \le \theta_q \le 185$ | $30 \le \psi_q < 50$ |
| 32 | $175 \le \varphi_q < 185$ | $-5 \le \theta_q \le 25$ | $30 \le \psi_q < 50$ |
| 33 | $175 \le \varphi_q < 185$ | $115 \le \theta_q \le 185$ | $30 \le \psi_q < 50$ |

TABLE 14

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $55 \le \theta_q \le 135$ | $50 \le \psi_q < 70$ |
| 2 | $5 \le \varphi_q < 15$ | $55 \le \theta_q \le 135$ | $50 \le \psi_q < 70$ |
| 3 | $15 \le \varphi_q < 25$ | $45 \le \theta_q \le 115$ | $50 \le \psi_q < 70$ |
| 4 | $25 \le \varphi_q < 35$ | $45 \le \theta_q \le 85$ | $50 \le \psi_q < 70$ |
| 5 | $25 \le \varphi_q < 35$ | $165 \le \theta_q \le 175$ | $50 \le \psi_q < 70$ |
| 6 | $35 \le \varphi_q < 45$ | $-5 \le \theta_q \le 65$ | $50 \le \psi_q < 70$ |
| 7 | $35 \le \varphi_q < 45$ | $145 \le \theta_q \le 185$ | $50 \le \psi_q < 70$ |
| 8 | $45 \le \varphi_q < 55$ | $-5 \le \theta_q \le 45$ | $50 \le \psi_q < 70$ |
| 9 | $45 \le \varphi_q < 55$ | $135 \le \theta_q \le 185$ | $50 \le \psi_q < 70$ |

16

TABLE 14-continued

| CONDITION | $\varphi_q$ RANGE[°] | $\theta_q$ RANGE[°] | $\psi_q$ RANGE[°] |
|---|---|---|---|
| 10 | $55 \le \varphi_q < 65$ | $-5 \le \theta_q \le 35$ | $50 \le \psi_q < 70$ |
| 11 | $55 \le \varphi_q < 65$ | $125 \le \theta_q \le 185$ | $50 \le \psi_q < 70$ |
| 12 | $65 \le \varphi_q < 75$ | $-5 \le \theta_q \le 35$ | $50 \le \psi_q < 70$ |
| 13 | $65 \le \varphi_q < 75$ | $125 \le \theta_q \le 185$ | $50 \le \psi_q < 70$ |
| 14 | $75 \le \varphi_q < 85$ | $-5 \le \theta_q \le 25$ | $50 \le \psi_q < 70$ |
| 15 | $75 \le \varphi_q < 85$ | $115 \le \theta_q \le 185$ | $50 \le \psi_q < 70$ |
| 16 | $85 \le \varphi_q < 95$ | $95 \le \theta_q \le 175$ | $50 \le \psi_q < 70$ |
| 17 | $95 \le \varphi_q < 105$ | $75 \le \theta_q \le 155$ | $50 \le \psi_q < 70$ |
| 18 | $105 \le \varphi_q < 115$ | $65 \le \theta_q \le 145$ | $50 \le \psi_q < 70$ |
| 19 | $115 \le \varphi_q < 125$ | $65 \le \theta_q \le 135$ | $50 \le \psi_q < 70$ |
| 20 | $125 \le \varphi_q < 135$ | $55 \le \theta_q \le 135$ | $50 \le \psi_q < 70$ |
| 21 | $135 \le \varphi_q < 145$ | $45 \le \theta_q \le 115$ | $50 \le \psi_q < 70$ |
| 22 | $145 \le \varphi_q < 155$ | $45 \le \theta_q \le 85$ | $50 \le \psi_q < 70$ |
| 23 | $145 \le \varphi_q < 155$ | $165 \le \theta_q \le 175$ | $50 \le \psi_q < 70$ |
| 24 | $155 \le \varphi_q < 165$ | $-5 \le \theta_q \le 65$ | $50 \le \psi_q < 70$ |
| 25 | $155 \le \varphi_q < 165$ | $145 \le \theta_q \le 185$ | $50 \le \psi_q < 70$ |
| 26 | $165 \le \varphi_q < 175$ | $-5 \le \theta_q \le 45$ | $50 \le \psi_q < 70$ |
| 27 | $165 \le \varphi_q < 175$ | $135 \le \theta_q \le 185$ | $50 \le \psi_q < 70$ |
| 28 | $175 \le \varphi_q < 185$ | $-5 \le \theta_q \le 35$ | $50 \le \psi_q < 70$ |
| 29 | $175 \le \varphi_q < 185$ | $125 \le \theta_q \le 185$ | $50 \le \psi_q < 70$ |

TABLE 15

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $55 \le \theta_q \le 135$ | $70 \le \psi_q < 90$ |
| 2 | $5 \le \varphi_q < 15$ | $25 \le \theta_q \le 35$ | $70 \le \psi_q < 90$ |
| 3 | $5 \le \varphi_q < 15$ | $45 \le \theta_q \le 135$ | $70 \le \psi_q < 90$ |
| 4 | $15 \le \varphi_q < 25$ | $-5 \le \theta_q \le 115$ | $70 \le \psi_q < 90$ |
| 5 | $25 \le \varphi_q < 35$ | $-5 \le \theta_q \le 65$ | $70 \le \psi_q < 90$ |
| 6 | $35 \le \varphi_q < 45$ | $-5 \le \theta_q \le 55$ | $70 \le \psi_q < 90$ |
| 7 | $45 \le \varphi_q < 55$ | $-5 \le \theta_q \le 45$ | $70 \le \psi_q < 90$ |
| 8 | $55 \le \varphi_q < 65$ | $-5 \le \theta_q \le 35$ | $70 \le \psi_q < 90$ |
| 9 | $55 \le \varphi_q < 65$ | $135 \le \theta_q \le 185$ | $70 \le \psi_q < 90$ |
| 10 | $65 \le \varphi_q < 75$ | $125 \le \theta_q \le 185$ | $70 \le \psi_q < 90$ |
| 11 | $75 \le \varphi_q < 85$ | $115 \le \theta_q \le 185$ | $70 \le \psi_q < 90$ |
| 12 | $85 \le \varphi_q < 95$ | $85 \le \theta_q \le 185$ | $70 \le \psi_q < 90$ |
| 13 | $95 \le \varphi_q < 105$ | $65 \le \theta_q \le 185$ | $70 \le \psi_q < 90$ |
| 14 | $105 \le \varphi_q < 115$ | $55 \le \theta_q \le 175$ | $70 \le \psi_q < 90$ |
| 15 | $115 \le \varphi_q < 125$ | $55 \le \theta_q \le 135$ | $70 \le \psi_q < 90$ |
| 16 | $125 \le \varphi_q < 135$ | $25 \le \theta_q \le 35$ | $70 \le \psi_q < 90$ |
| 17 | $125 \le \varphi_q < 135$ | $45 \le \theta_q \le 135$ | $70 \le \psi_q < 90$ |
| 18 | $135 \le \varphi_q < 145$ | $-5 \le \theta_q \le 115$ | $70 \le \psi_q < 90$ |
| 19 | $135 \le \varphi_q < 145$ | $125 \le \theta_q \le 135$ | $70 \le \psi_q < 90$ |
| 20 | $145 \le \varphi_q < 155$ | $-5 \le \theta_q \le 65$ | $70 \le \psi_q < 90$ |
| 21 | $155 \le \varphi_q < 165$ | $-5 \le \theta_q \le 55$ | $70 \le \psi_q < 90$ |
| 22 | $165 \le \varphi_q < 175$ | $-5 \le \theta_q \le 45$ | $70 \le \psi_q < 90$ |
| 23 | $175 \le \varphi_q < 185$ | $-5 \le \theta_q \le 35$ | $70 \le \psi_q < 90$ |
| 24 | $175 \le \varphi_q < 185$ | $135 \le \theta_q \le 185$ | $70 \le \psi_q < 90$ |

TABLE 16

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 45$ | $90 \le \psi_q < 110$ |
| 2 | $-5 \le \varphi_q < 5$ | $135 \le \theta_q \le 185$ | $90 \le \psi_q < 110$ |
| 3 | $5 \le \varphi_q < 15$ | $-5 \le \theta_q \le 45$ | $90 \le \psi_q < 110$ |
| 4 | $5 \le \varphi_q < 15$ | $165 \le \theta_q \le 175$ | $90 \le \psi_q < 110$ |
| 5 | $15 \le \varphi_q < 25$ | $-5 \le \theta_q \le 65$ | $90 \le \psi_q < 110$ |
| 6 | $25 \le \varphi_q < 35$ | $-5 \le \theta_q \le 65$ | $90 \le \psi_q < 110$ |
| 7 | $35 \le \varphi_q < 45$ | $-5 \le \theta_q \le 75$ | $90 \le \psi_q < 110$ |
| 8 | $45 \le \varphi_q < 55$ | $15 \le \theta_q \le 115$ | $90 \le \psi_q < 110$ |
| 9 | $45 \le \varphi_q < 55$ | $175 \le \theta_q \le 185$ | $90 \le \psi_q < 110$ |
| 10 | $55 \le \varphi_q < 65$ | $35 \le \theta_q \le 125$ | $90 \le \psi_q < 110$ |
| 11 | $65 \le \varphi_q < 75$ | $55 \le \theta_q \le 145$ | $90 \le \psi_q < 110$ |
| 12 | $75 \le \varphi_q < 85$ | $55 \le \theta_q \le 185$ | $90 \le \psi_q < 110$ |
| 13 | $85 \le \varphi_q < 95$ | $65 \le \theta_q \le 185$ | $90 \le \psi_q < 110$ |
| 14 | $95 \le \varphi_q < 105$ | $85 \le \theta_q \le 105$ | $90 \le \psi_q < 110$ |
| 15 | $95 \le \varphi_q < 105$ | $115 \le \theta_q \le 185$ | $90 \le \psi_q < 110$ |
| 16 | $105 \le \varphi_q < 115$ | $125 \le \theta_q \le 185$ | $90 \le \psi_q < 110$ |

TABLE 16-continued

| CONDITION | $\varphi_q$ RANGE[°] | $\theta_q$ RANGE[°] | $\psi_q$ RANGE[°] |
|---|---|---|---|
| 17 | $115 \le \varphi_q < 125$ | $-5 \le \theta_q \le 45$ | $90 \le \psi_q < 110$ |
| 18 | $115 \le \varphi_q < 125$ | $135 \le \theta_q \le 185$ | $90 \le \psi_q < 110$ |
| 19 | $125 \le \varphi_q < 135$ | $-5 \le \theta_q \le 45$ | $90 \le \psi_q < 110$ |
| 20 | $125 \le \varphi_q < 135$ | $165 \le \theta_q \le 175$ | $90 \le \psi_q < 110$ |
| 21 | $135 \le \varphi_q < 145$ | $-5 \le \theta_q \le 65$ | $90 \le \psi_q < 110$ |
| 22 | $145 \le \varphi_q < 155$ | $-5 \le \theta_q \le 65$ | $90 \le \psi_q < 110$ |
| 23 | $155 \le \varphi_q < 165$ | $-5 \le \theta_q \le 75$ | $90 \le \psi_q < 110$ |
| 24 | $165 \le \varphi_q < 175$ | $15 \le \theta_q \le 115$ | $90 \le \psi_q < 110$ |
| 25 | $175 \le \varphi_q < 185$ | $35 \le \theta_q \le 125$ | $90 \le \psi_q < 110$ |

TABLE 17

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 45$ | $110 \le \psi_q < 130$ |
| 2 | $-5 \le \varphi_q < 5$ | $145 \le \theta_q \le 185$ | $110 \le \psi_q < 130$ |
| 3 | $5 \le \varphi_q < 15$ | $-5 \le \theta_q \le 55$ | $110 \le \psi_q < 130$ |
| 4 | $5 \le \varphi_q < 15$ | $145 \le \theta_q \le 185$ | $110 \le \psi_q < 130$ |
| 5 | $15 \le \varphi_q < 25$ | $-5 \le \theta_q \le 55$ | $110 \le \psi_q < 130$ |
| 6 | $15 \le \varphi_q < 25$ | $155 \le \theta_q \le 185$ | $110 \le \psi_q < 130$ |
| 7 | $25 \le \varphi_q < 35$ | $5 \le \theta_q \le 75$ | $110 \le \psi_q < 130$ |
| 8 | $35 \le \varphi_q < 45$ | $25 \le \theta_q \le 95$ | $110 \le \psi_q < 130$ |
| 9 | $45 \le \varphi_q < 55$ | $35 \le \theta_q \le 105$ | $110 \le \psi_q < 130$ |
| 10 | $55 \le \varphi_q < 65$ | $35 \le \theta_q \le 125$ | $110 \le \psi_q < 130$ |
| 11 | $65 \le \varphi_q < 75$ | $45 \le \theta_q \le 125$ | $110 \le \psi_q < 130$ |
| 12 | $75 \le \varphi_q < 85$ | $45 \le \theta_q \le 135$ | $110 \le \psi_q < 130$ |
| 13 | $85 \le \varphi_q < 95$ | $5 \le \theta_q \le 25$ | $110 \le \psi_q < 130$ |
| 14 | $85 \le \varphi_q < 95$ | $85 \le \theta_q \le 155$ | $110 \le \psi_q < 130$ |
| 15 | $95 \le \varphi_q < 105$ | $-5 \le \theta_q \le 45$ | $110 \le \psi_q < 130$ |
| 16 | $95 \le \varphi_q < 105$ | $105 \le \theta_q \le 185$ | $110 \le \psi_q < 130$ |
| 17 | $105 \le \varphi_q < 115$ | $-5 \le \theta_q \le 45$ | $110 \le \psi_q < 130$ |
| 18 | $105 \le \varphi_q < 115$ | $135 \le \theta_q \le 185$ | $110 \le \psi_q < 130$ |
| 19 | $115 \le \varphi_q < 125$ | $-5 \le \theta_q \le 45$ | $110 \le \psi_q < 130$ |
| 20 | $115 \le \varphi_q < 125$ | $145 \le \theta_q \le 185$ | $110 \le \psi_q < 130$ |
| 21 | $125 \le \varphi_q < 135$ | $-5 \le \theta_q \le 55$ | $110 \le \psi_q < 130$ |
| 22 | $125 \le \varphi_q < 135$ | $145 \le \theta_q \le 185$ | $110 \le \psi_q < 130$ |
| 23 | $135 \le \varphi_q < 145$ | $-5 \le \theta_q \le 55$ | $110 \le \psi_q < 130$ |
| 24 | $135 \le \varphi_q < 145$ | $155 \le \theta_q \le 185$ | $110 \le \psi_q < 130$ |
| 25 | $145 \le \varphi_q < 155$ | $5 \le \theta_q \le 75$ | $110 \le \psi_q < 130$ |
| 26 | $155 \le \varphi_q < 165$ | $25 \le \theta_q \le 95$ | $110 \le \psi_q < 130$ |
| 27 | $165 \le \varphi_q < 175$ | $35 \le \theta_q \le 105$ | $110 \le \psi_q < 130$ |
| 28 | $175 \le \varphi_q < 185$ | $35 \le \theta_q \le 125$ | $110 \le \psi_q < 130$ |

TABLE 18

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 65$ | $130 \le \psi_q < 150$ |
| 2 | $-5 \le \varphi_q < 5$ | $155 \le \theta_q \le 185$ | $130 \le \psi_q < 150$ |
| 3 | $5 \le \varphi_q < 15$ | $5 \le \theta_q \le 65$ | $130 \le \psi_q < 150$ |
| 4 | $5 \le \varphi_q < 15$ | $145 \le \theta_q \le 185$ | $130 \le \psi_q < 150$ |
| 5 | $15 \le \varphi_q < 25$ | $15 \le \theta_q \le 75$ | $130 \le \psi_q < 150$ |
| 6 | $15 \le \varphi_q < 25$ | $145 \le \theta_q \le 185$ | $130 \le \psi_q < 150$ |
| 7 | $25 \le \varphi_q < 35$ | $25 \le \theta_q \le 85$ | $130 \le \psi_q < 150$ |
| 8 | $25 \le \varphi_q < 35$ | $155 \le \theta_q \le 185$ | $130 \le \psi_q < 150$ |
| 9 | $35 \le \varphi_q < 45$ | $25 \le \theta_q \le 95$ | $130 \le \psi_q < 150$ |
| 10 | $35 \le \varphi_q < 45$ | $165 \le \theta_q \le 185$ | $130 \le \psi_q < 150$ |
| 11 | $45 \le \varphi_q < 55$ | $35 \le \theta_q \le 95$ | $130 \le \psi_q < 150$ |
| 12 | $55 \le \varphi_q < 65$ | $25 \le \theta_q \le 105$ | $130 \le \psi_q < 150$ |
| 13 | $65 \le \varphi_q < 75$ | $5 \le \theta_q \le 65$ | $130 \le \psi_q < 150$ |
| 14 | $65 \le \varphi_q < 75$ | $85 \le \theta_q \le 115$ | $130 \le \psi_q < 150$ |
| 15 | $75 \le \varphi_q < 85$ | $-5 \le \theta_q \le 55$ | $130 \le \psi_q < 150$ |
| 16 | $75 \le \varphi_q < 85$ | $75 \le \theta_q \le 85$ | $130 \le \psi_q < 150$ |
| 17 | $75 \le \varphi_q < 85$ | $105 \le \theta_q \le 125$ | $130 \le \psi_q < 150$ |
| 18 | $85 \le \varphi_q < 95$ | $-5 \le \theta_q \le 55$ | $130 \le \psi_q < 150$ |
| 19 | $85 \le \varphi_q < 95$ | $105 \le \theta_q \le 115$ | $130 \le \psi_q < 150$ |
| 20 | $95 \le \varphi_q < 105$ | $-5 \le \theta_q \le 45$ | $130 \le \psi_q < 150$ |
| 21 | $105 \le \varphi_q < 115$ | $-5 \le \theta_q \le 55$ | $130 \le \psi_q < 150$ |
| 22 | $115 \le \varphi_q < 125$ | $-5 \le \theta_q \le 65$ | $130 \le \psi_q < 150$ |
| 23 | $115 \le \varphi_q < 125$ | $155 \le \theta_q \le 185$ | $130 \le \psi_q < 150$ |

TABLE 18-continued

| CONDITION | $\varphi_q$ RANGE[°] | $\theta_q$ RANGE[°] | $\psi_q$ RANGE[°] |
|---|---|---|---|
| 24 | $125 \le \varphi_q < 135$ | $5 \le \theta_q \le 65$ | $130 \le \psi_q < 150$ |
| 25 | $125 \le \varphi_q < 135$ | $145 \le \theta_q \le 185$ | $130 \le \psi_q < 150$ |
| 26 | $135 \le \varphi_q < 145$ | $15 \le \theta_q \le 75$ | $130 \le \psi_q < 150$ |
| 27 | $135 \le \varphi_q < 145$ | $145 \le \theta_q \le 185$ | $130 \le \psi_q < 150$ |
| 28 | $145 \le \varphi_q < 155$ | $25 \le \theta_q \le 85$ | $130 \le \psi_q < 150$ |
| 29 | $145 \le \varphi_q < 155$ | $155 \le \theta_q \le 185$ | $130 \le \psi_q < 150$ |
| 30 | $155 \le \varphi_q < 165$ | $25 \le \theta_q \le 95$ | $130 \le \psi_q < 150$ |
| 31 | $155 \le \varphi_q < 165$ | $165 \le \theta_q \le 185$ | $130 \le \psi_q < 150$ |
| 32 | $165 \le \varphi_q < 175$ | $35 \le \theta_q \le 95$ | $130 \le \psi_q < 150$ |
| 33 | $175 \le \varphi_q < 185$ | $25 \le \theta_q \le 105$ | $130 \le \psi_q < 150$ |

TABLE 19

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $15 \le \theta_q \le 85$ | $150 \le \psi_q < 170$ |
| 2 | $5 \le \varphi_q < 15$ | $25 \le \theta_q \le 85$ | $150 \le \psi_q < 170$ |
| 3 | $15 \le \varphi_q < 25$ | $25 \le \theta_q \le 85$ | $150 \le \psi_q < 170$ |
| 4 | $15 \le \varphi_q < 25$ | $165 \le \theta_q \le 185$ | $150 \le \psi_q < 170$ |
| 5 | $25 \le \varphi_q < 35$ | $25 \le \theta_q \le 85$ | $150 \le \psi_q < 170$ |
| 6 | $25 \le \varphi_q < 35$ | $155 \le \theta_q \le 185$ | $150 \le \psi_q < 170$ |
| 7 | $35 \le \varphi_q < 45$ | $25 \le \theta_q \le 85$ | $150 \le \psi_q < 170$ |
| 8 | $35 \le \varphi_q < 45$ | $155 \le \theta_q \le 185$ | $150 \le \psi_q < 170$ |
| 9 | $45 \le \varphi_q < 55$ | $5 \le \theta_q \le 85$ | $150 \le \psi_q < 170$ |
| 10 | $45 \le \varphi_q < 55$ | $155 \le \theta_q \le 185$ | $150 \le \psi_q < 170$ |
| 11 | $55 \le \varphi_q < 65$ | $-5 \le \theta_q \le 85$ | $150 \le \psi_q < 170$ |
| 12 | $55 \le \varphi_q < 65$ | $165 \le \theta_q \le 185$ | $150 \le \psi_q < 170$ |
| 13 | $65 \le \varphi_q < 75$ | $-5 \le \theta_q \le 85$ | $150 \le \psi_q < 170$ |
| 14 | $75 \le \varphi_q < 85$ | $-5 \le \theta_q \le 75$ | $150 \le \psi_q < 170$ |
| 15 | $85 \le \varphi_q < 95$ | $-5 \le \theta_q \le 65$ | $150 \le \psi_q < 170$ |
| 16 | $95 \le \varphi_q < 105$ | $-5 \le \theta_q \le 75$ | $150 \le \psi_q < 170$ |
| 17 | $105 \le \varphi_q < 115$ | $5 \le \theta_q \le 75$ | $150 \le \psi_q < 170$ |
| 18 | $115 \le \varphi_q < 125$ | $15 \le \theta_q \le 85$ | $150 \le \psi_q < 170$ |
| 19 | $125 \le \varphi_q < 135$ | $25 \le \theta_q \le 85$ | $150 \le \psi_q < 170$ |
| 20 | $135 \le \varphi_q < 145$ | $25 \le \theta_q \le 85$ | $150 \le \psi_q < 170$ |
| 21 | $135 \le \varphi_q < 145$ | $165 \le \theta_q \le 185$ | $150 \le \psi_q < 170$ |
| 22 | $145 \le \varphi_q < 155$ | $25 \le \theta_q \le 85$ | $150 \le \psi_q < 170$ |
| 23 | $145 \le \varphi_q < 155$ | $155 \le \theta_q \le 185$ | $150 \le \psi_q < 170$ |
| 24 | $155 \le \varphi_q < 165$ | $25 \le \theta_q \le 85$ | $150 \le \psi_q < 170$ |
| 25 | $155 \le \varphi_q < 165$ | $155 \le \theta_q \le 185$ | $150 \le \psi_q < 170$ |
| 26 | $165 \le \varphi_q < 175$ | $5 \le \theta_q \le 85$ | $150 \le \psi_q < 170$ |
| 27 | $165 \le \varphi_q < 175$ | $155 \le \theta_q \le 185$ | $150 \le \psi_q < 170$ |
| 28 | $175 \le \varphi_q < 185$ | $-5 \le \theta_q \le 85$ | $150 \le \psi_q < 170$ |
| 29 | $175 \le \varphi_q < 185$ | $165 \le \theta_q \le 185$ | $150 \le \psi_q < 170$ |

TABLE 20

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $25 \le \theta_q \le 85$ | $170 \le \psi_q \le 190$ |
| 2 | $5 \le \varphi_q < 15$ | $25 \le \theta_q \le 85$ | $170 \le \psi_q \le 190$ |
| 3 | $15 \le \varphi_q < 25$ | $15 \le \theta_q \le 85$ | $170 \le \psi_q \le 190$ |
| 4 | $25 \le \varphi_q < 35$ | $5 \le \theta_q \le 85$ | $170 \le \psi_q \le 190$ |
| 5 | $35 \le \varphi_q < 45$ | $-5 \le \theta_q \le 85$ | $170 \le \psi_q \le 190$ |
| 6 | $35 \le \varphi_q < 45$ | $165 \le \theta_q \le 185$ | $170 \le \psi_q \le 190$ |
| 7 | $45 \le \varphi_q < 55$ | $-5 \le \theta_q \le 75$ | $170 \le \psi_q \le 190$ |
| 8 | $45 \le \varphi_q < 55$ | $155 \le \theta_q \le 185$ | $170 \le \psi_q \le 190$ |
| 9 | $55 \le \varphi_q < 65$ | $-5 \le \theta_q \le 75$ | $170 \le \psi_q \le 190$ |
| 10 | $55 \le \varphi_q < 65$ | $155 \le \theta_q \le 185$ | $170 \le \psi_q \le 190$ |
| 11 | $65 \le \varphi_q < 75$ | $-5 \le \theta_q \le 85$ | $170 \le \psi_q \le 190$ |
| 12 | $65 \le \varphi_q < 75$ | $155 \le \theta_q \le 185$ | $170 \le \psi_q \le 190$ |
| 13 | $75 \le \varphi_q < 85$ | $-5 \le \theta_q \le 85$ | $170 \le \psi_q \le 190$ |
| 14 | $75 \le \varphi_q < 85$ | $165 \le \theta_q \le 185$ | $170 \le \psi_q \le 190$ |
| 15 | $85 \le \varphi_q < 95$ | $5 \le \theta_q \le 85$ | $170 \le \psi_q \le 190$ |
| 16 | $95 \le \varphi_q < 105$ | $15 \le \theta_q \le 85$ | $170 \le \psi_q \le 190$ |
| 17 | $105 \le \varphi_q < 115$ | $25 \le \theta_q \le 45$ | $170 \le \psi_q \le 190$ |
| 18 | $105 \le \varphi_q < 115$ | $55 \le \theta_q \le 85$ | $170 \le \psi_q \le 190$ |
| 19 | $115 \le \varphi_q < 125$ | $25 \le \theta_q \le 85$ | $170 \le \psi_q \le 190$ |
| 20 | $125 \le \varphi_q < 135$ | $25 \le \theta_q \le 85$ | $170 \le \psi_q \le 190$ |
| 21 | $135 \le \varphi_q < 145$ | $15 \le \theta_q \le 85$ | $170 \le \psi_q \le 190$ |

TABLE 20-continued

| CONDITION | $\varphi_q$ RANGE[°] | $\theta_q$ RANGE[°] | $\psi_q$ RANGE[°] |
|---|---|---|---|
| 22 | $145 \le \varphi_q < 155$ | $5 \le \theta_q \le 85$ | $170 \le \psi_q \le 190$ |
| 23 | $155 \le \varphi_q < 165$ | $-5 \le \theta_q \le 85$ | $170 \le \psi_q \le 190$ |
| 24 | $155 \le \varphi_q < 165$ | $165 \le \theta_q \le 185$ | $170 \le \psi_q \le 190$ |
| 25 | $165 \le \varphi_q < 175$ | $-5 \le \theta_q \le 75$ | $170 \le \psi_q \le 190$ |
| 26 | $165 \le \varphi_q < 175$ | $155 \le \theta_q \le 185$ | $170 \le \psi_q \le 190$ |
| 27 | $175 \le \varphi_q < 185$ | $-5 \le \theta_q \le 75$ | $170 \le \psi_q \le 190$ |
| 28 | $175 \le \varphi_q < 185$ | $155 \le \theta_q \le 185$ | $170 \le \psi_q \le 190$ |

In Tables 1 to 20, there are given the combinations of $\varphi_q$, $\theta_q$, and $\psi_q$ in the azimuthal angles of the quartz-crystal layer 4 when the cut angle of the lithium tantalate of the piezoelectric layer 5 is about 20° Y or more and about 90° Y or less, for example. As described above, a relative bandwidth can be sufficiently widened when the cut angle of the lithium tantalate of the piezoelectric layer 5 is about 20° Y or more and about 90° Y or less, for example.

As FIG. 1 illustrates, in the multilayer substrate 6 in the first preferred embodiment, the quartz-crystal layer 4 is directly disposed on the support substrate 2. Note that the quartz-crystal layer 4 may be indirectly disposed on the support substrate 2 with another layer interposed therebetween.

Figure 16:
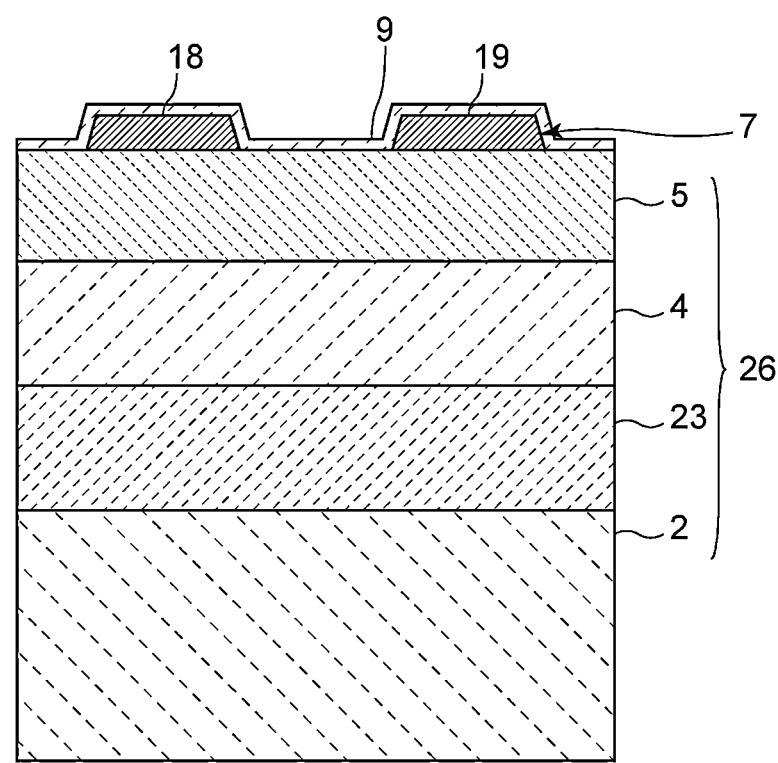
FIG. 16 is a front sectional view of the vicinity of a pair of electrode fingers in a modification of the first preferred embodiment of the present invention.

FIG. 16 is a front sectional view of the vicinity of a pair of electrode fingers in a modification of the first preferred embodiment.

A multilayer substrate 26 in the present modification includes an intermediate layer 23 disposed between the support substrate 2 and the quartz-crystal layer 4. Examples of the material for the intermediate layer 23 include a dielectric of silicon oxide, silicon nitride, or silicon oxynitride. Note that the intermediate layer 23 may be a multilayer body. In such a case, for example, the intermediate layer 23 includes at least a first layer and a second layer. Examples of the material for each of the layers of the intermediate layer 23 include a dielectric of silicon oxide, silicon nitride, or silicon oxynitride.

In the present modification, the higher-order mode can also be suppressed in a wide band as in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a silicon oxide layer provided directly or indirectly on the support substrate and having crystallinity;
a piezoelectric layer on the silicon oxide layer having crystallinity; and
an IDT electrode on the piezoelectric layer; wherein
when λ represents a wavelength defined by an electrode finger pitch of the IDT electrode, a thickness of the silicon oxide layer having crystallinity is about 0.2λ or more and about 0.4λ or less;
the piezoelectric layer has a thickness smaller than the thickness of the silicon oxide layer having crystallinity;
the piezoelectric layer is a lithium tantalate layer; and
a cut angle of lithium tantalate of the piezoelectric layer is about 20° Y or more and about 90° Y or less.

2. The acoustic wave device according to claim 1, wherein the silicon oxide layer having crystallinity is a quartz-crystal layer.

3. The acoustic wave device according to claim 1, wherein the support substrate is a silicon substrate.

4. The acoustic wave device according to claim 1, wherein
the cut angle of the lithium tantalate of the piezoelectric layer is about 40° Y or more and about 90° Y or less;
the silicon oxide layer having crystallinity is a monocrystalline quartz-crystal layer; and
when ($\phi_q$, $\theta_q$, $\psi_q$) represent azimuthal angles of the monocrystalline quartz-crystal layer, the angles $\phi_q$, $\theta_q$, and $\psi_q$ are in any one of combinations in Tables 11 to 20:

TABLE 11

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 25$ | $-10 \le \psi_q < 10$ |
| 2 | $-5 \le \varphi_q < 5$ | $105 \le \theta_q \le 185$ | $-10 \le \psi_q < 10$ |
| 3 | $5 \le \varphi_q < 15$ | $-5 \le \theta_q \le 25$ | $-10 \le \psi_q < 10$ |
| 4 | $5 \le \varphi_q < 15$ | $105 \le \theta_q \le 185$ | $-10 \le \psi_q < 10$ |
| 5 | $15 \le \varphi_q < 25$ | $-5 \le \theta_q \le 15$ | $-10 \le \psi_q < 10$ |
| 6 | $15 \le \varphi_q < 25$ | $95 \le \theta_q \le 185$ | $-10 \le \psi_q < 10$ |
| 7 | $25 \le \varphi_q < 35$ | $95 \le \theta_q \le 175$ | $-10 \le \psi_q < 10$ |
| 8 | $35 \le \varphi_q < 45$ | $95 \le \theta_q \le 165$ | $-10 \le \psi_q < 10$ |
| 9 | $45 \le \varphi_q < 55$ | $95 \le \theta_q \le 155$ | $-10 \le \psi_q < 10$ |
| 10 | $55 \le \varphi_q < 65$ | $95 \le \theta_q \le 155$ | $-10 \le \psi_q < 10$ |
| 11 | $65 \le \varphi_q < 75$ | $95 \le \theta_q \le 155$ | $-10 \le \psi_q < 10$ |
| 12 | $75 \le \varphi_q < 85$ | $95 \le \theta_q \le 165$ | $-10 \le \psi_q < 10$ |
| 13 | $85 \le \varphi_q < 95$ | $95 \le \theta_q \le 175$ | $-10 \le \psi_q < 10$ |
| 14 | $95 \le \varphi_q < 105$ | $-5 \le \theta_q \le 15$ | $-10 \le \psi_q < 10$ |
| 15 | $95 \le \varphi_q < 105$ | $95 \le \theta_q \le 185$ | $-10 \le \psi_q < 10$ |
| 16 | $105 \le \varphi_q < 115$ | $-5 \le \theta_q \le 25$ | $-10 \le \psi_q < 10$ |
| 17 | $105 \le \varphi_q < 115$ | $95 \le \theta_q \le 185$ | $-10 \le \psi_q < 10$ |
| 18 | $115 \le \varphi_q < 125$ | $-5 \le \theta_q \le 25$ | $-10 \le \psi_q < 10$ |
| 19 | $115 \le \varphi_q < 125$ | $105 \le \theta_q \le 185$ | $-10 \le \psi_q < 10$ |
| 20 | $125 \le \varphi_q < 135$ | $-5 \le \theta_q \le 25$ | $-10 \le \psi_q < 10$ |
| 21 | $125 \le \varphi_q < 135$ | $105 \le \theta_q \le 185$ | $-10 \le \psi_q < 10$ |
| 22 | $135 \le \varphi_q < 145$ | $-5 \le \theta_q \le 15$ | $-10 \le \psi_q < 10$ |
| 23 | $135 \le \varphi_q < 145$ | $95 \le \theta_q \le 185$ | $-10 \le \psi_q < 10$ |
| 24 | $145 \le \varphi_q < 155$ | $95 \le \theta_q \le 175$ | $-10 \le \psi_q < 10$ |
| 25 | $155 \le \varphi_q < 165$ | $95 \le \theta_q \le 165$ | $-10 \le \psi_q < 10$ |
| 26 | $165 \le \varphi_q < 175$ | $95 \le \theta_q \le 155$ | $-10 \le \psi_q < 10$ |
| 27 | $175 \le \varphi_q < 185$ | $95 \le \theta_q \le 155$ | $-10 \le \psi_q < 10$ |

TABLE 12

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 15$ | $10 \le \psi_q < 30$ |
| 2 | $-5 \le \varphi_q < 5$ | $95 \le \theta_q \le 185$ | $10 \le \psi_q < 30$ |
| 3 | $5 \le \varphi_q < 15$ | $115 \le \theta_q \le 185$ | $10 \le \psi_q < 30$ |
| 4 | $15 \le \varphi_q < 25$ | $105 \le \theta_q \le 115$ | $10 \le \psi_q < 30$ |
| 5 | $15 \le \varphi_q < 25$ | $125 \le \theta_q \le 185$ | $10 \le \psi_q < 30$ |
| 6 | $25 \le \varphi_q < 35$ | $115 \le \theta_q \le 185$ | $10 \le \psi_q < 30$ |
| 7 | $35 \le \varphi_q < 45$ | $105 \le \theta_q \le 185$ | $10 \le \psi_q < 30$ |
| 8 | $45 \le \varphi_q < 55$ | $95 \le \theta_q \le 175$ | $10 \le \psi_q < 30$ |
| 9 | $55 \le \varphi_q < 65$ | $95 \le \theta_q \le 165$ | $10 \le \psi_q < 30$ |
| 10 | $65 \le \varphi_q < 75$ | $95 \le \theta_q \le 155$ | $10 \le \psi_q < 30$ |
| 11 | $75 \le \varphi_q < 85$ | $-5 \le \theta_q \le 25$ | $10 \le \psi_q < 30$ |
| 12 | $75 \le \varphi_q < 85$ | $95 \le \theta_q \le 155$ | $10 \le \psi_q < 30$ |
| 13 | $85 \le \varphi_q < 95$ | $-5 \le \theta_q \le 25$ | $10 \le \psi_q < 30$ |
| 14 | $85 \le \varphi_q < 95$ | $95 \le \theta_q \le 155$ | $10 \le \psi_q < 30$ |
| 15 | $95 \le \varphi_q < 105$ | $-5 \le \theta_q \le 25$ | $10 \le \psi_q < 30$ |
| 16 | $95 \le \varphi_q < 105$ | $95 \le \theta_q \le 155$ | $10 \le \psi_q < 30$ |
| 17 | $105 \le \varphi_q < 115$ | $-5 \le \theta_q \le 25$ | $10 \le \psi_q < 30$ |
| 18 | $105 \le \varphi_q < 115$ | $95 \le \theta_q \le 175$ | $10 \le \psi_q < 30$ |
| 19 | $115 \le \varphi_q < 125$ | $-5 \le \theta_q \le 15$ | $10 \le \psi_q < 30$ |
| 20 | $115 \le \varphi_q < 125$ | $95 \le \theta_q \le 185$ | $10 \le \psi_q < 30$ |
| 21 | $125 \le \varphi_q < 135$ | $115 \le \theta_q \le 185$ | $10 \le \psi_q < 30$ |
| 22 | $135 \le \varphi_q < 145$ | $105 \le \theta_q \le 115$ | $10 \le \psi_q < 30$ |
| 23 | $135 \le \varphi_q < 145$ | $125 \le \theta_q \le 185$ | $10 \le \psi_q < 30$ |

TABLE 12-continued

| CONDITION | $\varphi_q$ RANGE[°] | $\theta_q$ RANGE[°] | $\psi_q$ RANGE[°] |
|---|---|---|---|
| 24 | $145 \le \varphi_q < 155$ | $115 \le \theta_q \le 185$ | $10 \le \psi_q < 30$ |
| 25 | $155 \le \varphi_q < 165$ | $105 \le \theta_q \le 185$ | $10 \le \psi_q < 30$ |
| 26 | $165 \le \varphi_q < 175$ | $95 \le \theta_q \le 175$ | $10 \le \psi_q < 30$ |
| 27 | $175 \le \varphi_q < 185$ | $95 \le \theta_q \le 165$ | $10 \le \psi_q < 30$ |

TABLE 13

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $75 \le \theta_q \le 105$ | $30 \le \psi_q < 50$ |
| 2 | $-5 \le \varphi_q < 5$ | $115 \le \theta_q \le 155$ | $30 \le \psi_q < 50$ |
| 3 | $5 \le \varphi_q < 15$ | $65 \le \theta_q \le 95$ | $30 \le \psi_q < 50$ |
| 4 | $5 \le \varphi_q < 15$ | $115 \le \theta_q \le 175$ | $30 \le \psi_q < 50$ |
| 5 | $15 \le \varphi_q < 25$ | $65 \le \theta_q \le 75$ | $30 \le \psi_q < 50$ |
| 6 | $15 \le \varphi_q < 25$ | $145 \le \theta_q \le 185$ | $30 \le \psi_q < 50$ |
| 7 | $25 \le \varphi_q < 35$ | $55 \le \theta_q \le 65$ | $30 \le \psi_q < 50$ |
| 8 | $25 \le \varphi_q < 35$ | $135 \le \theta_q \le 185$ | $30 \le \psi_q < 50$ |
| 9 | $35 \le \varphi_q < 45$ | $135 \le \theta_q \le 185$ | $30 \le \psi_q < 50$ |
| 10 | $45 \le \varphi_q < 55$ | $125 \le \theta_q \le 185$ | $30 \le \psi_q < 50$ |
| 11 | $55 \le \varphi_q < 65$ | $-5 \le \theta_q \le 25$ | $30 \le \psi_q < 50$ |
| 12 | $55 \le \varphi_q < 65$ | $115 \le \theta_q \le 185$ | $30 \le \psi_q < 50$ |
| 13 | $65 \le \varphi_q < 75$ | $-5 \le \theta_q \le 35$ | $30 \le \psi_q < 50$ |
| 14 | $65 \le \varphi_q < 75$ | $115 \le \theta_q \le 175$ | $30 \le \psi_q < 50$ |
| 15 | $75 \le \varphi_q < 85$ | $-5 \le \theta_q \le 25$ | $30 \le \psi_q < 50$ |
| 16 | $75 \le \varphi_q < 85$ | $95 \le \theta_q \le 165$ | $30 \le \psi_q < 50$ |
| 17 | $85 \le \varphi_q < 95$ | $-5 \le \theta_q \le 25$ | $30 \le \psi_q < 50$ |
| 18 | $85 \le \varphi_q < 95$ | $95 \le \theta_q \le 155$ | $30 \le \psi_q < 50$ |
| 19 | $95 \le \varphi_q < 105$ | $-5 \le \theta_q \le 15$ | $30 \le \psi_q < 50$ |
| 20 | $95 \le \varphi_q < 105$ | $85 \le \theta_q \le 155$ | $30 \le \psi_q < 50$ |
| 21 | $105 \le \varphi_q < 115$ | $85 \le \theta_q \le 145$ | $30 \le \psi_q < 50$ |
| 22 | $115 \le \varphi_q < 125$ | $75 \le \theta_q \le 105$ | $30 \le \psi_q < 50$ |
| 23 | $115 \le \varphi_q < 125$ | $115 \le \theta_q \le 155$ | $30 \le \psi_q < 50$ |
| 24 | $125 \le \varphi_q < 135$ | $65 \le \theta_q \le 95$ | $30 \le \psi_q < 50$ |
| 25 | $125 \le \varphi_q < 135$ | $115 \le \theta_q \le 175$ | $30 \le \psi_q < 50$ |
| 26 | $135 \le \varphi_q < 145$ | $65 \le \theta_q \le 75$ | $30 \le \psi_q < 50$ |
| 27 | $135 \le \varphi_q < 145$ | $145 \le \theta_q \le 185$ | $30 \le \psi_q < 50$ |
| 28 | $145 \le \varphi_q < 155$ | $55 \le \theta_q \le 65$ | $30 \le \psi_q < 50$ |
| 29 | $145 \le \varphi_q < 155$ | $135 \le \theta_q \le 185$ | $30 \le \psi_q < 50$ |
| 30 | $155 \le \varphi_q < 165$ | $135 \le \theta_q \le 185$ | $30 \le \psi_q < 50$ |
| 31 | $165 \le \varphi_q < 175$ | $125 \le \theta_q \le 185$ | $30 \le \psi_q < 50$ |
| 32 | $175 \le \varphi_q < 185$ | $-5 \le \theta_q \le 25$ | $30 \le \psi_q < 50$ |
| 33 | $175 \le \varphi_q < 185$ | $115 \le \theta_q \le 185$ | $30 \le \psi_q < 50$ |

TABLE 14

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $55 \le \theta_q \le 135$ | $50 \le \psi_q < 70$ |
| 2 | $5 \le \varphi_q < 15$ | $55 \le \theta_q \le 135$ | $50 \le \psi_q < 70$ |
| 3 | $15 \le \varphi_q < 25$ | $45 \le \theta_q \le 115$ | $50 \le \psi_q < 70$ |
| 4 | $25 \le \varphi_q < 35$ | $45 \le \theta_q \le 85$ | $50 \le \psi_q < 70$ |
| 5 | $25 \le \varphi_q < 35$ | $165 \le \theta_q \le 175$ | $50 \le \psi_q < 70$ |
| 6 | $35 \le \varphi_q < 45$ | $-5 \le \theta_q \le 65$ | $50 \le \psi_q < 70$ |
| 7 | $35 \le \varphi_q < 45$ | $145 \le \theta_q \le 185$ | $50 \le \psi_q < 70$ |
| 8 | $45 \le \varphi_q < 55$ | $-5 \le \theta_q \le 45$ | $50 \le \psi_q < 70$ |
| 9 | $45 \le \varphi_q < 55$ | $135 \le \theta_q \le 185$ | $50 \le \psi_q < 70$ |
| 10 | $55 \le \varphi_q < 65$ | $-5 \le \theta_q \le 35$ | $50 \le \psi_q < 70$ |
| 11 | $55 \le \varphi_q < 65$ | $125 \le \theta_q \le 185$ | $50 \le \psi_q < 70$ |
| 12 | $65 \le \varphi_q < 75$ | $-5 \le \theta_q \le 35$ | $50 \le \psi_q < 70$ |
| 13 | $65 \le \varphi_q < 75$ | $125 \le \theta_q \le 185$ | $50 \le \psi_q < 70$ |
| 14 | $75 \le \varphi_q < 85$ | $-5 \le \theta_q \le 25$ | $50 \le \psi_q < 70$ |
| 15 | $75 \le \varphi_q < 85$ | $115 \le \theta_q \le 185$ | $50 \le \psi_q < 70$ |
| 16 | $85 \le \varphi_q < 95$ | $95 \le \theta_q \le 175$ | $50 \le \psi_q < 70$ |
| 17 | $95 \le \varphi_q < 105$ | $75 \le \theta_q \le 155$ | $50 \le \psi_q < 70$ |
| 18 | $105 \le \varphi_q < 115$ | $65 \le \theta_q \le 145$ | $50 \le \psi_q < 70$ |
| 19 | $115 \le \varphi_q < 125$ | $65 \le \theta_q \le 135$ | $50 \le \psi_q < 70$ |
| 20 | $125 \le \varphi_q < 135$ | $55 \le \theta_q \le 135$ | $50 \le \psi_q < 70$ |
| 21 | $135 \le \varphi_q < 145$ | $45 \le \theta_q \le 115$ | $50 \le \psi_q < 70$ |
| 22 | $145 \le \varphi_q < 155$ | $45 \le \theta_q \le 85$ | $50 \le \psi_q < 70$ |
| 23 | $145 \le \varphi_q < 155$ | $165 \le \theta_q \le 175$ | $50 \le \psi_q < 70$ |

TABLE 14-continued

| CONDITION | $\varphi_q$ RANGE[°] | $\theta_q$ RANGE[°] | $\psi_q$ RANGE[°] |
|---|---|---|---|
| 24 | $155 \le \varphi_q < 165$ | $-5 \le \theta_q \le 65$ | $50 \le \psi_q < 70$ |
| 25 | $155 \le \varphi_q < 165$ | $145 \le \theta_q \le 185$ | $50 \le \psi_q < 70$ |
| 26 | $165 \le \varphi_q < 175$ | $-5 \le \theta_q \le 45$ | $50 \le \psi_q < 70$ |
| 27 | $165 \le \varphi_q < 175$ | $135 \le \theta_q \le 185$ | $50 \le \psi_q < 70$ |
| 28 | $175 \le \varphi_q < 185$ | $-5 \le \theta_q \le 35$ | $50 \le \psi_q < 70$ |
| 29 | $175 \le \varphi_q < 185$ | $125 \le \theta_q \le 185$ | $50 \le \psi_q < 70$ |

TABLE 15

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $55 \le \theta_q \le 135$ | $70 \le \psi_q < 90$ |
| 2 | $5 \le \varphi_q < 15$ | $25 \le \theta_q \le 35$ | $70 \le \psi_q < 90$ |
| 3 | $5 \le \varphi_q < 15$ | $45 \le \theta_q \le 135$ | $70 \le \psi_q < 90$ |
| 4 | $15 \le \varphi_q < 25$ | $-5 \le \theta_q \le 115$ | $70 \le \psi_q < 90$ |
| 5 | $25 \le \varphi_q < 35$ | $-5 \le \theta_q \le 65$ | $70 \le \psi_q < 90$ |
| 6 | $35 \le \varphi_q < 45$ | $-5 \le \theta_q \le 55$ | $70 \le \psi_q < 90$ |
| 7 | $45 \le \varphi_q < 55$ | $-5 \le \theta_q \le 45$ | $70 \le \psi_q < 90$ |
| 8 | $55 \le \varphi_q < 65$ | $-5 \le \theta_q \le 35$ | $70 \le \psi_q < 90$ |
| 9 | $55 \le \varphi_q < 65$ | $135 \le \theta_q \le 185$ | $70 \le \psi_q < 90$ |
| 10 | $65 \le \varphi_q < 75$ | $125 \le \theta_q \le 185$ | $70 \le \psi_q < 90$ |
| 11 | $75 \le \varphi_q < 85$ | $115 \le \theta_q \le 185$ | $70 \le \psi_q < 90$ |
| 12 | $85 \le \varphi_q < 95$ | $85 \le \theta_q \le 185$ | $70 \le \psi_q < 90$ |
| 13 | $95 \le \varphi_q < 105$ | $65 \le \theta_q \le 185$ | $70 \le \psi_q < 90$ |
| 14 | $105 \le \varphi_q < 115$ | $55 \le \theta_q \le 175$ | $70 \le \psi_q < 90$ |
| 15 | $115 \le \varphi_q < 125$ | $55 \le \theta_q \le 135$ | $70 \le \psi_q < 90$ |
| 16 | $125 \le \varphi_q < 135$ | $25 \le \theta_q \le 35$ | $70 \le \psi_q < 90$ |
| 17 | $125 \le \varphi_q < 135$ | $45 \le \theta_q \le 135$ | $70 \le \psi_q < 90$ |
| 18 | $135 \le \varphi_q < 145$ | $-5 \le \theta_q \le 115$ | $70 \le \psi_q < 90$ |
| 19 | $135 \le \varphi_q < 145$ | $125 \le \theta_q \le 135$ | $70 \le \psi_q < 90$ |
| 20 | $145 \le \varphi_q < 155$ | $-5 \le \theta_q \le 65$ | $70 \le \psi_q < 90$ |
| 21 | $155 \le \varphi_q < 165$ | $-5 \le \theta_q \le 55$ | $70 \le \psi_q < 90$ |
| 22 | $165 \le \varphi_q < 175$ | $-5 \le \theta_q \le 45$ | $70 \le \psi_q < 90$ |
| 23 | $175 \le \varphi_q < 185$ | $-5 \le \theta_q \le 35$ | $70 \le \psi_q < 90$ |
| 24 | $175 \le \varphi_q < 185$ | $135 \le \theta_q \le 185$ | $70 \le \psi_q < 90$ |

TABLE 16

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 45$ | $90 \le \psi_q < 110$ |
| 2 | $-5 \le \varphi_q < 5$ | $135 \le \theta_q \le 185$ | $90 \le \psi_q < 110$ |
| 3 | $5 \le \varphi_q < 15$ | $-5 \le \theta_q \le 45$ | $90 \le \psi_q < 110$ |
| 4 | $5 \le \varphi_q < 15$ | $165 \le \theta_q \le 175$ | $90 \le \psi_q < 110$ |
| 5 | $15 \le \varphi_q < 25$ | $-5 \le \theta_q \le 65$ | $90 \le \psi_q < 110$ |
| 6 | $25 \le \varphi_q < 35$ | $-5 \le \theta_q \le 65$ | $90 \le \psi_q < 110$ |
| 7 | $35 \le \varphi_q < 45$ | $-5 \le \theta_q \le 75$ | $90 \le \psi_q < 110$ |
| 8 | $45 \le \varphi_q < 55$ | $15 \le \theta_q \le 115$ | $90 \le \psi_q < 110$ |
| 9 | $45 \le \varphi_q < 55$ | $175 \le \theta_q \le 185$ | $90 \le \psi_q < 110$ |
| 10 | $55 \le \varphi_q < 65$ | $35 \le \theta_q \le 125$ | $90 \le \psi_q < 110$ |
| 11 | $65 \le \varphi_q < 75$ | $55 \le \theta_q \le 145$ | $90 \le \psi_q < 110$ |
| 12 | $75 \le \varphi_q < 85$ | $55 \le \theta_q \le 185$ | $90 \le \psi_q < 110$ |
| 13 | $85 \le \varphi_q < 95$ | $65 \le \theta_q \le 185$ | $90 \le \psi_q < 110$ |
| 14 | $95 \le \varphi_q < 105$ | $85 \le \theta_q \le 105$ | $90 \le \psi_q < 110$ |
| 15 | $95 \le \varphi_q < 105$ | $115 \le \theta_q \le 185$ | $90 \le \psi_q < 110$ |
| 16 | $105 \le \varphi_q < 115$ | $125 \le \theta_q \le 185$ | $90 \le \psi_q < 110$ |
| 17 | $115 \le \varphi_q < 125$ | $-5 \le \theta_q \le 45$ | $90 \le \psi_q < 110$ |
| 18 | $115 \le \varphi_q < 125$ | $135 \le \theta_q \le 185$ | $90 \le \psi_q < 110$ |
| 19 | $125 \le \varphi_q < 135$ | $-5 \le \theta_q \le 45$ | $90 \le \psi_q < 110$ |
| 20 | $125 \le \varphi_q < 135$ | $165 \le \theta_q \le 175$ | $90 \le \psi_q < 110$ |
| 21 | $135 \le \varphi_q < 145$ | $-5 \le \theta_q \le 65$ | $90 \le \psi_q < 110$ |
| 22 | $145 \le \varphi_q < 155$ | $-5 \le \theta_q \le 65$ | $90 \le \psi_q < 110$ |
| 23 | $155 \le \varphi_q < 165$ | $-5 \le \theta_q \le 75$ | $90 \le \psi_q < 110$ |
| 24 | $165 \le \varphi_q < 175$ | $15 \le \theta_q \le 115$ | $90 \le \psi_q < 110$ |
| 25 | $175 \le \varphi_q < 185$ | $35 \le \theta_q \le 125$ | $90 \le \psi_q < 110$ |

TABLE 17

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 45$ | $110 \le \psi_q < 130$ |
| 2 | $-5 \le \varphi_q < 5$ | $145 \le \theta_q \le 185$ | $110 \le \psi_q < 130$ |
| 3 | $5 \le \varphi_q < 15$ | $-5 \le \theta_q \le 55$ | $110 \le \psi_q < 130$ |
| 4 | $5 \le \varphi_q < 15$ | $145 \le \theta_q \le 185$ | $110 \le \psi_q < 130$ |
| 5 | $15 \le \varphi_q < 25$ | $-5 \le \theta_q \le 55$ | $110 \le \psi_q < 130$ |
| 6 | $15 \le \varphi_q < 25$ | $155 \le \theta_q \le 185$ | $110 \le \psi_q < 130$ |
| 7 | $25 \le \varphi_q < 35$ | $5 \le \theta_q \le 75$ | $110 \le \psi_q < 130$ |
| 8 | $35 \le \varphi_q < 45$ | $25 \le \theta_q \le 95$ | $110 \le \psi_q < 130$ |
| 9 | $45 \le \varphi_q < 55$ | $35 \le \theta_q \le 105$ | $110 \le \psi_q < 130$ |
| 10 | $55 \le \varphi_q < 65$ | $35 \le \theta_q \le 125$ | $110 \le \psi_q < 130$ |
| 11 | $65 \le \varphi_q < 75$ | $45 \le \theta_q \le 125$ | $110 \le \psi_q < 130$ |
| 12 | $75 \le \varphi_q < 85$ | $45 \le \theta_q \le 135$ | $110 \le \psi_q < 130$ |
| 13 | $85 \le \varphi_q < 95$ | $5 \le \theta_q \le 25$ | $110 \le \psi_q < 130$ |
| 14 | $85 \le \varphi_q < 95$ | $85 \le \theta_q \le 155$ | $110 \le \psi_q < 130$ |
| 15 | $95 \le \varphi_q < 105$ | $-5 \le \theta_q \le 45$ | $110 \le \psi_q < 130$ |
| 16 | $95 \le \varphi_q < 105$ | $105 \le \theta_q \le 185$ | $110 \le \psi_q < 130$ |
| 17 | $105 \le \varphi_q < 115$ | $-5 \le \theta_q \le 45$ | $110 \le \psi_q < 130$ |
| 18 | $105 \le \varphi_q < 115$ | $135 \le \theta_q \le 185$ | $110 \le \psi_q < 130$ |
| 19 | $115 \le \varphi_q < 125$ | $-5 \le \theta_q \le 45$ | $110 \le \psi_q < 130$ |
| 20 | $115 \le \varphi_q < 125$ | $145 \le \theta_q \le 185$ | $110 \le \psi_q < 130$ |
| 21 | $125 \le \varphi_q < 135$ | $-5 \le \theta_q \le 55$ | $110 \le \psi_q < 130$ |
| 22 | $125 \le \varphi_q < 135$ | $145 \le \theta_q \le 185$ | $110 \le \psi_q < 130$ |
| 23 | $135 \le \varphi_q < 145$ | $-5 \le \theta_q \le 55$ | $110 \le \psi_q < 130$ |
| 24 | $135 \le \varphi_q < 145$ | $155 \le \theta_q \le 185$ | $110 \le \psi_q < 130$ |
| 25 | $145 \le \varphi_q < 155$ | $5 \le \theta_q \le 75$ | $110 \le \psi_q < 130$ |
| 26 | $155 \le \varphi_q < 165$ | $25 \le \theta_q \le 95$ | $110 \le \psi_q < 130$ |
| 27 | $165 \le \varphi_q < 175$ | $35 \le \theta_q \le 105$ | $110 \le \psi_q < 130$ |
| 28 | $175 \le \varphi_q < 185$ | $35 \le \theta_q \le 125$ | $110 \le \psi_q < 130$ |

TABLE 18

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 65$ | $130 \le \psi_q < 150$ |
| 2 | $-5 \le \varphi_q < 5$ | $155 \le \theta_q \le 185$ | $130 \le \psi_q < 150$ |
| 3 | $5 \le \varphi_q < 15$ | $5 \le \theta_q \le 65$ | $130 \le \psi_q < 150$ |
| 4 | $5 \le \varphi_q < 15$ | $145 \le \theta_q \le 185$ | $130 \le \psi_q < 150$ |
| 5 | $15 \le \varphi_q < 25$ | $15 \le \theta_q \le 75$ | $130 \le \psi_q < 150$ |
| 6 | $15 \le \varphi_q < 25$ | $145 \le \theta_q \le 185$ | $130 \le \psi_q < 150$ |
| 7 | $25 \le \varphi_q < 35$ | $25 \le \theta_q \le 85$ | $130 \le \psi_q < 150$ |
| 8 | $25 \le \varphi_q < 35$ | $155 \le \theta_q \le 185$ | $130 \le \psi_q < 150$ |
| 9 | $35 \le \varphi_q < 45$ | $25 \le \theta_q \le 95$ | $130 \le \psi_q < 150$ |
| 10 | $35 \le \varphi_q < 45$ | $165 \le \theta_q \le 185$ | $130 \le \psi_q < 150$ |
| 11 | $45 \le \varphi_q < 55$ | $35 \le \theta_q \le 95$ | $130 \le \psi_q < 150$ |
| 12 | $55 \le \varphi_q < 65$ | $25 \le \theta_q \le 105$ | $130 \le \psi_q < 150$ |
| 13 | $65 \le \varphi_q < 75$ | $5 \le \theta_q \le 65$ | $130 \le \psi_q < 150$ |
| 14 | $65 \le \varphi_q < 75$ | $85 \le \theta_q \le 115$ | $130 \le \psi_q < 150$ |
| 15 | $75 \le \varphi_q < 85$ | $-5 \le \theta_q \le 55$ | $130 \le \psi_q < 150$ |
| 16 | $75 \le \varphi_q < 85$ | $75 \le \theta_q \le 85$ | $130 \le \psi_q < 150$ |
| 17 | $75 \le \varphi_q < 85$ | $105 \le \theta_q \le 125$ | $130 \le \psi_q < 150$ |
| 18 | $85 \le \varphi_q < 95$ | $-5 \le \theta_q \le 55$ | $130 \le \psi_q < 150$ |
| 19 | $85 \le \varphi_q < 95$ | $105 \le \theta_q \le 115$ | $130 \le \psi_q < 150$ |
| 20 | $95 \le \varphi_q < 105$ | $-5 \le \theta_q \le 45$ | $130 \le \psi_q < 150$ |
| 21 | $105 \le \varphi_q < 115$ | $-5 \le \theta_q \le 55$ | $130 \le \psi_q < 150$ |
| 22 | $115 \le \varphi_q < 125$ | $-5 \le \theta_q \le 65$ | $130 \le \psi_q < 150$ |
| 23 | $115 \le \varphi_q < 125$ | $155 \le \theta_q \le 185$ | $130 \le \psi_q < 150$ |
| 24 | $125 \le \varphi_q < 135$ | $5 \le \theta_q \le 65$ | $130 \le \psi_q < 150$ |
| 25 | $125 \le \varphi_q < 135$ | $145 \le \theta_q \le 185$ | $130 \le \psi_q < 150$ |
| 26 | $135 \le \varphi_q < 145$ | $15 \le \theta_q \le 75$ | $130 \le \psi_q < 150$ |
| 27 | $135 \le \varphi_q < 145$ | $145 \le \theta_q \le 185$ | $130 \le \psi_q < 150$ |
| 28 | $145 \le \varphi_q < 155$ | $25 \le \theta_q \le 85$ | $130 \le \psi_q < 150$ |
| 29 | $145 \le \varphi_q < 155$ | $155 \le \theta_q \le 185$ | $130 \le \psi_q < 150$ |
| 30 | $155 \le \varphi_q < 165$ | $25 \le \theta_q \le 95$ | $130 \le \psi_q < 150$ |
| 31 | $155 \le \varphi_q < 165$ | $165 \le \theta_q \le 185$ | $130 \le \psi_q < 150$ |
| 32 | $165 \le \varphi_q < 175$ | $35 \le \theta_q \le 95$ | $130 \le \psi_q < 150$ |
| 33 | $175 \le \varphi_q < 185$ | $25 \le \theta_q \le 105$ | $130 \le \psi_q < 150$ |

TABLE 19

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $15 \le \theta_q \le 85$ | $150 \le \psi_q < 170$ |
| 2 | $5 \le \varphi_q < 15$ | $25 \le \theta_q \le 85$ | $150 \le \psi_q < 170$ |
| 3 | $15 \le \varphi_q < 25$ | $25 \le \theta_q \le 85$ | $150 \le \psi_q < 170$ |
| 4 | $15 \le \varphi_q < 25$ | $165 \le \theta_q \le 185$ | $150 \le \psi_q < 170$ |
| 5 | $25 \le \varphi_q < 35$ | $25 \le \theta_q \le 85$ | $150 \le \psi_q < 170$ |
| 6 | $25 \le \varphi_q < 35$ | $155 \le \theta_q \le 185$ | $150 \le \psi_q < 170$ |
| 7 | $35 \le \varphi_q < 45$ | $25 \le \theta_q \le 85$ | $150 \le \psi_q < 170$ |
| 8 | $35 \le \varphi_q < 45$ | $155 \le \theta_q \le 185$ | $150 \le \psi_q < 170$ |
| 9 | $45 \le \varphi_q < 55$ | $5 \le \theta_q \le 85$ | $150 \le \psi_q < 170$ |
| 10 | $45 \le \varphi_q < 55$ | $155 \le \theta_q \le 185$ | $150 \le \psi_q < 170$ |
| 11 | $55 \le \varphi_q < 65$ | $-5 \le \theta_q \le 85$ | $150 \le \psi_q < 170$ |
| 12 | $55 \le \varphi_q < 65$ | $165 \le \theta_q \le 185$ | $150 \le \psi_q < 170$ |
| 13 | $65 \le \varphi_q < 75$ | $-5 \le \theta_q \le 85$ | $150 \le \psi_q < 170$ |
| 14 | $75 \le \varphi_q < 85$ | $-5 \le \theta_q \le 75$ | $150 \le \psi_q < 170$ |
| 15 | $85 \le \varphi_q < 95$ | $-5 \le \theta_q \le 65$ | $150 \le \psi_q < 170$ |
| 16 | $95 \le \varphi_q < 105$ | $-5 \le \theta_q \le 75$ | $150 \le \psi_q < 170$ |
| 17 | $105 \le \varphi_q < 115$ | $5 \le \theta_q \le 75$ | $150 \le \psi_q < 170$ |
| 18 | $115 \le \varphi_q < 125$ | $15 \le \theta_q \le 85$ | $150 \le \psi_q < 170$ |
| 19 | $125 \le \varphi_q < 135$ | $25 \le \theta_q \le 85$ | $150 \le \psi_q < 170$ |
| 20 | $135 \le \varphi_q < 145$ | $25 \le \theta_q \le 85$ | $150 \le \psi_q < 170$ |
| 21 | $135 \le \varphi_q < 145$ | $165 \le \theta_q \le 185$ | $150 \le \psi_q < 170$ |
| 22 | $145 \le \varphi_q < 155$ | $25 \le \theta_q \le 85$ | $150 \le \psi_q < 170$ |
| 23 | $145 \le \varphi_q < 155$ | $155 \le \theta_q \le 185$ | $150 \le \psi_q < 170$ |
| 24 | $155 \le \varphi_q < 165$ | $25 \le \theta_q \le 85$ | $150 \le \psi_q < 170$ |
| 25 | $155 \le \varphi_q < 165$ | $155 \le \theta_q \le 185$ | $150 \le \psi_q < 170$ |
| 26 | $165 \le \varphi_q < 175$ | $5 \le \theta_q \le 85$ | $150 \le \psi_q < 170$ |
| 27 | $165 \le \varphi_q < 175$ | $155 \le \theta_q \le 185$ | $150 \le \psi_q < 170$ |
| 28 | $175 \le \varphi_q < 185$ | $-5 \le \theta_q \le 85$ | $150 \le \psi_q < 170$ |
| 29 | $175 \le \varphi_q < 185$ | $165 \le \theta_q \le 185$ | $150 \le \psi_q < 170$ |

TABLE 20

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $25 \le \theta_q \le 85$ | $170 \le \psi_q \le 190$ |
| 2 | $5 \le \varphi_q < 15$ | $25 \le \theta_q \le 85$ | $170 \le \psi_q \le 190$ |
| 3 | $15 \le \varphi_q < 25$ | $15 \le \theta_q \le 85$ | $170 \le \psi_q \le 190$ |
| 4 | $25 \le \varphi_q < 35$ | $5 \le \theta_q \le 85$ | $170 \le \psi_q \le 190$ |
| 5 | $35 \le \varphi_q < 45$ | $-5 \le \theta_q \le 85$ | $170 \le \psi_q \le 190$ |
| 6 | $35 \le \varphi_q < 45$ | $165 \le \theta_q \le 185$ | $170 \le \psi_q \le 190$ |
| 7 | $45 \le \varphi_q < 55$ | $-5 \le \theta_q \le 75$ | $170 \le \psi_q \le 190$ |
| 8 | $45 \le \varphi_q < 55$ | $155 \le \theta_q \le 185$ | $170 \le \psi_q \le 190$ |
| 9 | $55 \le \varphi_q < 65$ | $-5 \le \theta_q \le 75$ | $170 \le \psi_q \le 190$ |
| 10 | $55 \le \varphi_q < 65$ | $155 \le \theta_q \le 185$ | $170 \le \psi_q \le 190$ |
| 11 | $65 \le \varphi_q < 75$ | $-5 \le \theta_q \le 85$ | $170 \le \psi_q \le 190$ |
| 12 | $65 \le \varphi_q < 75$ | $155 \le \theta_q \le 185$ | $170 \le \psi_q \le 190$ |
| 13 | $75 \le \varphi_q < 85$ | $-5 \le \theta_q \le 85$ | $170 \le \psi_q \le 190$ |
| 14 | $75 \le \varphi_q < 85$ | $165 \le \theta_q \le 185$ | $170 \le \psi_q \le 190$ |
| 15 | $85 \le \varphi_q < 95$ | $5 \le \theta_q \le 85$ | $170 \le \psi_q \le 190$ |
| 16 | $95 \le \varphi_q < 105$ | $15 \le \theta_q \le 85$ | $170 \le \psi_q \le 190$ |
| 17 | $105 \le \varphi_q < 115$ | $25 \le \theta_q \le 45$ | $170 \le \psi_q \le 190$ |
| 18 | $105 \le \varphi_q < 115$ | $55 \le \theta_q \le 85$ | $170 \le \psi_q \le 190$ |
| 19 | $115 \le \varphi_q < 125$ | $25 \le \theta_q \le 85$ | $170 \le \psi_q \le 190$ |
| 20 | $125 \le \varphi_q < 135$ | $25 \le \theta_q \le 85$ | $170 \le \psi_q \le 190$ |
| 21 | $135 \le \varphi_q < 145$ | $15 \le \theta_q \le 85$ | $170 \le \psi_q \le 190$ |
| 22 | $145 \le \varphi_q < 155$ | $5 \le \theta_q \le 85$ | $170 \le \psi_q \le 190$ |
| 23 | $155 \le \varphi_q < 165$ | $-5 \le \theta_q \le 85$ | $170 \le \psi_q \le 190$ |
| 24 | $155 \le \varphi_q < 165$ | $165 \le \theta_q \le 185$ | $170 \le \psi_q \le 190$ |
| 25 | $165 \le \varphi_q < 175$ | $-5 \le \theta_q \le 75$ | $170 \le \psi_q \le 190$ |
| 26 | $165 \le \varphi_q < 175$ | $155 \le \theta_q \le 185$ | $170 \le \psi_q \le 190$ |
| 27 | $175 \le \varphi_q < 185$ | $-5 \le \theta_q \le 75$ | $170 \le \psi_q \le 190$ |
| 28 | $175 \le \varphi_q < 185$ | $155 \le \theta_q \le 185$ | $170 \le \psi_q \le 190.$ |

5. The acoustic wave device according to claim 1, wherein the cut angle of the lithium tantalate of the piezoelectric layer is about 20° Y or more and less than about 40° Y;

the silicon oxide layer having crystallinity is a monocrystalline quartz-crystal layer; and when $(\phi_q, \theta_q, \psi_q)$ represent azimuthal angles of the monocrystalline quartz-crystal layer, the angles $\phi_q$, $\theta_q$, and $\psi_q$ are in any one of combinations in Tables 1 to 10:

TABLE 1

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $15 \le \theta_q \le 35$ | $-10 \le \psi_q < 10$ |
| 2 | $-5 \le \varphi_q < 5$ | $75 \le \theta_q \le 135$ | $-10 \le \psi_q < 10$ |
| 3 | $5 \le \varphi_q < 15$ | $5 \le \theta_q \le 35$ | $-10 \le \psi_q < 10$ |
| 4 | $5 \le \varphi_q < 15$ | $65 \le \theta_q \le 115$ | $-10 \le \psi_q < 10$ |
| 5 | $15 \le \varphi_q < 25$ | $5 \le \theta_q \le 35$ | $-10 \le \psi_q < 10$ |
| 6 | $15 \le \varphi_q < 25$ | $65 \le \theta_q \le 105$ | $-10 \le \psi_q < 10$ |
| 7 | $15 \le \varphi_q < 25$ | $175 \le \theta_q \le 185$ | $-10 \le \psi_q < 10$ |
| 8 | $25 \le \varphi_q < 35$ | $-5 \le \theta_q \le 105$ | $-10 \le \psi_q < 10$ |
| 9 | $25 \le \varphi_q < 35$ | $155 \le \theta_q \le 185$ | $-10 \le \psi_q < 10$ |
| 10 | $35 \le \varphi_q < 45$ | $-5 \le \theta_q \le 105$ | $-10 \le \psi_q < 10$ |
| 11 | $35 \le \varphi_q < 45$ | $155 \le \theta_q \le 185$ | $-10 \le \psi_q < 10$ |
| 12 | $45 \le \varphi_q < 55$ | $25 \le \theta_q \le 95$ | $-10 \le \psi_q < 10$ |
| 13 | $45 \le \varphi_q < 55$ | $145 \le \theta_q \le 175$ | $-10 \le \psi_q < 10$ |
| 14 | $55 \le \varphi_q < 65$ | $25 \le \theta_q \le 95$ | $-10 \le \psi_q < 10$ |
| 15 | $55 \le \varphi_q < 65$ | $145 \le \theta_q \le 175$ | $-10 \le \psi_q < 10$ |
| 16 | $65 \le \varphi_q < 75$ | $25 \le \theta_q \le 95$ | $-10 \le \psi_q < 10$ |
| 17 | $65 \le \varphi_q < 75$ | $145 \le \theta_q \le 175$ | $-10 \le \psi_q < 10$ |
| 18 | $75 \le \varphi_q < 85$ | $-5 \le \theta_q \le 95$ | $-10 \le \psi_q < 10$ |
| 19 | $75 \le \varphi_q < 85$ | $155 \le \theta_q \le 185$ | $-10 \le \psi_q < 10$ |
| 20 | $85 \le \varphi_q < 95$ | $-5 \le \theta_q \le 45$ | $-10 \le \psi_q < 10$ |
| 21 | $85 \le \varphi_q < 95$ | $55 \le \theta_q \le 105$ | $-10 \le \psi_q < 10$ |
| 22 | $85 \le \varphi_q < 95$ | $155 \le \theta_q \le 185$ | $-10 \le \psi_q < 10$ |
| 23 | $95 \le \varphi_q < 105$ | $-5 \le \theta_q \le 35$ | $-10 \le \psi_q < 10$ |
| 24 | $95 \le \varphi_q < 105$ | $65 \le \theta_q \le 115$ | $-10 \le \psi_q < 10$ |
| 25 | $105 \le \varphi_q < 115$ | $15 \le \theta_q \le 35$ | $-10 \le \psi_q < 10$ |
| 26 | $105 \le \varphi_q < 115$ | $75 \le \theta_q \le 125$ | $-10 \le \psi_q < 10$ |
| 27 | $115 \le \varphi_q < 125$ | $15 \le \theta_q \le 35$ | $-10 \le \psi_q < 10$ |
| 28 | $115 \le \varphi_q < 125$ | $75 \le \theta_q \le 135$ | $-10 \le \psi_q < 10$ |
| 29 | $125 \le \varphi_q < 135$ | $5 \le \theta_q \le 35$ | $-10 \le \psi_q < 10$ |
| 30 | $125 \le \varphi_q < 135$ | $65 \le \theta_q \le 115$ | $-10 \le \psi_q < 10$ |
| 31 | $135 \le \varphi_q < 145$ | $5 \le \theta_q \le 35$ | $-10 \le \psi_q < 10$ |
| 32 | $135 \le \varphi_q < 145$ | $65 \le \theta_q \le 105$ | $-10 \le \psi_q < 10$ |
| 33 | $135 \le \varphi_q < 145$ | $175 \le \theta_q \le 185$ | $-10 \le \psi_q < 10$ |
| 34 | $145 \le \varphi_q < 155$ | $-5 \le \theta_q \le 105$ | $-10 \le \psi_q < 10$ |
| 35 | $145 \le \varphi_q < 155$ | $155 \le \theta_q \le 185$ | $-10 \le \psi_q < 10$ |
| 36 | $155 \le \varphi_q < 165$ | $-5 \le \theta_q \le 105$ | $-10 \le \psi_q < 10$ |
| 37 | $155 \le \varphi_q < 165$ | $155 \le \theta_q \le 185$ | $-10 \le \psi_q < 10$ |
| 38 | $165 \le \varphi_q < 175$ | $25 \le \theta_q \le 95$ | $-10 \le \psi_q < 10$ |
| 39 | $165 \le \varphi_q < 175$ | $145 \le \theta_q \le 175$ | $-10 \le \psi_q < 10$ |
| 40 | $175 \le \varphi_q < 185$ | $25 \le \theta_q \le 95$ | $-10 \le \psi_q < 10$ |
| 41 | $175 \le \varphi_q < 185$ | $145 \le \theta_q \le 175$ | $-10 \le \psi_q < 10$ |

TABLE 2

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $5 \le \theta_q \le 35$ | $10 \le \psi_q < 30$ |
| 2 | $-5 \le \varphi_q < 5$ | $65 \le \theta_q \le 145$ | $10 \le \psi_q < 30$ |
| 3 | $5 \le \varphi_q < 15$ | $-5 \le \theta_q \le 145$ | $10 \le \psi_q < 30$ |
| 4 | $15 \le \varphi_q < 25$ | $-5 \le \theta_q \le 135$ | $10 \le \psi_q < 30$ |
| 5 | $25 \le \varphi_q < 35$ | $25 \le \theta_q \le 135$ | $10 \le \psi_q < 30$ |
| 6 | $35 \le \varphi_q < 45$ | $25 \le \theta_q \le 125$ | $10 \le \psi_q < 30$ |
| 7 | $35 \le \varphi_q < 45$ | $175 \le \theta_q \le 185$ | $10 \le \psi_q < 30$ |
| 8 | $45 \le \varphi_q < 55$ | $25 \le \theta_q \le 105$ | $10 \le \psi_q < 30$ |
| 9 | $45 \le \varphi_q < 55$ | $165 \le \theta_q \le 185$ | $10 \le \psi_q < 30$ |
| 10 | $55 \le \varphi_q < 65$ | $-5 \le \theta_q \le 105$ | $10 \le \psi_q < 30$ |
| 11 | $55 \le \varphi_q < 65$ | $155 \le \theta_q \le 185$ | $10 \le \psi_q < 30$ |
| 12 | $65 \le \varphi_q < 75$ | $-5 \le \theta_q \le 105$ | $10 \le \psi_q < 30$ |
| 13 | $65 \le \varphi_q < 75$ | $145 \le \theta_q \le 175$ | $10 \le \psi_q < 30$ |
| 14 | $75 \le \varphi_q < 85$ | $-5 \le \theta_q \le 45$ | $10 \le \psi_q < 30$ |
| 15 | $75 \le \varphi_q < 85$ | $75 \le \theta_q \le 95$ | $10 \le \psi_q < 30$ |
| 16 | $75 \le \varphi_q < 85$ | $145 \le \theta_q \le 165$ | $10 \le \psi_q < 30$ |
| 17 | $85 \le \varphi_q < 95$ | $15 \le \theta_q \le 35$ | $10 \le \psi_q < 30$ |
| 18 | $85 \le \varphi_q < 95$ | $75 \le \theta_q \le 95$ | $10 \le \psi_q < 30$ |
| 19 | $85 \le \varphi_q < 95$ | $145 \le \theta_q \le 175$ | $10 \le \psi_q < 30$ |
| 20 | $95 \le \varphi_q < 105$ | $15 \le \theta_q \le 35$ | $10 \le \psi_q < 30$ |
| 21 | $95 \le \varphi_q < 105$ | $65 \le \theta_q \le 95$ | $10 \le \psi_q < 30$ |
| 22 | $95 \le \varphi_q < 105$ | $145 \le \theta_q \le 185$ | $10 \le \psi_q < 30$ |
| 23 | $105 \le \varphi_q < 115$ | $15 \le \theta_q \le 35$ | $10 \le \psi_q < 30$ |
| 24 | $105 \le \varphi_q < 115$ | $65 \le \theta_q \le 95$ | $10 \le \psi_q < 30$ |
| 25 | $105 \le \varphi_q < 115$ | $145 \le \theta_q \le 185$ | $10 \le \psi_q < 30$ |
| 26 | $115 \le \varphi_q < 125$ | $5 \le \theta_q \le 35$ | $10 \le \psi_q < 30$ |
| 27 | $115 \le \varphi_q < 125$ | $65 \le \theta_q \le 145$ | $10 \le \psi_q < 30$ |

TABLE 2-continued

| CONDITION | $\varphi_q$ RANGE[°] | $\theta_q$ RANGE[°] | $\psi_q$ RANGE[°] |
|---|---|---|---|
| 28 | $125 \le \varphi_q < 135$ | $-5 \le \theta_q \le 145$ | $10 \le \psi_q < 30$ |
| 29 | $135 \le \varphi_q < 145$ | $-5 \le \theta_q \le 135$ | $10 \le \psi_q < 30$ |
| 30 | $145 \le \varphi_q < 155$ | $25 \le \theta_q \le 135$ | $10 \le \psi_q < 30$ |
| 31 | $155 \le \varphi_q < 165$ | $25 \le \theta_q \le 115$ | $10 \le \psi_q < 30$ |
| 32 | $155 \le \varphi_q < 165$ | $175 \le \theta_q \le 185$ | $10 \le \psi_q < 30$ |
| 33 | $165 \le \varphi_q < 175$ | $25 \le \theta_q \le 105$ | $10 \le \psi_q < 30$ |
| 34 | $165 \le \varphi_q < 175$ | $165 \le \theta_q \le 185$ | $10 \le \psi_q < 30$ |
| 35 | $175 \le \varphi_q < 185$ | $-5 \le \theta_q \le 105$ | $10 \le \psi_q < 30$ |
| 36 | $175 \le \varphi_q < 185$ | $155 \le \theta_q \le 185$ | $10 \le \psi_q < 30$ |

TABLE 3

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 85$ | $30 \le \psi_q < 50$ |
| 2 | $-5 \le \varphi_q < 5$ | $125 \le \theta_q \le 185$ | $30 \le \psi_q < 50$ |
| 3 | $5 \le \varphi_q < 15$ | $25 \le \theta_q \le 75$ | $30 \le \psi_q < 50$ |
| 4 | $5 \le \varphi_q < 15$ | $125 \le \theta_q \le 185$ | $30 \le \psi_q < 50$ |
| 5 | $15 \le \varphi_q < 25$ | $25 \le \theta_q \le 55$ | $30 \le \psi_q < 50$ |
| 6 | $15 \le \varphi_q < 25$ | $65 \le \theta_q \le 85$ | $30 \le \psi_q < 50$ |
| 7 | $15 \le \varphi_q < 25$ | $125 \le \theta_q \le 155$ | $30 \le \psi_q < 50$ |
| 8 | $25 \le \varphi_q < 35$ | $15 \le \theta_q \le 55$ | $30 \le \psi_q < 50$ |
| 9 | $25 \le \varphi_q < 35$ | $115 \le \theta_q \le 145$ | $30 \le \psi_q < 50$ |
| 10 | $35 \le \varphi_q < 45$ | $-5 \le \theta_q \le 45$ | $30 \le \psi_q < 50$ |
| 11 | $35 \le \varphi_q < 45$ | $75 \le \theta_q \le 145$ | $30 \le \psi_q < 50$ |
| 12 | $45 \le \varphi_q < 55$ | $-5 \le \theta_q \le 65$ | $30 \le \psi_q < 50$ |
| 13 | $45 \le \varphi_q < 55$ | $75 \le \theta_q \le 135$ | $30 \le \psi_q < 50$ |
| 14 | $55 \le \varphi_q < 65$ | $-5 \le \theta_q \le 65$ | $30 \le \psi_q < 50$ |
| 15 | $55 \le \varphi_q < 65$ | $85 \le \theta_q \le 135$ | $30 \le \psi_q < 50$ |
| 16 | $55 \le \varphi_q < 65$ | $175 \le \theta_q \le 185$ | $30 \le \psi_q < 50$ |
| 17 | $65\,2 \le \varphi_q < 75$ | $15 \le \theta_q \le 45$ | $30 \le \psi_q < 50$ |
| 18 | $65\,2 \le \varphi_q < 75$ | $75 \le \theta_q \le 115$ | $30 \le \psi_q < 50$ |
| 19 | $65\,2 \le \varphi_q < 75$ | $155 \le \theta_q \le 185$ | $30 \le \psi_q < 50$ |
| 20 | $75\,2 \le \varphi_q < 85$ | $15 \le \theta_q \le 45$ | $30 \le \psi_q < 50$ |
| 21 | $75\,2 \le \varphi_q < 85$ | $75 \le \theta_q \le 105$ | $30 \le \psi_q < 50$ |
| 22 | $75\,2 \le \varphi_q < 85$ | $145 \le \theta_q \le 185$ | $30 \le \psi_q < 50$ |
| 23 | $85\,2 \le \varphi_q < 95$ | $15 \le \theta_q \le 45$ | $30 \le \psi_q < 50$ |
| 24 | $85 \le \varphi_q < 95$ | $55 \le \theta_q \le 95$ | $30 \le \psi_q < 50$ |
| 25 | $85 \le \varphi_q < 95$ | $145 \le \theta_q \le 165$ | $30 \le \psi_q < 50$ |
| 26 | $95 \le \varphi_q < 105$ | $5 \le \theta_q \le 95$ | $30 \le \psi_q < 50$ |
| 27 | $95 \le \varphi_q < 105$ | $145 \le \theta_q \le 165$ | $30 \le \psi_q < 50$ |
| 28 | $105 \le \varphi_q < 115$ | $-5 \le \theta_q \le 85$ | $30 \le \psi_q < 50$ |
| 29 | $105 \le \varphi_q < 115$ | $135 \le \theta_q \le 175$ | $30 \le \psi_q < 50$ |
| 30 | $115 \le \varphi_q < 125$ | $-5 \le \theta_q \le 85$ | $30 \le \psi_q < 50$ |
| 31 | $115 \le \varphi_q < 125$ | $125 \le \theta_q \le 185$ | $30 \le \psi_q < 50$ |
| 32 | $125 \le \varphi_q < 135$ | $25 \le \theta_q \le 75$ | $30 \le \psi_q < 50$ |
| 33 | $125 \le \varphi_q < 135$ | $125 \le \theta_q \le 185$ | $30 \le \psi_q < 50$ |
| 34 | $135 \le \varphi_q < 145$ | $25 \le \theta_q \le 55$ | $30 \le \psi_q < 50$ |
| 35 | $135 \le \varphi_q < 145$ | $65 \le \theta_q \le 85$ | $30 \le \psi_q < 50$ |
| 36 | $135 \le \varphi_q < 145$ | $125 \le \theta_q \le 155$ | $30 \le \psi_q < 50$ |
| 37 | $145 \le \varphi_q < 155$ | $15 \le \theta_q \le 55$ | $30 \le \psi_q < 50$ |
| 38 | $145 \le \varphi_q < 155$ | $65 \le \theta_q \le 75$ | $30 \le \psi_q < 50$ |
| 39 | $145 \le \varphi_q < 155$ | $115 \le \theta_q \le 145$ | $30 \le \psi_q < 50$ |
| 40 | $155 \le \varphi_q < 165$ | $-5 \le \theta_q \le 45$ | $30 \le \psi_q < 50$ |
| 41 | $155 \le \varphi_q < 165$ | $75 \le \theta_q \le 145$ | $30 \le \psi_q < 50$ |
| 42 | $165 \le \varphi_q < 175$ | $-5 \le \theta_q \le 65$ | $30 \le \psi_q < 50$ |
| 43 | $165 \le \varphi_q < 175$ | $75 \le \theta_q \le 135$ | $30 \le \psi_q < 50$ |
| 44 | $175 \le \varphi_q < 185$ | $-5 \le \theta_q \le 65$ | $30 \le \psi_q < 50$ |
| 45 | $175 \le \varphi_q < 185$ | $85 \le \theta_q \le 135$ | $30 \le \psi_q < 50$ |
| 46 | $175 \le \varphi_q < 185$ | $175 \le \theta_q \le 185$ | $30 \le \psi_q < 50$ |

TABLE 4

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $25 \le \theta_q \le 65$ | $50 \le \psi_q < 70$ |
| 2 | $-5 \le \varphi_q < 5$ | $125 \le \theta_q \le 165$ | $50 \le \psi_q < 70$ |
| 3 | $5 \le \varphi_q < 15$ | $15 \le \theta_q \le 65$ | $50 \le \psi_q < 70$ |
| 4 | $5 \le \varphi_q < 15$ | $105 \le \theta_q \le 165$ | $50 \le \psi_q < 70$ |
| 5 | $15 \le \varphi_q < 25$ | $-5 \le \theta_q \le 65$ | $50 \le \psi_q < 70$ |

TABLE 4-continued

| CONDITION | $\varphi_q$ RANGE[°] | $\theta_q$ RANGE[°] | $\psi_q$ RANGE[°] |
|---|---|---|---|
| 6 | $15 \le \varphi_q < 25$ | $75 \le \theta_q \le 185$ | $50 \le \psi_q < 70$ |
| 7 | $25 \le \varphi_q < 35$ | $-5 \le \theta_q \le 185$ | $50 \le \psi_q < 70$ |
| 8 | $35 \le \varphi_q < 45$ | $-5 \le \theta_q \le 175$ | $50 \le \psi_q < 70$ |
| 9 | $45 \le \varphi_q < 55$ | $25 \le \theta_q \le 85$ | $50 \le \psi_q < 70$ |
| 10 | $45 \le \varphi_q < 55$ | $95 \le \theta_q \le 145$ | $50 \le \psi_q < 70$ |
| 11 | $55 \le \varphi_q < 65$ | $25 \le \theta_q \le 65$ | $50 \le \psi_q < 70$ |
| 12 | $55 \le \varphi_q < 65$ | $75 \le \theta_q \le 145$ | $50 \le \psi_q < 70$ |
| 13 | $65 \le \varphi_q < 75$ | $15 \le \theta_q \le 135$ | $50 \le \psi_q < 70$ |
| 14 | $75 \le \varphi_q < 85$ | $5 \le \theta_q \le 125$ | $50 \le \psi_q < 70$ |
| 15 | $75 \le \varphi_q < 85$ | $175 \le \theta_q \le 185$ | $50 \le \psi_q < 70$ |
| 16 | $85 \le \varphi_q < 95$ | $-5 \le \theta_q \le 105$ | $50 \le \psi_q < 70$ |
| 17 | $85 \le \varphi_q < 95$ | $145 \le \theta_q \le 185$ | $50 \le \psi_q < 70$ |
| 18 | $95 \le \varphi_q < 105$ | $-5 \le \theta_q \le 85$ | $50 \le \psi_q < 70$ |
| 19 | $95 \le \varphi_q < 105$ | $135 \le \theta_q \le 185$ | $50 \le \psi_q < 70$ |
| 20 | $105 \le \varphi_q < 115$ | $25 \le \theta_q \le 75$ | $50 \le \psi_q < 70$ |
| 21 | $105 \le \varphi_q < 115$ | $125 \le \theta_q \le 165$ | $50 \le \psi_q < 70$ |
| 22 | $115 \le \varphi_q < 125$ | $25 \le \theta_q \le 65$ | $50 \le \psi_q < 70$ |
| 23 | $115 \le \varphi_q < 125$ | $125 \le \theta_q \le 165$ | $50 \le \psi_q < 70$ |
| 24 | $125 \le \varphi_q < 135$ | $15 \le \theta_q \le 65$ | $50 \le \psi_q < 70$ |
| 25 | $125 \le \varphi_q < 135$ | $105 \le \theta_q \le 165$ | $50 \le \psi_q < 70$ |
| 26 | $135 \le \varphi_q < 145$ | $-5 \le \theta_q \le 65$ | $50 \le \psi_q < 70$ |
| 27 | $135 \le \varphi_q < 145$ | $75 \le \theta_q \le 185$ | $50 \le \psi_q < 70$ |
| 28 | $145 \le \varphi_q < 155$ | $-5 \le \theta_q \le 185$ | $50 \le \psi_q < 70$ |
| 29 | $155 \le \varphi_q < 165$ | $-5 \le \theta_q \le 175$ | $50 \le \psi_q < 70$ |
| 30 | $165 \le \varphi_q < 175$ | $25 \le \theta_q \le 85$ | $50 \le \psi_q < 70$ |
| 31 | $165 \le \varphi_q < 175$ | $95 \le \theta_q \le 145$ | $50 \le \psi_q < 70$ |
| 32 | $175 \le \varphi_q < 185$ | $25 \le \theta_q \le 145$ | $50 \le \psi_q < 70$ |

TABLE 5

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 95$ | $70 \le \psi_q < 90$ |
| 2 | $-5 \le \varphi_q < 5$ | $105 \le \theta_q \le 185$ | $70 \le \psi_q < 90$ |
| 3 | $5 \le \varphi_q < 15$ | $-5 \le \theta_q \le 165$ | $70 \le \psi_q < 90$ |
| 4 | $15 \le \varphi_q < 25$ | $-5 \le \theta_q \le 155$ | $70 \le \psi_q < 90$ |
| 5 | $25 \le \varphi_q < 35$ | $35 \le \theta_q \le 165$ | $70 \le \psi_q < 90$ |
| 6 | $35 \le \varphi_q < 45$ | $35 \le \theta_q \le 185$ | $70 \le \psi_q < 90$ |
| 7 | $45 \le \varphi_q < 55$ | $25 \le \theta_q \le 185$ | $70 \le \psi_q < 90$ |
| 8 | $55 \le \varphi_q < 65$ | $5 \le \theta_q \le 175$ | $70 \le \psi_q < 90$ |
| 9 | $65 \le \varphi_q < 75$ | $-5 \le \theta_q \le 145$ | $70 \le \psi_q < 90$ |
| 10 | $75 \le \varphi_q < 85$ | $-5 \le \theta_q \le 135$ | $70 \le \psi_q < 90$ |
| 11 | $85 \le \varphi_q < 95$ | $25 \le \theta_q \le 135$ | $70 \le \psi_q < 90$ |
| 12 | $95 \le \varphi_q < 105$ | $25 \le \theta_q \le 155$ | $70 \le \psi_q < 90$ |
| 13 | $95 \le \varphi_q < 105$ | $175 \le \theta_q \le 185$ | $70 \le \psi_q < 90$ |
| 14 | $105 \le \varphi_q < 115$ | $15 \le \theta_q \le 95$ | $70 \le \psi_q < 90$ |
| 15 | $105 \le \varphi_q < 115$ | $105 \le \theta_q \le 185$ | $70 \le \psi_q < 90$ |
| 16 | $115 \le \varphi_q < 125$ | $-5 \le \theta_q \le 95$ | $70 \le \psi_q < 90$ |
| 17 | $115 \le \varphi_q < 125$ | $105 \le \theta_q \le 185$ | $70 \le \psi_q < 90$ |
| 18 | $125 \le \varphi_q < 135$ | $-5 \le \theta_q \le 165$ | $70 \le \psi_q < 90$ |
| 19 | $135 \le \varphi_q < 145$ | $-5 \le \theta_q \le 155$ | $70 \le \psi_q < 90$ |
| 20 | $145 \le \varphi_q < 155$ | $35 \le \theta_q \le 165$ | $70 \le \psi_q < 90$ |
| 21 | $155 \le \varphi_q < 165$ | $35 \le \theta_q \le 185$ | $70 \le \psi_q < 90$ |
| 22 | $165 \le \varphi_q < 175$ | $25 \le \theta_q \le 185$ | $70 \le \psi_q < 90$ |
| 23 | $175 \le \varphi_q < 185$ | $5 \le \theta_q \le 175$ | $70 \le \psi_q < 90$ |

TABLE 6

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 5$ | $90 \le \psi_q < 110$ |
| 2 | $-5 \le \varphi_q < 5$ | $15 \le \theta_q \le 185$ | $90 \le \psi_q < 110$ |
| 3 | $5 \le \varphi_q < 15$ | $25 \le \theta_q \le 185$ | $90 \le \psi_q < 110$ |
| 4 | $15 \le \varphi_q < 25$ | $35 \le \theta_q \le 185$ | $90 \le \psi_q < 110$ |
| 5 | $25 \le \varphi_q < 35$ | $45 \le \theta_q \le 155$ | $90 \le \psi_q < 110$ |
| 6 | $35 \le \varphi_q < 45$ | $5 \le \theta_q \le 15$ | $90 \le \psi_q < 110$ |
| 7 | $35 \le \varphi_q < 45$ | $25 \le \theta_q \le 155$ | $90 \le \psi_q < 110$ |
| 8 | $45 \le \varphi_q < 55$ | $-5 \le \theta_q \le 165$ | $90 \le \psi_q < 110$ |
| 9 | $55 \le \varphi_q < 65$ | $-5 \le \theta_q \le 75$ | $90 \le \psi_q < 110$ |
| 10 | $55 \le \varphi_q < 65$ | $95 \le \theta_q \le 185$ | $90 \le \psi_q < 110$ |
| 11 | $65 \le \varphi_q < 75$ | $15 \le \theta_q \le 185$ | $90 \le \psi_q < 110$ |
| 12 | $75 \le \varphi_q < 85$ | $25 \le \theta_q \le 175$ | $90 \le \psi_q < 110$ |
| 13 | $85 \le \varphi_q < 95$ | $15 \le \theta_q \le 155$ | $90 \le \psi_q < 110$ |
| 14 | $95 \le \varphi_q < 105$ | $-5 \le \theta_q \le 145$ | $90 \le \psi_q < 110$ |
| 15 | $105 \le \varphi_q < 115$ | $-5 \le \theta_q \le 155$ | $90 \le \psi_q < 110$ |
| 16 | $115 \le \varphi_q < 125$ | $-5 \le \theta_q \le 5$ | $90 \le \psi_q < 110$ |
| 17 | $115 \le \varphi_q < 125$ | $15 \le \theta_q \le 185$ | $90 \le \psi_q < 110$ |
| 18 | $125 \le \varphi_q < 135$ | $25 \le \theta_q \le 185$ | $90 \le \psi_q < 110$ |
| 19 | $135 \le \varphi_q < 145$ | $35 \le \theta_q \le 185$ | $90 \le \psi_q < 110$ |
| 20 | $145 \le \varphi_q < 155$ | $45 \le \theta_q \le 155$ | $90 \le \psi_q < 110$ |
| 21 | $155 \le \varphi_q < 165$ | $5 \le \theta_q \le 15$ | $90 \le \psi_q < 110$ |
| 22 | $155 \le \varphi_q < 165$ | $25 \le \theta_q \le 155$ | $90 \le \psi_q < 110$ |
| 23 | $165 \le \varphi_q < 175$ | $-5 \le \theta_q \le 165$ | $90 \le \psi_q < 110$ |
| 24 | $175 \le \varphi_q \le 185$ | $-5 \le \theta_q \le 75$ | $90 \le \psi_q < 110$ |
| 25 | $175 \le \varphi_q \le 185$ | $95 \le \theta_q \le 185$ | $90 \le \psi_q < 110$ |

TABLE 7

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $35 \le \theta_q \le 95$ | $110 \le \psi_q < 130$ |
| 2 | $-5 \le \varphi_q < 5$ | $105 \le \theta_q \le 155$ | $110 \le \psi_q < 130$ |
| 3 | $5 \le \varphi_q < 15$ | $45 \le \theta_q \le 165$ | $110 \le \psi_q < 130$ |
| 4 | $15 \le \varphi_q < 25$ | $45 \le \theta_q \le 185$ | $110 \le \psi_q < 130$ |
| 5 | $25 \le \varphi_q < 35$ | $-5 \le \theta_q \le 35$ | $110 \le \psi_q < 130$ |
| 6 | $25 \le \varphi_q < 35$ | $65 \le \theta_q \le 185$ | $110 \le \psi_q < 130$ |
| 7 | $35 \le \varphi_q < 45$ | $-5 \le \theta_q \le 45$ | $110 \le \psi_q < 130$ |
| 8 | $35 \le \varphi_q < 45$ | $85 \le \theta_q \le 185$ | $110 \le \psi_q < 130$ |
| 9 | $45 \le \varphi_q < 55$ | $15 \le \theta_q \le 45$ | $110 \le \psi_q < 130$ |
| 10 | $45 \le \varphi_q < 55$ | $105 \le \theta_q \le 155$ | $110 \le \psi_q < 130$ |
| 11 | $55 \le \varphi_q < 65$ | $15 \le \theta_q \le 55$ | $110 \le \psi_q < 130$ |
| 12 | $55 \le \varphi_q < 65$ | $115 \le \theta_q \le 155$ | $110 \le \psi_q < 130$ |
| 13 | $65 \le \varphi_q < 75$ | $5 \le \theta_q \le 65$ | $110 \le \psi_q < 130$ |
| 14 | $65 \le \varphi_q < 75$ | $125 \le \theta_q \le 165$ | $110 \le \psi_q < 130$ |
| 15 | $75 \le \varphi_q < 85$ | $-5 \le \theta_q \le 75$ | $110 \le \psi_q < 130$ |
| 16 | $75 \le \varphi_q < 85$ | $125 \le \theta_q \le 185$ | $110 \le \psi_q < 130$ |
| 17 | $85 \le \varphi_q < 95$ | $-5 \le \theta_q \le 185$ | $110 \le \psi_q < 130$ |
| 18 | $95 \le \varphi_q < 105$ | $-5 \le \theta_q \le 5$ | $110 \le \psi_q < 130$ |
| 19 | $95 \le \varphi_q < 105$ | $15 \le \theta_q \le 85$ | $110 \le \psi_q < 130$ |
| 20 | $95 \le \varphi_q < 105$ | $95 \le \theta_q \le 175$ | $110 \le \psi_q < 130$ |
| 21 | $105 \le \varphi_q < 115$ | $25 \le \theta_q \le 155$ | $110 \le \psi_q < 130$ |
| 22 | $115 \le \varphi_q < 125$ | $35 \le \theta_q \le 95$ | $110 \le \psi_q < 130$ |
| 23 | $115 \le \varphi_q < 125$ | $105 \le \theta_q \le 155$ | $110 \le \psi_q < 130$ |
| 24 | $125 \le \varphi_q < 135$ | $45 \le \theta_q \le 165$ | $110 \le \psi_q < 130$ |
| 25 | $135 \le \varphi_q < 145$ | $45 \le \theta_q \le 185$ | $110 \le \psi_q < 130$ |
| 26 | $145 \le \varphi_q < 155$ | $-5 \le \theta_q \le 35$ | $110 \le \psi_q < 130$ |
| 27 | $145 \le \varphi_q < 155$ | $65 \le \theta_q \le 185$ | $110 \le \psi_q < 130$ |
| 28 | $155 \le \varphi_q < 165$ | $-5 \le \theta_q \le 45$ | $110 \le \psi_q < 130$ |
| 29 | $155 \le \varphi_q < 165$ | $85 \le \theta_q \le 185$ | $110 \le \psi_q < 130$ |
| 30 | $165 \le \varphi_q < 175$ | $15 \le \theta_q \le 45$ | $110 \le \psi_q < 130$ |
| 31 | $165 \le \varphi_q < 175$ | $105 \le \theta_q \le 155$ | $110 \le \psi_q < 130$ |
| 32 | $175 \le \varphi_q \le 185$ | $15 \le \theta_q \le 55$ | $110 \le \psi_q < 130$ |
| 33 | $175 \le \varphi_q \le 185$ | $115 \le \theta_q \le 155$ | $110 \le \psi_q < 130$ |

TABLE 8

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $45 \le \theta_q \le 105$ | $130 \le \psi_q < 150$ |
| 2 | $-5 \le \varphi_q < 5$ | $115 \le \theta_q \le 175$ | $130 \le \psi_q < 150$ |
| 3 | $5 \le \varphi_q < 15$ | $-5 \le \theta_q \le 25$ | $130 \le \psi_q < 150$ |
| 4 | $5 \le \varphi_q < 15$ | $65 \le \theta_q \le 105$ | $130 \le \psi_q < 150$ |
| 5 | $5 \le \varphi_q < 15$ | $125 \le \theta_q \le 165$ | $130 \le \psi_q < 150$ |
| 6 | $15 \le \varphi_q < 25$ | $-5 \le \theta_q \le 35$ | $130 \le \psi_q < 150$ |
| 7 | $15 \le \varphi_q < 25$ | $65 \le \theta_q \le 105$ | $130 \le \psi_q < 150$ |
| 8 | $15 \le \varphi_q < 25$ | $135 \le \theta_q \le 165$ | $130 \le \psi_q < 150$ |
| 9 | $25 \le \varphi_q < 35$ | $5 \le \theta_q \le 35$ | $130 \le \psi_q < 150$ |
| 10 | $25 \le \varphi_q < 35$ | $75 \le \theta_q \le 115$ | $130 \le \psi_q < 150$ |
| 11 | $25 \le \varphi_q < 35$ | $135 \le \theta_q \le 165$ | $130 \le \psi_q < 150$ |
| 12 | $35 \le \varphi_q < 45$ | $15 \le \theta_q \le 35$ | $130 \le \psi_q < 150$ |

TABLE 8-continued

| CONDITION | $\varphi_q$ RANGE[°] | $\theta_q$ RANGE[°] | $\psi_q$ RANGE[°] |
|---|---|---|---|
| 13 | $35 \le \varphi_q < 45$ | $85 \le \theta_q \le 125$ | $130 \le \psi_q < 150$ |
| 14 | $35 \le \varphi_q < 45$ | $145 \le \theta_q \le 185$ | $130 \le \psi_q < 150$ |
| 15 | $45 \le \varphi_q < 55$ | $5 \le \theta_q \le 45$ | $130 \le \psi_q < 150$ |
| 16 | $45 \le \varphi_q < 55$ | $95 \le \theta_q \le 185$ | $130 \le \psi_q < 150$ |
| 17 | $55 \le \varphi_q < 65$ | $-5 \le \theta_q \le 45$ | $130 \le \psi_q < 150$ |
| 18 | $55 \le \varphi_q < 65$ | $95 \le \theta_q \le 145$ | $130 \le \psi_q < 150$ |
| 19 | $55 \le \varphi_q < 65$ | $165 \le \theta_q \le 185$ | $130 \le \psi_q < 150$ |
| 20 | $65 \le \varphi_q < 75$ | $-5 \le \theta_q \le 55$ | $130 \le \psi_q < 150$ |
| 21 | $65 \le \varphi_q < 75$ | $105 \le \theta_q \le 155$ | $130 \le \psi_q < 150$ |
| 22 | $75 \le \varphi_q < 85$ | $-5 \le \theta_q \le 5$ | $130 \le \psi_q < 150$ |
| 23 | $75 \le \varphi_q < 85$ | $15 \le \theta_q \le 55$ | $130 \le \psi_q < 150$ |
| 24 | $75 \le \varphi_q < 85$ | $65 \le \theta_q \le 85$ | $130 \le \psi_q < 150$ |
| 25 | $75 \le \varphi_q < 85$ | $95 \le \theta_q \le 105$ | $130 \le \psi_q < 150$ |
| 26 | $75 \le \varphi_q < 85$ | $115 \le \theta_q \le 155$ | $130 \le \psi_q < 150$ |
| 27 | $85 \le \varphi_q < 95$ | $35 \le \theta_q \le 65$ | $130 \le \psi_q < 150$ |
| 28 | $85 \le \varphi_q < 95$ | $85 \le \theta_q \le 95$ | $130 \le \psi_q < 150$ |
| 29 | $85 \le \varphi_q < 95$ | $115 \le \theta_q \le 125$ | $130 \le \psi_q < 150$ |
| 30 | $85 \le \varphi_q < 95$ | $135 \le \theta_q \le 165$ | $130 \le \psi_q < 150$ |
| 31 | $95 \le \varphi_q < 105$ | $35 \le \theta_q \le 95$ | $130 \le \psi_q < 150$ |
| 32 | $95 \le \varphi_q < 105$ | $115 \le \theta_q \le 185$ | $130 \le \psi_q < 150$ |
| 33 | $105 \le \varphi_q < 115$ | $45 \le \theta_q \le 95$ | $130 \le \psi_q < 150$ |
| 34 | $105 \le \varphi_q < 115$ | $135 \le \theta_q \le 185$ | $130 \le \psi_q < 150$ |
| 35 | $115 \le \varphi_q < 125$ | $45 \le \theta_q \le 105$ | $130 \le \psi_q < 150$ |
| 36 | $115 \le \varphi_q < 125$ | $115 \le \theta_q \le 175$ | $130 \le \psi_q < 150$ |
| 37 | $125 \le \varphi_q < 135$ | $-5 \le \theta_q \le 25$ | $130 \le \psi_q < 150$ |
| 38 | $125 \le \varphi_q < 135$ | $65 \le \theta_q \le 105$ | $130 \le \psi_q < 150$ |
| 39 | $125 \le \varphi_q < 135$ | $125 \le \theta_q \le 165$ | $130 \le \psi_q < 150$ |
| 40 | $135 \le \varphi_q < 145$ | $-5 \le \theta_q \le 35$ | $130 \le \psi_q < 150$ |
| 41 | $135 \le \varphi_q < 145$ | $65 \le \theta_q \le 105$ | $130 \le \psi_q < 150$ |
| 42 | $135 \le \varphi_q < 145$ | $135 \le \theta_q \le 165$ | $130 \le \psi_q < 150$ |
| 43 | $145 \le \varphi_q < 155$ | $5 \le \theta_q \le 35$ | $130 \le \psi_q < 150$ |
| 44 | $145 \le \varphi_q < 155$ | $75 \le \theta_q \le 115$ | $130 \le \psi_q < 150$ |
| 45 | $145 \le \varphi_q < 155$ | $135 \le \theta_q \le 165$ | $130 \le \psi_q < 150$ |
| 46 | $155 \le \varphi_q < 165$ | $15 \le \theta_q \le 35$ | $130 \le \psi_q < 150$ |
| 47 | $155 \le \varphi_q < 165$ | $85 \le \theta_q \le 125$ | $130 \le \psi_q < 150$ |
| 48 | $155 \le \varphi_q < 165$ | $145 \le \theta_q \le 185$ | $130 \le \psi_q < 150$ |
| 49 | $165 \le \varphi_q < 175$ | $5 \le \theta_q \le 45$ | $130 \le \psi_q < 150$ |
| 50 | $165 \le \varphi_q < 175$ | $95 \le \theta_q \le 185$ | $130 \le \psi_q < 150$ |
| 51 | $175 \le \varphi_q \le 185$ | $-5 \le \theta_q \le 45$ | $130 \le \psi_q < 150$ |
| 52 | $175 \le \varphi_q \le 185$ | $95 \le \theta_q \le 145$ | $130 \le \psi_q < 150$ |
| 53 | $175 \le \varphi_q \le 185$ | $165 \le \theta_q \le 185$ | $130 \le \psi_q < 150$ |

TABLE 9

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $-5 \le \theta_q \le 35$ | $150 \le \psi_q < 170$ |
| 2 | $-5 \le \varphi_q < 5$ | $75 \le \theta_q \le 185$ | $150 \le \psi_q < 170$ |
| 3 | $5 \le \varphi_q < 15$ | $5 \le \theta_q \le 35$ | $150 \le \psi_q < 170$ |
| 4 | $5 \le \varphi_q < 15$ | $75 \le \theta_q \le 185$ | $150 \le \psi_q < 170$ |
| 5 | $15 \le \varphi_q < 25$ | $5 \le \theta_q \le 35$ | $150 \le \psi_q < 170$ |
| 6 | $15 \le \varphi_q < 25$ | $75 \le \theta_q \le 105$ | $150 \le \psi_q < 170$ |
| 7 | $15 \le \varphi_q < 25$ | $135 \le \theta_q \le 175$ | $150 \le \psi_q < 170$ |
| 8 | $25 \le \varphi_q < 35$ | $5 \le \theta_q \le 35$ | $150 \le \psi_q < 170$ |
| 9 | $25 \le \varphi_q < 35$ | $75 \le \theta_q \le 105$ | $150 \le \psi_q < 170$ |
| 10 | $25 \le \varphi_q < 35$ | $145 \le \theta_q \le 165$ | $150 \le \psi_q < 170$ |
| 11 | $35 \le \varphi_q < 45$ | $-5 \le \theta_q \le 35$ | $150 \le \psi_q < 170$ |
| 12 | $35 \le \varphi_q < 45$ | $85 \le \theta_q \le 115$ | $150 \le \psi_q < 170$ |
| 13 | $35 \le \varphi_q < 45$ | $145 \le \theta_q \le 165$ | $150 \le \psi_q < 170$ |
| 14 | $45 \le \varphi_q < 55$ | $-5 \le \theta_q \le 35$ | $150 \le \psi_q < 170$ |
| 15 | $45 \le \varphi_q < 55$ | $85 \le \theta_q \le 115$ | $150 \le \psi_q < 170$ |
| 16 | $45 \le \varphi_q < 55$ | $145 \le \theta_q \le 165$ | $150 \le \psi_q < 170$ |
| 17 | $55 \le \varphi_q < 65$ | $-5 \le \theta_q \le 5$ | $150 \le \psi_q < 170$ |
| 18 | $55 \le \varphi_q < 65$ | $65 \le \theta_q \le 115$ | $150 \le \psi_q < 170$ |
| 19 | $55 \le \varphi_q < 65$ | $145 \le \theta_q \le 185$ | $150 \le \psi_q < 170$ |
| 20 | $65 \le \varphi_q < 75$ | $45 \le \theta_q \le 125$ | $150 \le \psi_q < 170$ |
| 21 | $65 \le \varphi_q < 75$ | $155 \le \theta_q \le 185$ | $150 \le \psi_q < 170$ |
| 22 | $75 \le \varphi_q < 85$ | $45 \le \theta_q \le 145$ | $150 \le \psi_q < 170$ |
| 23 | $75 \le \varphi_q < 85$ | $155 \le \theta_q \le 185$ | $150 \le \psi_q < 170$ |
| 24 | $85 \le \varphi_q < 95$ | $45 \le \theta_q \le 155$ | $150 \le \psi_q < 170$ |
| 25 | $95 \le \varphi_q < 105$ | $65 \le \theta_q \le 155$ | $150 \le \psi_q < 170$ |
| 26 | $105 \le \varphi_q < 115$ | $-5 \le \theta_q \le 15$ | $150 \le \psi_q < 170$ |
| 27 | $105 \le \varphi_q < 115$ | $75 \le \theta_q \le 165$ | $150 \le \psi_q < 170$ |

TABLE 9-continued

| CONDITION | $\varphi_q$ RANGE[°] | $\theta_q$ RANGE[°] | $\psi_q$ RANGE[°] |
|---|---|---|---|
| 28 | $115 \le \varphi_q < 125$ | $-5 \le \theta_q \le 35$ | $150 \le \psi_q < 170$ |
| 29 | $115 \le \varphi_q < 125$ | $75 \le \theta_q \le 185$ | $150 \le \psi_q < 170$ |
| 30 | $125 \le \varphi_q < 135$ | $5 \le \theta_q \le 35$ | $150 \le \psi_q < 170$ |
| 31 | $125 \le \varphi_q < 135$ | $75 \le \theta_q \le 185$ | $150 \le \psi_q < 170$ |
| 32 | $135 \le \varphi_q < 145$ | $5 \le \theta_q \le 35$ | $150 \le \psi_q < 170$ |
| 33 | $135 \le \varphi_q < 145$ | $75 \le \theta_q \le 105$ | $150 \le \psi_q < 170$ |
| 34 | $135 \le \varphi_q < 145$ | $135 \le \theta_q \le 175$ | $150 \le \psi_q < 170$ |
| 35 | $145 \le \varphi_q < 155$ | $5 \le \theta_q \le 35$ | $150 \le \psi_q < 170$ |
| 36 | $145 \le \varphi_q < 155$ | $75 \le \theta_q \le 105$ | $150 \le \psi_q < 170$ |
| 37 | $145 \le \varphi_q < 155$ | $145 \le \theta_q \le 165$ | $150 \le \psi_q < 170$ |
| 38 | $155 \le \varphi_q < 165$ | $-5 \le \theta_q \le 35$ | $150 \le \psi_q < 170$ |
| 39 | $155 \le \varphi_q < 165$ | $85 \le \theta_q \le 115$ | $150 \le \psi_q < 170$ |
| 40 | $155 \le \varphi_q < 165$ | $145 \le \theta_q \le 165$ | $150 \le \psi_q < 170$ |
| 41 | $165 \le \varphi_q < 175$ | $-5 \le \theta_q \le 35$ | $150 \le \psi_q < 170$ |
| 42 | $165 \le \varphi_q < 175$ | $85 \le \theta_q \le 115$ | $150 \le \psi_q < 170$ |
| 43 | $165 \le \varphi_q < 175$ | $145 \le \theta_q \le 165$ | $150 \le \psi_q < 170$ |
| 44 | $175 \le \varphi_q \le 185$ | $-5 \le \theta_q \le 5$ | $150 \le \psi_q < 170$ |
| 45 | $175 \le \varphi_q \le 185$ | $55 \le \theta_q \le 115$ | $150 \le \psi_q < 170$ |
| 46 | $175 \le \varphi_q \le 185$ | $145 \le \theta_q \le 185$ | $150 \le \psi_q < 170$ |

TABLE 10

| CONDITION | $\varphi_q$ RANGE[°] | $\theta_q$ RANGE[°] | $\psi_q$ RANGE[°] |
|---|---|---|---|
| 1 | $-5 \le \varphi_q < 5$ | $5 \le \theta_q \le 35$ | $170 \le \psi_q \le 190$ |
| 2 | $-5 \le \varphi_q < 5$ | $85 \le \theta_q \le 155$ | $170 \le \psi_q \le 190$ |
| 3 | $5 \le \varphi_q < 15$ | $5 \le \theta_q \le 35$ | $170 \le \psi_q \le 190$ |
| 4 | $5 \le \varphi_q < 15$ | $85 \le \theta_q \le 155$ | $170 \le \psi_q \le 190$ |
| 5 | $15 \le \varphi_q < 25$ | $-5 \le \theta_q \le 25$ | $170 \le \psi_q \le 190$ |
| 6 | $15 \le \varphi_q < 25$ | $75 \le \theta_q \le 185$ | $170 \le \psi_q \le 190$ |
| 7 | $25 \le \varphi_q < 35$ | $-5 \le \theta_q \le 25$ | $170 \le \psi_q \le 190$ |
| 8 | $25 \le \varphi_q < 35$ | $75 \le \theta_q \le 185$ | $170 \le \psi_q \le 190$ |
| 9 | $35 \le \varphi_q < 45$ | $-5 \le \theta_q \le 5$ | $170 \le \psi_q \le 190$ |
| 10 | $35 \le \varphi_q < 45$ | $75 \le \theta_q \le 115$ | $170 \le \psi_q \le 190$ |
| 11 | $35 \le \varphi_q < 45$ | $145 \le \theta_q \le 175$ | $170 \le \psi_q \le 190$ |
| 12 | $45 \le \varphi_q < 55$ | $65 \le \theta_q \le 115$ | $170 \le \psi_q \le 190$ |
| 13 | $45 \le \varphi_q < 55$ | $145 \le \theta_q \le 175$ | $170 \le \psi_q \le 190$ |
| 14 | $55 \le \varphi_q < 65$ | $45 \le \theta_q \le 105$ | $170 \le \psi_q \le 190$ |
| 15 | $55 \le \varphi_q < 65$ | $145 \le \theta_q \le 165$ | $170 \le \psi_q \le 190$ |
| 16 | $65 \le \varphi_q < 75$ | $55 \le \theta_q \le 105$ | $170 \le \psi_q \le 190$ |
| 17 | $65 \le \varphi_q < 75$ | $145 \le \theta_q \le 165$ | $170 \le \psi_q \le 190$ |
| 18 | $75 \le \varphi_q < 85$ | $65 \le \theta_q \le 115$ | $170 \le \psi_q \le 190$ |
| 19 | $75 \le \varphi_q < 85$ | $145 \le \theta_q \le 185$ | $170 \le \psi_q \le 190$ |
| 20 | $85 \le \varphi_q < 95$ | $-5 \le \theta_q \le 25$ | $170 \le \psi_q \le 190$ |
| 21 | $85 \le \varphi_q < 95$ | $75 \le \theta_q \le 125$ | $170 \le \psi_q \le 190$ |
| 22 | $85 \le \varphi_q < 95$ | $135 \le \theta_q \le 185$ | $170 \le \psi_q \le 190$ |
| 23 | $105 \le \varphi_q \le 115$ | $5 \le \theta_q \le 35$ | $170 \le \psi_q \le 190.$ |

6. The acoustic wave device according to claim 1, further comprising an intermediate layer between the support substrate and the silicon oxide layer having crystallinity.

7. The acoustic wave device according to claim 6, wherein the intermediate layer includes silicon oxide, silicon nitride, or silicon oxynitride.

8. The acoustic wave device according to claim 1, further comprising a protective film provided on the piezoelectric layer to cover the IDT electrode.

9. The acoustic wave device according to claim 8, wherein the protective film includes silicon oxide or silicon nitride.

10. An acoustic wave device comprising:

a support substrate;

a silicon oxide layer provided directly or indirectly on the support substrate and having crystallinity;

a piezoelectric layer on the silicon oxide layer having crystallinity;

an IDT electrode on the piezoelectric layer; and an intermediate layer between the support substrate and the silicon oxide layer having crystallinity; wherein when λ represents a wavelength defined by an electrode finger pitch of the IDT electrode, a thickness of the silicon oxide layer having crystallinity is about 0.2λ or more and about 0.4λ or less;

the piezoelectric layer has a thickness smaller than the thickness of the silicon oxide layer having crystallinity; and the intermediate layer includes at least a first layer and a second layer.

11. The acoustic wave device according to claim 10, wherein the intermediate layer includes silicon oxide, silicon nitride, or silicon oxynitride.

12. The acoustic wave device according to claim 10, wherein the silicon oxide layer having crystallinity is a quartz-crystal layer.

13. The acoustic wave device according to claim 10, wherein the support substrate is a silicon substrate.

14. The acoustic wave device according to claim 10, wherein the piezoelectric layer is a lithium tantalate layer; and a cut angle of lithium tantalate of the piezoelectric layer is about 20° Y or more and about 90° Y or less.

15. The acoustic wave device according to claim 14, wherein the cut angle of the lithium tantalate of the piezoelectric layer is about 40° Y or more and about 90° Y or less;

the silicon oxide layer having crystallinity is a monocrystalline quartz-crystal layer; and when $(\phi_q, \theta_q, \psi_q)$ represent azimuthal angles of the monocrystalline quartz-crystal layer, the angles $\phi_q$, $\theta_q$, and $\psi_q$ are in any one of combinations in Tables 11 to 20:

TABLE 11

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 25$ | $-10 \le \psi_q < 10$ |
| 2 | $-5 \le \phi_q < 5$ | $105 \le \theta_q \le 185$ | $-10 \le \psi_q < 10$ |
| 3 | $5 \le \phi_q < 15$ | $-5 \le \theta_q \le 25$ | $-10 \le \psi_q < 10$ |
| 4 | $5 \le \phi_q < 15$ | $105 \le \theta_q \le 185$ | $-10 \le \psi_q < 10$ |
| 5 | $15 \le \phi_q < 25$ | $-5 \le \theta_q \le 15$ | $-10 \le \psi_q < 10$ |
| 6 | $15 \le \phi_q < 25$ | $95 \le \theta_q \le 185$ | $-10 \le \psi_q < 10$ |
| 7 | $25 \le \phi_q < 35$ | $95 \le \theta_q \le 175$ | $-10 \le \psi_q < 10$ |
| 8 | $35 \le \phi_q < 45$ | $95 \le \theta_q \le 165$ | $-10 \le \psi_q < 10$ |
| 9 | $45 \le \phi_q < 55$ | $95 \le \theta_q \le 155$ | $-10 \le \psi_q < 10$ |
| 10 | $55 \le \phi_q < 65$ | $95 \le \theta_q \le 155$ | $-10 \le \psi_q < 10$ |
| 11 | $65 \le \phi_q < 75$ | $95 \le \theta_q \le 155$ | $-10 \le \psi_q < 10$ |
| 12 | $75 \le \phi_q < 85$ | $95 \le \theta_q \le 165$ | $-10 \le \psi_q < 10$ |
| 13 | $85 \le \phi_q < 95$ | $95 \le \theta_q \le 175$ | $-10 \le \psi_q < 10$ |
| 14 | $95 \le \phi_q < 105$ | $-5 \le \theta_q \le 15$ | $-10 \le \psi_q < 10$ |
| 15 | $95 \le \phi_q < 105$ | $95 \le \theta_q \le 185$ | $-10 \le \psi_q < 10$ |
| 16 | $105 \le \phi_q < 115$ | $-5 \le \theta_q \le 25$ | $-10 \le \psi_q < 10$ |
| 17 | $105 \le \phi_q < 115$ | $95 \le \theta_q \le 185$ | $-10 \le \psi_q < 10$ |
| 18 | $115 \le \phi_q < 125$ | $-5 \le \theta_q \le 25$ | $-10 \le \psi_q < 10$ |
| 19 | $115 \le \phi_q < 125$ | $105 \le \theta_q \le 185$ | $-10 \le \psi_q < 10$ |
| 20 | $125 \le \phi_q < 135$ | $-5 \le \theta_q \le 25$ | $-10 \le \psi_q < 10$ |
| 21 | $125 \le \phi_q < 135$ | $105 \le \theta_q \le 185$ | $-10 \le \psi_q < 10$ |
| 22 | $135 \le \phi_q < 145$ | $-5 \le \theta_q \le 15$ | $-10 \le \psi_q < 10$ |
| 23 | $135 \le \phi_q < 145$ | $95 \le \theta_q \le 185$ | $-10 \le \psi_q < 10$ |
| 24 | $145 \le \phi_q < 155$ | $95 \le \theta_q \le 175$ | $-10 \le \psi_q < 10$ |
| 25 | $155 \le \phi_q < 165$ | $95 \le \theta_q \le 165$ | $-10 \le \psi_q < 10$ |
| 26 | $165 \le \phi_q < 175$ | $95 \le \theta_q \le 155$ | $-10 \le \psi_q < 10$ |
| 27 | $175 \le \phi_q < 185$ | $95 \le \theta_q \le 155$ | $-10 \le \psi_q < 10$ |

TABLE 12

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 15$ | $10 \le \psi_q < 30$ |
| 2 | $-5 \le \phi_q < 5$ | $95 \le \theta_q \le 185$ | $10 \le \psi_q < 30$ |
| 3 | $5 \le \phi_q < 15$ | $115 \le \theta_q \le 185$ | $10 \le \psi_q < 30$ |
| 4 | $15 \le \phi_q < 25$ | $105 \le \theta_q \le 115$ | $10 \le \psi_q < 30$ |
| 5 | $15 \le \phi_q < 25$ | $125 \le \theta_q \le 185$ | $10 \le \psi_q < 30$ |

TABLE 12-continued

| CONDITION | $\phi_q$ RANGE[°] | $\theta_q$ RANGE[°] | $\psi_q$ RANGE[°] |
|---|---|---|---|
| 6 | $25 \le \phi_q < 35$ | $115 \le \theta_q \le 185$ | $10 \le \psi_q < 30$ |
| 7 | $35 \le \phi_q < 45$ | $105 \le \theta_q \le 185$ | $10 \le \psi_q < 30$ |
| 8 | $45 \le \phi_q < 55$ | $95 \le \theta_q \le 175$ | $10 \le \psi_q < 30$ |
| 9 | $55 \le \phi_q < 65$ | $95 \le \theta_q \le 165$ | $10 \le \psi_q < 30$ |
| 10 | $65 \le \phi_q < 75$ | $95 \le \theta_q \le 155$ | $10 \le \psi_q < 30$ |
| 11 | $75 \le \phi_q < 85$ | $-5 \le \theta_q \le 25$ | $10 \le \psi_q < 30$ |
| 12 | $75 \le \phi_q < 85$ | $95 \le \theta_q \le 155$ | $10 \le \psi_q < 30$ |
| 13 | $85 \le \phi_q < 95$ | $-5 \le \theta_q \le 25$ | $10 \le \psi_q < 30$ |
| 14 | $85 \le \phi_q < 95$ | $95 \le \theta_q \le 155$ | $10 \le \psi_q < 30$ |
| 15 | $95 \le \phi_q < 105$ | $-5 \le \theta_q \le 25$ | $10 \le \psi_q < 30$ |
| 16 | $95 \le \phi_q < 105$ | $95 \le \theta_q \le 155$ | $10 \le \psi_q < 30$ |
| 17 | $105 \le \phi_q < 115$ | $-5 \le \theta_q \le 25$ | $10 \le \psi_q < 30$ |
| 18 | $105 \le \phi_q < 115$ | $95 \le \theta_q \le 175$ | $10 \le \psi_q < 30$ |
| 19 | $115 \le \phi_q < 125$ | $-5 \le \theta_q \le 15$ | $10 \le \psi_q < 30$ |
| 20 | $115 \le \phi_q < 125$ | $95 \le \theta_q \le 185$ | $10 \le \psi_q < 30$ |
| 21 | $125 \le \phi_q < 135$ | $115 \le \theta_q \le 185$ | $10 \le \psi_q < 30$ |
| 22 | $135 \le \phi_q < 145$ | $105 \le \theta_q \le 115$ | $10 \le \psi_q < 30$ |
| 23 | $135 \le \phi_q < 145$ | $125 \le \theta_q \le 185$ | $10 \le \psi_q < 30$ |
| 24 | $145 \le \phi_q < 155$ | $115 \le \theta_q \le 185$ | $10 \le \psi_q < 30$ |
| 25 | $155 \le \phi_q < 165$ | $105 \le \theta_q \le 185$ | $10 \le \psi_q < 30$ |
| 26 | $165 \le \phi_q < 175$ | $95 \le \theta_q \le 175$ | $10 \le \psi_q < 30$ |
| 27 | $175 \le \phi_q < 185$ | $95 \le \theta_q \le 165$ | $10 \le \psi_q < 30$ |

TABLE 13

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $75 \le \theta_q \le 105$ | $30 \le \psi_q < 50$ |
| 2 | $-5 \le \phi_q < 5$ | $115 \le \theta_q \le 155$ | $30 \le \psi_q < 50$ |
| 3 | $5 \le \phi_q < 15$ | $65 \le \theta_q \le 95$ | $30 \le \psi_q < 50$ |
| 4 | $5 \le \phi_q < 15$ | $115 \le \theta_q \le 175$ | $30 \le \psi_q < 50$ |
| 5 | $15 \le \phi_q < 25$ | $65 \le \theta_q \le 75$ | $30 \le \psi_q < 50$ |
| 6 | $15 \le \phi_q < 25$ | $145 \le \theta_q \le 185$ | $30 \le \psi_q < 50$ |
| 7 | $25 \le \phi_q < 35$ | $55 \le \theta_q \le 65$ | $30 \le \psi_q < 50$ |
| 8 | $25 \le \phi_q < 35$ | $135 \le \theta_q \le 185$ | $30 \le \psi_q < 50$ |
| 9 | $35 \le \phi_q < 45$ | $135 \le \theta_q \le 185$ | $30 \le \psi_q < 50$ |
| 10 | $45 \le \phi_q < 55$ | $125 \le \theta_q \le 185$ | $30 \le \psi_q < 50$ |
| 11 | $55 \le \phi_q < 65$ | $-5 \le \theta_q \le 25$ | $30 \le \psi_q < 50$ |
| 12 | $55 \le \phi_q < 65$ | $115 \le \theta_q \le 185$ | $30 \le \psi_q < 50$ |
| 13 | $65 \le \phi_q < 75$ | $-5 \le \theta_q \le 35$ | $30 \le \psi_q < 50$ |
| 14 | $65 \le \phi_q < 75$ | $115 \le \theta_q \le 175$ | $30 \le \psi_q < 50$ |
| 15 | $75 \le \phi_q < 85$ | $-5 \le \theta_q \le 25$ | $30 \le \psi_q < 50$ |
| 16 | $75 \le \phi_q < 85$ | $95 \le \theta_q \le 165$ | $30 \le \psi_q < 50$ |
| 17 | $85 \le \phi_q < 95$ | $-5 \le \theta_q \le 25$ | $30 \le \psi_q < 50$ |
| 18 | $85 \le \phi_q < 95$ | $95 \le \theta_q \le 155$ | $30 \le \psi_q < 50$ |
| 19 | $95 \le \phi_q < 105$ | $-5 \le \theta_q \le 15$ | $30 \le \psi_q < 50$ |
| 20 | $95 \le \phi_q < 105$ | $85 \le \theta_q \le 155$ | $30 \le \psi_q < 50$ |
| 21 | $105 \le \phi_q < 115$ | $85 \le \theta_q \le 145$ | $30 \le \psi_q < 50$ |
| 22 | $115 \le \phi_q < 125$ | $75 \le \theta_q \le 105$ | $30 \le \psi_q < 50$ |
| 23 | $115 \le \phi_q < 125$ | $115 \le \theta_q \le 155$ | $30 \le \psi_q < 50$ |
| 24 | $125 \le \phi_q < 135$ | $65 \le \theta_q \le 95$ | $30 \le \psi_q < 50$ |
| 25 | $125 \le \phi_q < 135$ | $115 \le \theta_q \le 175$ | $30 \le \psi_q < 50$ |
| 26 | $135 \le \phi_q < 145$ | $65 \le \theta_q \le 75$ | $30 \le \psi_q < 50$ |
| 27 | $135 \le \phi_q < 145$ | $145 \le \theta_q \le 185$ | $30 \le \psi_q < 50$ |
| 28 | $145 \le \phi_q < 155$ | $55 \le \theta_q \le 65$ | $30 \le \psi_q < 50$ |
| 29 | $145 \le \phi_q < 155$ | $135 \le \theta_q \le 185$ | $30 \le \psi_q < 50$ |
| 30 | $155 \le \phi_q < 165$ | $135 \le \theta_q \le 185$ | $30 \le \psi_q < 50$ |
| 31 | $165 \le \phi_q < 175$ | $125 \le \theta_q \le 185$ | $30 \le \psi_q < 50$ |
| 32 | $175 \le \phi_q < 185$ | $-5 \le \theta_q \le 25$ | $30 \le \psi_q < 50$ |
| 33 | $175 \le \phi_q < 185$ | $115 \le \theta_q \le 185$ | $30 \le \psi_q < 50$ |

TABLE 14

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $55 \le \theta_q \le 135$ | $50 \le \psi_q < 70$ |
| 2 | $5 \le \phi_q < 15$ | $55 \le \theta_q \le 135$ | $50 \le \psi_q < 70$ |
| 3 | $15 \le \phi_q < 25$ | $45 \le \theta_q \le 115$ | $50 \le \psi_q < 70$ |
| 4 | $25 \le \phi_q < 35$ | $45 \le \theta_q \le 85$ | $50 \le \psi_q < 70$ |
| 5 | $25 \le \phi_q < 35$ | $165 \le \theta_q \le 175$ | $50 \le \psi_q < 70$ |
| 6 | $35 \le \phi_q < 45$ | $-5 \le \theta_q \le 65$ | $50 \le \psi_q < 70$ |
| 7 | $35 \le \phi_q < 45$ | $145 \le \theta_q \le 185$ | $50 \le \psi_q < 70$ |
| 8 | $45 \le \phi_q < 55$ | $-5 \le \theta_q \le 45$ | $50 \le \psi_q < 70$ |

TABLE 14-continued

| CONDITION | $\phi_q$ RANGE[°] | $\theta_q$ RANGE[°] | $\psi_q$ RANGE[°] |
|---|---|---|---|
| 9 | $45 \le \phi_q < 55$ | $135 \le \theta_q \le 185$ | $50 \le \psi_q < 70$ |
| 10 | $55 \le \phi_q < 65$ | $-5 \le \theta_q \le 35$ | $50 \le \psi_q < 70$ |
| 11 | $55 \le \phi_q < 65$ | $125 \le \theta_q \le 185$ | $50 \le \psi_q < 70$ |
| 12 | $65 \le \phi_q < 75$ | $-5 \le \theta_q \le 35$ | $50 \le \psi_q < 70$ |
| 13 | $65 \le \phi_q < 75$ | $125 \le \theta_q \le 185$ | $50 \le \psi_q < 70$ |
| 14 | $75 \le \phi_q < 85$ | $-5 \le \theta_q \le 25$ | $50 \le \psi_q < 70$ |
| 15 | $75 \le \phi_q < 85$ | $115 \le \theta_q \le 185$ | $50 \le \psi_q < 70$ |
| 16 | $85 \le \phi_q < 95$ | $95 \le \theta_q \le 175$ | $50 \le \psi_q < 70$ |
| 17 | $95 \le \phi_q < 105$ | $75 \le \theta_q \le 155$ | $50 \le \psi_q < 70$ |
| 18 | $105 \le \phi_q < 115$ | $65 \le \theta_q \le 145$ | $50 \le \psi_q < 70$ |
| 19 | $115 \le \phi_q < 125$ | $65 \le \theta_q \le 135$ | $50 \le \psi_q < 70$ |
| 20 | $125 \le \phi_q < 135$ | $55 \le \theta_q \le 135$ | $50 \le \psi_q < 70$ |
| 21 | $135 \le \phi_q < 145$ | $45 \le \theta_q \le 115$ | $50 \le \psi_q < 70$ |
| 22 | $145 \le \phi_q < 155$ | $45 \le \theta_q \le 85$ | $50 \le \psi_q < 70$ |
| 23 | $145 \le \phi_q < 155$ | $165 \le \theta_q \le 175$ | $50 \le \psi_q < 70$ |
| 24 | $155 \le \phi_q < 165$ | $-5 \le \theta_q \le 65$ | $50 \le \psi_q < 70$ |
| 25 | $155 \le \phi_q < 165$ | $145 \le \theta_q \le 185$ | $50 \le \psi_q < 70$ |
| 26 | $165 \le \phi_q < 175$ | $-5 \le \theta_q \le 45$ | $50 \le \psi_q < 70$ |
| 27 | $165 \le \phi_q < 175$ | $135 \le \theta_q \le 185$ | $50 \le \psi_q < 70$ |
| 28 | $175 \le \phi_q < 185$ | $-5 \le \theta_q \le 35$ | $50 \le \psi_q < 70$ |
| 29 | $175 \le \phi_q < 185$ | $125 \le \theta_q \le 185$ | $50 \le \psi_q < 70$ |

TABLE 15

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $55 \le \theta_q \le 135$ | $70 \le \psi_q < 90$ |
| 2 | $5 \le \phi_q < 15$ | $25 \le \theta_q \le 35$ | $70 \le \psi_q < 90$ |
| 3 | $5 \le \phi_q < 15$ | $45 \le \theta_q \le 135$ | $70 \le \psi_q < 90$ |
| 4 | $15 \le \phi_q < 25$ | $-5 \le \theta_q \le 115$ | $70 \le \psi_q < 90$ |
| 5 | $25 \le \phi_q < 35$ | $-5 \le \theta_q \le 65$ | $70 \le \psi_q < 90$ |
| 6 | $35 \le \phi_q < 45$ | $-5 \le \theta_q \le 55$ | $70 \le \psi_q < 90$ |
| 7 | $45 \le \phi_q < 55$ | $-5 \le \theta_q \le 45$ | $70 \le \psi_q < 90$ |
| 8 | $55 \le \phi_q < 65$ | $-5 \le \theta_q \le 35$ | $70 \le \psi_q < 90$ |
| 9 | $55 \le \phi_q < 65$ | $135 \le \theta_q \le 185$ | $70 \le \psi_q < 90$ |
| 10 | $65 \le \phi_q < 75$ | $125 \le \theta_q \le 185$ | $70 \le \psi_q < 90$ |
| 11 | $75 \le \phi_q < 85$ | $115 \le \theta_q \le 185$ | $70 \le \psi_q < 90$ |
| 12 | $85 \le \phi_q < 95$ | $85 \le \theta_q \le 185$ | $70 \le \psi_q < 90$ |
| 13 | $95 \le \phi_q < 105$ | $65 \le \theta_q \le 185$ | $70 \le \psi_q < 90$ |
| 14 | $105 \le \phi_q < 115$ | $55 \le \theta_q \le 175$ | $70 \le \psi_q < 90$ |
| 15 | $115 \le \phi_q < 125$ | $55 \le \theta_q \le 135$ | $70 \le \psi_q < 90$ |
| 16 | $125 \le \phi_q < 135$ | $25 \le \theta_q \le 35$ | $70 \le \psi_q < 90$ |
| 17 | $125 \le \phi_q < 135$ | $45 \le \theta_q \le 135$ | $70 \le \psi_q < 90$ |
| 18 | $135 \le \phi_q < 145$ | $-5 \le \theta_q \le 115$ | $70 \le \psi_q < 90$ |
| 19 | $135 \le \phi_q < 145$ | $125 \le \theta_q \le 135$ | $70 \le \psi_q < 90$ |
| 20 | $145 \le \phi_q < 155$ | $-5 \le \theta_q \le 65$ | $70 \le \psi_q < 90$ |
| 21 | $155 \le \phi_q < 165$ | $-5 \le \theta_q \le 55$ | $70 \le \psi_q < 90$ |
| 22 | $165 \le \phi_q < 175$ | $-5 \le \theta_q \le 45$ | $70 \le \psi_q < 90$ |
| 23 | $175 \le \phi_q < 185$ | $-5 \le \theta_q \le 35$ | $70 \le \psi_q < 90$ |
| 24 | $175 \le \phi_q < 185$ | $135 \le \theta_q \le 185$ | $70 \le \psi_q < 90$ |

TABLE 16

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 45$ | $90 \le \psi_q < 110$ |
| 2 | $-5 \le \phi_q < 5$ | $135 \le \theta_q \le 185$ | $90 \le \psi_q < 110$ |
| 3 | $5 \le \phi_q < 15$ | $-5 \le \theta_q \le 45$ | $90 \le \psi_q < 110$ |
| 4 | $5 \le \phi_q < 15$ | $165 \le \theta_q \le 175$ | $90 \le \psi_q < 110$ |
| 5 | $15 \le \phi_q < 25$ | $-5 \le \theta_q \le 45$ | $90 \le \psi_q < 110$ |
| 6 | $25 \le \phi_q < 35$ | $-5 \le \theta_q \le 65$ | $90 \le \psi_q < 110$ |
| 7 | $35 \le \phi_q < 45$ | $-5 \le \theta_q \le 75$ | $90 \le \psi_q < 110$ |
| 8 | $45 \le \phi_q < 55$ | $15 \le \theta_q \le 115$ | $90 \le \psi_q < 110$ |
| 9 | $45 \le \phi_q < 55$ | $175 \le \theta_q \le 185$ | $90 \le \psi_q < 110$ |
| 10 | $55 \le \phi_q < 65$ | $35 \le \theta_q \le 125$ | $90 \le \psi_q < 110$ |
| 11 | $65 \le \phi_q < 75$ | $55 \le \theta_q \le 145$ | $90 \le \psi_q < 110$ |
| 12 | $75 \le \phi_q < 85$ | $55 \le \theta_q \le 185$ | $90 \le \psi_q < 110$ |
| 13 | $85 \le \phi_q < 95$ | $65 \le \theta_q \le 185$ | $90 \le \psi_q < 110$ |
| 14 | $95 \le \phi_q < 105$ | $85 \le \theta_q \le 105$ | $90 \le \psi_q < 110$ |
| 15 | $95 \le \phi_q < 105$ | $115 \le \theta_q \le 185$ | $90 \le \psi_q < 110$ |
| 16 | $105 \le \phi_q < 115$ | $125 \le \theta_q \le 185$ | $90 \le \psi_q < 110$ |
| 17 | $115 \le \phi_q < 125$ | $-5 \le \theta_q \le 45$ | $90 \le \psi_q < 110$ |
| 18 | $115 \le \phi_q < 125$ | $135 \le \theta_q \le 185$ | $90 \le \psi_q < 110$ |

TABLE 16-continued

| CONDITION | $\phi_q$ RANGE[°] | $\theta_q$ RANGE[°] | $\psi_q$ RANGE[°] |
|---|---|---|---|
| 19 | $125 \le \phi_q < 135$ | $-5 \le \theta_q \le 45$ | $90 \le \psi_q < 110$ |
| 20 | $125 \le \phi_q < 135$ | $165 \le \theta_q \le 175$ | $90 \le \psi_q < 110$ |
| 21 | $135 \le \phi_q < 145$ | $-5 \le \theta_q \le 65$ | $90 \le \psi_q < 110$ |
| 22 | $145 \le \phi_q < 155$ | $-5 \le \theta_q \le 65$ | $90 \le \psi_q < 110$ |
| 23 | $155 \le \phi_q < 165$ | $-5 \le \theta_q \le 75$ | $90 \le \psi_q < 110$ |
| 24 | $165 \le \phi_q < 175$ | $15 \le \theta_q \le 115$ | $90 \le \psi_q < 110$ |
| 25 | $175 \le \phi_q < 185$ | $35 \le \theta_q \le 125$ | $90 \le \psi_q < 110$ |

TABLE 17

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 45$ | $110 \le \psi_q < 130$ |
| 2 | $-5 \le \phi_q < 5$ | $145 \le \theta_q \le 185$ | $110 \le \psi_q < 130$ |
| 3 | $5 \le \phi_q < 15$ | $-5 \le \theta_q \le 55$ | $110 \le \psi_q < 130$ |
| 4 | $5 \le \phi_q < 15$ | $145 \le \theta_q \le 185$ | $110 \le \psi_q < 130$ |
| 5 | $15 \le \phi_q < 25$ | $-5 \le \theta_q \le 55$ | $110 \le \psi_q < 130$ |
| 6 | $15 \le \phi_q < 25$ | $155 \le \theta_q \le 185$ | $110 \le \psi_q < 130$ |
| 7 | $25 \le \phi_q < 35$ | $5 \le \theta_q \le 75$ | $110 \le \psi_q < 130$ |
| 8 | $35 \le \phi_q < 45$ | $25 \le \theta_q \le 95$ | $110 \le \psi_q < 130$ |
| 9 | $45 \le \phi_q < 55$ | $35 \le \theta_q \le 105$ | $110 \le \psi_q < 130$ |
| 10 | $55 \le \phi_q < 65$ | $35 \le \theta_q \le 125$ | $110 \le \psi_q < 130$ |
| 11 | $65 \le \phi_q < 75$ | $45 \le \theta_q \le 125$ | $110 \le \psi_q < 130$ |
| 12 | $75 \le \phi_q < 85$ | $45 \le \theta_q \le 135$ | $110 \le \psi_q < 130$ |
| 13 | $85 \le \phi_q < 95$ | $5 \le \theta_q \le 25$ | $110 \le \psi_q < 130$ |
| 14 | $85 \le \phi_q < 95$ | $85 \le \theta_q \le 155$ | $110 \le \psi_q < 130$ |
| 15 | $95 \le \phi_q < 105$ | $-5 \le \theta_q \le 45$ | $110 \le \psi_q < 130$ |
| 16 | $95 \le \phi_q < 105$ | $105 \le \theta_q \le 185$ | $110 \le \psi_q < 130$ |
| 17 | $105 \le \phi_q < 115$ | $-5 \le \theta_q \le 45$ | $110 \le \psi_q < 130$ |
| 18 | $105 \le \phi_q < 115$ | $135 \le \theta_q \le 185$ | $110 \le \psi_q < 130$ |
| 19 | $115 \le \phi_q < 125$ | $-5 \le \theta_q \le 45$ | $110 \le \psi_q < 130$ |
| 20 | $115 \le \phi_q < 125$ | $145 \le \theta_q \le 185$ | $110 \le \psi_q < 130$ |
| 21 | $125 \le \phi_q < 135$ | $-5 \le \theta_q \le 55$ | $110 \le \psi_q < 130$ |
| 22 | $125 \le \phi_q < 135$ | $145 \le \theta_q \le 185$ | $110 \le \psi_q < 130$ |
| 23 | $135 \le \phi_q < 145$ | $-5 \le \theta_q \le 55$ | $110 \le \psi_q < 130$ |
| 24 | $135 \le \phi_q < 145$ | $155 \le \theta_q \le 185$ | $110 \le \psi_q < 130$ |
| 25 | $145 \le \phi_q < 155$ | $5 \le \theta_q \le 75$ | $110 \le \psi_q < 130$ |
| 26 | $155 \le \phi_q < 165$ | $25 \le \theta_q \le 95$ | $110 \le \psi_q < 130$ |
| 27 | $165 \le \phi_q < 175$ | $35 \le \theta_q \le 105$ | $110 \le \psi_q < 130$ |
| 28 | $175 \le \phi_q < 185$ | $35 \le \theta_q \le 125$ | $110 \le \psi_q < 130$ |

TABLE 18

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 65$ | $130 \le \psi_q < 150$ |
| 2 | $-5 \le \phi_q < 5$ | $155 \le \theta_q \le 185$ | $130 \le \psi_q < 150$ |
| 3 | $5 \le \phi_q < 15$ | $-5 \le \theta_q \le 65$ | $130 \le \psi_q < 150$ |
| 4 | $5 \le \phi_q < 15$ | $145 \le \theta_q \le 185$ | $130 \le \psi_q < 150$ |
| 5 | $15 \le \phi_q < 25$ | $15 \le \theta_q \le 75$ | $130 \le \psi_q < 150$ |
| 6 | $15 \le \phi_q < 25$ | $145 \le \theta_q \le 185$ | $130 \le \psi_q < 150$ |
| 7 | $25 \le \phi_q < 35$ | $25 \le \theta_q \le 85$ | $130 \le \psi_q < 150$ |
| 8 | $25 \le \phi_q < 35$ | $155 \le \theta_q \le 185$ | $130 \le \psi_q < 150$ |
| 9 | $35 \le \phi_q < 45$ | $25 \le \theta_q \le 95$ | $130 \le \psi_q < 150$ |
| 10 | $35 \le \phi_q < 45$ | $165 \le \theta_q \le 185$ | $130 \le \psi_q < 150$ |
| 11 | $45 \le \phi_q < 55$ | $35 \le \theta_q \le 95$ | $130 \le \psi_q < 150$ |
| 12 | $55 \le \phi_q < 65$ | $25 \le \theta_q \le 105$ | $130 \le \psi_q < 150$ |
| 13 | $65 \le \phi_q < 75$ | $5 \le \theta_q \le 65$ | $130 \le \psi_q < 150$ |
| 14 | $65 \le \phi_q < 75$ | $85 \le \theta_q \le 115$ | $130 \le \psi_q < 150$ |
| 15 | $75 \le \phi_q < 85$ | $-5 \le \theta_q \le 55$ | $130 \le \psi_q < 150$ |
| 16 | $75 \le \phi_q < 85$ | $75 \le \theta_q \le 85$ | $130 \le \psi_q < 150$ |
| 17 | $75 \le \phi_q < 85$ | $105 \le \theta_q \le 125$ | $130 \le \psi_q < 150$ |
| 18 | $85 \le \phi_q < 95$ | $-5 \le \theta_q \le 55$ | $130 \le \psi_q < 150$ |
| 19 | $85 \le \phi_q < 95$ | $105 \le \theta_q \le 115$ | $130 \le \psi_q < 150$ |
| 20 | $95 \le \phi_q < 105$ | $-5 \le \theta_q \le 45$ | $130 \le \psi_q < 150$ |
| 21 | $105 \le \phi_q < 115$ | $-5 \le \theta_q \le 55$ | $130 \le \psi_q < 150$ |
| 22 | $115 \le \phi_q < 125$ | $-5 \le \theta_q \le 65$ | $130 \le \psi_q < 150$ |
| 23 | $115 \le \phi_q < 125$ | $155 \le \theta_q \le 185$ | $130 \le \psi_q < 150$ |
| 24 | $125 \le \phi_q < 135$ | $5 \le \theta_q \le 65$ | $130 \le \psi_q < 150$ |
| 25 | $125 \le \phi_q < 135$ | $145 \le \theta_q \le 185$ | $130 \le \psi_q < 150$ |
| 26 | $135 \le \phi_q < 145$ | $15 \le \theta_q \le 75$ | $130 \le \psi_q < 150$ |
| 27 | $135 \le \phi_q < 145$ | $145 \le \theta_q \le 185$ | $130 \le \psi_q < 150$ |
| 28 | $145 \le \phi_q < 155$ | $25 \le \theta_q \le 85$ | $130 \le \psi_q < 150$ |

TABLE 18-continued

| CONDITION | $\phi_q$ RANGE[°] | $\theta_q$ RANGE[°] | $\psi_q$ RANGE[°] |
|---|---|---|---|
| 29 | $145 \le \phi_q < 155$ | $155 \le \theta_q \le 185$ | $130 \le \psi_q < 150$ |
| 30 | $155 \le \phi_q < 165$ | $25 \le \theta_q \le 95$ | $130 \le \psi_q < 150$ |
| 31 | $155 \le \phi_q < 165$ | $165 \le \theta_q \le 185$ | $130 \le \psi_q < 150$ |
| 32 | $165 \le \phi_q < 175$ | $35 \le \theta_q \le 95$ | $130 \le \psi_q < 150$ |
| 33 | $175 \le \phi_q < 185$ | $25 \le \theta_q \le 105$ | $130 \le \psi_q < 150$ |

TABLE 19

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $15 \le \theta_q \le 85$ | $150 \le \psi_q < 170$ |
| 2 | $5 \le \phi_q < 15$ | $25 \le \theta_q \le 85$ | $150 \le \psi_q < 170$ |
| 3 | $15 \le \phi_q < 25$ | $25 \le \theta_q \le 85$ | $150 \le \psi_q < 170$ |
| 4 | $15 \le \phi_q < 25$ | $165 \le \theta_q \le 185$ | $150 \le \psi_q < 170$ |
| 5 | $25 \le \phi_q < 35$ | $25 \le \theta_q \le 85$ | $150 \le \psi_q < 170$ |
| 6 | $25 \le \phi_q < 35$ | $155 \le \theta_q \le 185$ | $150 \le \psi_q < 170$ |
| 7 | $35 \le \phi_q < 45$ | $25 \le \theta_q \le 85$ | $150 \le \psi_q < 170$ |
| 8 | $35 \le \phi_q < 45$ | $155 \le \theta_q \le 185$ | $150 \le \psi_q < 170$ |
| 9 | $45 \le \phi_q < 55$ | $5 \le \theta_q \le 85$ | $150 \le \psi_q < 170$ |
| 10 | $45 \le \phi_q < 55$ | $155 \le \theta_q \le 185$ | $150 \le \psi_q < 170$ |
| 11 | $55 \le \phi_q < 65$ | $-5 \le \theta_q \le 85$ | $150 \le \psi_q < 170$ |
| 12 | $55 \le \phi_q < 65$ | $165 \le \theta_q \le 185$ | $150 \le \psi_q < 170$ |
| 13 | $65 \le \phi_q < 75$ | $-5 \le \theta_q \le 85$ | $150 \le \psi_q < 170$ |
| 14 | $75 \le \phi_q < 85$ | $-5 \le \theta_q \le 75$ | $150 \le \psi_q < 170$ |
| 15 | $85 \le \phi_q < 95$ | $-5 \le \theta_q \le 65$ | $150 \le \psi_q < 170$ |
| 16 | $95 \le \phi_q < 105$ | $-5 \le \theta_q \le 75$ | $150 \le \psi_q < 170$ |
| 17 | $105 \le \phi_q < 115$ | $5 \le \theta_q \le 75$ | $150 \le \psi_q < 170$ |
| 18 | $115 \le \phi_q < 125$ | $15 \le \theta_q \le 85$ | $150 \le \psi_q < 170$ |
| 19 | $125 \le \phi_q < 135$ | $25 \le \theta_q \le 85$ | $150 \le \psi_q < 170$ |
| 20 | $135 \le \phi_q < 145$ | $25 \le \theta_q \le 85$ | $150 \le \psi_q < 170$ |
| 21 | $135 \le \phi_q < 145$ | $165 \le \theta_q \le 185$ | $150 \le \psi_q < 170$ |
| 22 | $145 \le \phi_q < 155$ | $25 \le \theta_q \le 85$ | $150 \le \psi_q < 170$ |
| 23 | $145 \le \phi_q < 155$ | $155 \le \theta_q \le 185$ | $150 \le \psi_q < 170$ |
| 24 | $155 \le \phi_q < 165$ | $25 \le \theta_q \le 85$ | $150 \le \psi_q < 170$ |
| 25 | $155 \le \phi_q < 165$ | $155 \le \theta_q \le 185$ | $150 \le \psi_q < 170$ |
| 26 | $165 \le \phi_q < 175$ | $5 \le \theta_q \le 85$ | $150 \le \psi_q < 170$ |
| 27 | $165 \le \phi_q < 175$ | $155 \le \theta_q \le 185$ | $150 \le \psi_q < 170$ |
| 28 | $175 \le \phi_q < 185$ | $-5 \le \theta_q \le 85$ | $150 \le \psi_q < 170$ |
| 29 | $175 \le \phi_q < 185$ | $165 \le \theta_q \le 185$ | $150 \le \psi_q < 170$ |

TABLE 20

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $25 \le \theta_q \le 85$ | $170 \le \psi_q \le 190$ |
| 2 | $5 \le \phi_q < 15$ | $25 \le \theta_q \le 85$ | $170 \le \psi_q \le 190$ |
| 3 | $15 \le \phi_q < 25$ | $15 \le \theta_q \le 85$ | $170 \le \psi_q \le 190$ |
| 4 | $25 \le \phi_q < 35$ | $5 \le \theta_q \le 85$ | $170 \le \psi_q \le 190$ |
| 5 | $35 \le \phi_q < 45$ | $-5 \le \theta_q \le 85$ | $170 \le \psi_q \le 190$ |
| 6 | $35 \le \phi_q < 45$ | $165 \le \theta_q \le 185$ | $170 \le \psi_q \le 190$ |
| 7 | $45 \le \phi_q < 55$ | $-5 \le \theta_q \le 75$ | $170 \le \psi_q \le 190$ |
| 8 | $45 \le \phi_q < 55$ | $155 \le \theta_q \le 185$ | $170 \le \psi_q \le 190$ |
| 9 | $55 \le \phi_q < 65$ | $-5 \le \theta_q \le 75$ | $170 \le \psi_q \le 190$ |
| 10 | $55 \le \phi_q < 65$ | $155 \le \theta_q \le 185$ | $170 \le \psi_q \le 190$ |
| 11 | $65 \le \phi_q < 75$ | $-5 \le \theta_q \le 85$ | $170 \le \psi_q \le 190$ |
| 12 | $65 \le \phi_q < 75$ | $155 \le \theta_q \le 185$ | $170 \le \psi_q \le 190$ |
| 13 | $75 \le \phi_q < 85$ | $-5 \le \theta_q \le 85$ | $170 \le \psi_q \le 190$ |
| 14 | $75 \le \phi_q < 85$ | $165 \le \theta_q \le 185$ | $170 \le \psi_q \le 190$ |
| 15 | $85 \le \phi_q < 95$ | $5 \le \theta_q \le 85$ | $170 \le \psi_q \le 190$ |
| 16 | $95 \le \phi_q < 105$ | $15 \le \theta_q \le 85$ | $170 \le \psi_q \le 190$ |
| 17 | $105 \le \phi_q < 115$ | $25 \le \theta_q \le 45$ | $170 \le \psi_q \le 190$ |
| 18 | $105 \le \phi_q < 115$ | $55 \le \theta_q \le 85$ | $170 \le \psi_q \le 190$ |
| 19 | $115 \le \phi_q < 125$ | $25 \le \theta_q \le 85$ | $170 \le \psi_q \le 190$ |
| 20 | $125 \le \phi_q < 135$ | $25 \le \theta_q \le 85$ | $170 \le \psi_q \le 190$ |
| 21 | $135 \le \phi_q < 145$ | $15 \le \theta_q \le 85$ | $170 \le \psi_q \le 190$ |
| 22 | $145 \le \phi_q < 155$ | $5 \le \theta_q \le 85$ | $170 \le \psi_q \le 190$ |
| 23 | $155 \le \phi_q < 165$ | $-5 \le \theta_q \le 85$ | $170 \le \psi_q \le 190$ |
| 24 | $155 \le \phi_q < 165$ | $165 \le \theta_q \le 185$ | $170 \le \psi_q \le 190$ |
| 25 | $165 \le \phi_q < 175$ | $-5 \le \theta_q \le 75$ | $170 \le \psi_q \le 190$ |
| 26 | $165 \le \phi_q < 175$ | $155 \le \theta_q \le 185$ | $170 \le \psi_q \le 190$ |
| 27 | $175 \le \phi_q < 185$ | $-5 \le \theta_q \le 75$ | $170 \le \psi_q \le 190$ |
| 28 | $175 \le \phi_q < 185$ | $155 \le \theta_q \le 185$ | $170 \le \psi_q \le 190.$ |

16. The acoustic wave device according to claim 14, wherein the cut angle of the lithium tantalate of the piezoelectric layer is about 20° Y or more and less than about 40° Y;

the silicon oxide layer having crystallinity is a monocrystalline quartz-crystal layer; and when ($\phi_q$, $\theta_q$, $\psi_q$) represent azimuthal angles of the monocrystalline quartz-crystal layer, the angles $\phi_q$, $\theta_q$, and $\psi_q$ are in any one of combinations in Tables 1 to 10:

TABLE 1

| CON-DITION | $\phi_q$ RANGE[°] | $\theta_q$ RANGE[°] | $\psi_q$ RANGE[°] |
|---|---|---|---|
| 1 | $-5 \le \phi_q < 5$ | $15 \le \theta_q \le 35$ | $-10 \le \psi_q < 10$ |
| 2 | $-5 \le \phi_q < 5$ | $75 \le \theta_q \le 135$ | $-10 \le \psi_q < 10$ |
| 3 | $5 \le \phi_q < 15$ | $5 \le \theta_q \le 35$ | $-10 \le \psi_q < 10$ |
| 4 | $5 \le \phi_q < 15$ | $65 \le \theta_q \le 115$ | $-10 \le \psi_q < 10$ |
| 5 | $15 \le \phi_q < 25$ | $5 \le \theta_q \le 35$ | $-10 \le \psi_q < 10$ |
| 6 | $15 \le \phi_q < 25$ | $65 \le \theta_q \le 105$ | $-10 \le \psi_q < 10$ |
| 7 | $15 \le \phi_q < 25$ | $175 \le \theta_q \le 185$ | $-10 \le \psi_q < 10$ |
| 8 | $25 \le \phi_q < 35$ | $-5 \le \theta_q \le 105$ | $-10 \le \psi_q < 10$ |
| 9 | $25 \le \phi_q < 35$ | $155 \le \theta_q \le 185$ | $-10 \le \psi_q < 10$ |
| 10 | $35 \le \phi_q < 45$ | $-5 \le \theta_q \le 105$ | $-10 \le \psi_q < 10$ |
| 11 | $35 \le \phi_q < 45$ | $155 \le \theta_q \le 185$ | $-10 \le \psi_q < 10$ |
| 12 | $45 \le \phi_q < 55$ | $25 \le \theta_q \le 95$ | $-10 \le \psi_q < 10$ |
| 13 | $45 \le \phi_q < 55$ | $145 \le \theta_q \le 175$ | $-10 \le \psi_q < 10$ |
| 14 | $55 \le \phi_q < 65$ | $25 \le \theta_q \le 95$ | $-10 \le \psi_q < 10$ |
| 15 | $55 \le \phi_q < 65$ | $145 \le \theta_q \le 175$ | $-10 \le \psi_q < 10$ |
| 16 | $65 \le \phi_q < 75$ | $25 \le \theta_q \le 95$ | $-10 \le \psi_q < 10$ |
| 17 | $65 \le \phi_q < 75$ | $145 \le \theta_q \le 175$ | $-10 \le \psi_q < 10$ |
| 18 | $75 \le \phi_q < 85$ | $-5 \le \theta_q \le 95$ | $-10 \le \psi_q < 10$ |
| 19 | $75 \le \phi_q < 85$ | $155 \le \theta_q \le 185$ | $-10 \le \psi_q < 10$ |
| 20 | $85 \le \phi_q < 95$ | $-5 \le \theta_q \le 45$ | $-10 \le \psi_q < 10$ |
| 21 | $85 \le \phi_q < 95$ | $55 \le \theta_q \le 105$ | $-10 \le \psi_q < 10$ |
| 22 | $85 \le \phi_q < 95$ | $155 \le \theta_q \le 185$ | $-10 \le \psi_q < 10$ |
| 23 | $95 \le \phi_q < 105$ | $-5 \le \theta_q \le 35$ | $-10 \le \psi_q < 10$ |
| 24 | $95 \le \phi_q < 105$ | $65 \le \theta_q \le 115$ | $-10 \le \psi_q < 10$ |
| 25 | $105 \le \phi_q < 115$ | $15 \le \theta_q \le 35$ | $-10 \le \psi_q < 10$ |
| 26 | $105 \le \phi_q < 115$ | $75 \le \theta_q \le 125$ | $-10 \le \psi_q < 10$ |
| 27 | $115 \le \phi_q < 125$ | $15 \le \theta_q \le 35$ | $-10 \le \psi_q < 10$ |
| 28 | $115 \le \phi_q < 125$ | $75 \le \theta_q \le 135$ | $-10 \le \psi_q < 10$ |
| 29 | $125 \le \phi_q < 135$ | $5 \le \theta_q \le 35$ | $-10 \le \psi_q < 10$ |
| 30 | $125 \le \phi_q < 135$ | $65 \le \theta_q \le 115$ | $-10 \le \psi_q < 10$ |
| 31 | $135 \le \phi_q < 145$ | $5 \le \theta_q \le 35$ | $-10 \le \psi_q < 10$ |
| 32 | $135 \le \phi_q < 145$ | $65 \le \theta_q \le 105$ | $-10 \le \psi_q < 10$ |
| 33 | $135 \le \phi_q < 145$ | $175 \le \theta_q \le 185$ | $-10 \le \psi_q < 10$ |
| 34 | $145 \le \phi_q < 155$ | $-5 \le \theta_q \le 105$ | $-10 \le \psi_q < 10$ |
| 35 | $145 \le \phi_q < 155$ | $155 \le \theta_q \le 185$ | $-10 \le \psi_q < 10$ |
| 36 | $155 \le \phi_q < 165$ | $-5 \le \theta_q \le 105$ | $-10 \le \psi_q < 10$ |
| 37 | $155 \le \phi_q < 165$ | $155 \le \theta_q \le 185$ | $-10 \le \psi_q < 10$ |
| 38 | $165 \le \phi_q < 175$ | $25 \le \theta_q \le 95$ | $-10 \le \psi_q < 10$ |
| 39 | $165 \le \phi_q < 175$ | $145 \le \theta_q \le 175$ | $-10 \le \psi_q < 10$ |
| 40 | $175 \le \phi_q < 185$ | $25 \le \theta_q \le 95$ | $-10 \le \psi_q < 10$ |
| 41 | $175 \le \phi_q < 185$ | $145 \le \theta_q \le 175$ | $-10 \le \psi_q < 10$ |

TABLE 2

| CON-DITION | $\phi_q$ RANGE[°] | $\theta_q$ RANGE[°] | $\psi_q$ RANGE[°] |
|---|---|---|---|
| 1 | $-5 \le \phi_q < 5$ | $5 \le \theta_q \le 35$ | $10 \le \psi_q < 30$ |
| 2 | $-5 \le \phi_q < 5$ | $65 \le \theta_q \le 145$ | $10 \le \psi_q < 30$ |
| 3 | $5 \le \phi_q < 15$ | $-5 \le \theta_q \le 145$ | $10 \le \psi_q < 30$ |
| 4 | $15 \le \phi_q < 25$ | $-5 \le \theta_q \le 135$ | $10 \le \psi_q < 30$ |
| 5 | $25 \le \phi_q < 35$ | $25 \le \theta_q \le 135$ | $10 \le \psi_q < 30$ |
| 6 | $35 \le \phi_q < 45$ | $25 \le \theta_q \le 125$ | $10 \le \psi_q < 30$ |
| 7 | $35 \le \phi_q < 45$ | $175 \le \theta_q \le 185$ | $10 \le \psi_q < 30$ |
| 8 | $45 \le \phi_q < 55$ | $25 \le \theta_q \le 105$ | $10 \le \psi_q < 30$ |
| 9 | $45 \le \phi_q < 55$ | $165 \le \theta_q \le 185$ | $10 \le \psi_q < 30$ |
| 10 | $55 \le \phi_q < 65$ | $-5 \le \theta_q \le 105$ | $10 \le \psi_q < 30$ |
| 11 | $55 \le \phi_q < 65$ | $155 \le \theta_q \le 185$ | $10 \le \psi_q < 30$ |
| 12 | $65 \le \phi_q < 75$ | $-5 \le \theta_q \le 105$ | $10 \le \psi_q < 30$ |
| 13 | $65 \le \phi_q < 75$ | $145 \le \theta_q \le 175$ | $10 \le \psi_q < 30$ |
| 14 | $75 \le \phi_q < 85$ | $-5 \le \theta_q \le 45$ | $10 \le \psi_q < 30$ |
| 15 | $75 \le \phi_q < 85$ | $75 \le \theta_q \le 95$ | $10 \le \psi_q < 30$ |

37

TABLE 2-continued

| CON-DITION | $\phi_q$ RANGE[°] | $\theta_q$ RANGE[°] | $\psi_q$ RANGE[°] |
|---|---|---|---|
| 16 | $75 \le \phi_q < 85$ | $145 \le \theta_q \le 165$ | $10 \le \psi_q < 30$ |
| 17 | $85 \le \phi_q < 95$ | $15 \le \theta_q \le 35$ | $10 \le \psi_q < 30$ |
| 18 | $85 \le \phi_q < 95$ | $75 \le \theta_q \le 95$ | $10 \le \psi_q < 30$ |
| 19 | $85 \le \phi_q < 95$ | $145 \le \theta_q \le 175$ | $10 \le \psi_q < 30$ |
| 20 | $95 \le \phi_q < 105$ | $15 \le \theta_q \le 35$ | $10 \le \psi_q < 30$ |
| 21 | $95 \le \phi_q < 105$ | $65 \le \theta_q \le 95$ | $10 \le \psi_q < 30$ |
| 22 | $95 \le \phi_q < 105$ | $145 \le \theta_q \le 185$ | $10 \le \psi_q < 30$ |
| 23 | $105 \le \phi_q < 115$ | $15 \le \theta_q \le 35$ | $10 \le \psi_q < 30$ |
| 24 | $105 \le \phi_q < 115$ | $65 \le \theta_q \le 95$ | $10 \le \psi_q < 30$ |
| 25 | $105 \le \phi_q < 115$ | $145 \le \theta_q \le 185$ | $10 \le \psi_q < 30$ |
| 26 | $115 \le \phi_q < 125$ | $5 \le \theta_q \le 35$ | $10 \le \psi_q < 30$ |
| 27 | $115 \le \phi_q < 125$ | $65 \le \theta_q \le 145$ | $10 \le \psi_q < 30$ |
| 28 | $125 \le \phi_q < 135$ | $-5 \le \theta_q \le 145$ | $10 \le \psi_q < 30$ |
| 29 | $135 \le \phi_q < 145$ | $-5 \le \theta_q \le 135$ | $10 \le \psi_q < 30$ |
| 30 | $145 \le \phi_q < 155$ | $25 \le \theta_q \le 135$ | $10 \le \psi_q < 30$ |
| 31 | $155 \le \phi_q < 165$ | $25 \le \theta_q \le 115$ | $10 \le \psi_q < 30$ |
| 32 | $155 \le \phi_q < 165$ | $175 \le \theta_q \le 185$ | $10 \le \psi_q < 30$ |
| 33 | $165 \le \phi_q < 175$ | $25 \le \theta_q \le 105$ | $10 \le \psi_q < 30$ |
| 34 | $165 \le \phi_q < 175$ | $165 \le \theta_q \le 185$ | $10 \le \psi_q < 30$ |
| 35 | $175 \le \phi_q \le 185$ | $-5 \le \theta_q \le 105$ | $10 \le \psi_q < 30$ |
| 36 | $175 \le \phi_q \le 185$ | $155 \le \theta_q \le 185$ | $10 \le \psi_q < 30$ |

TABLE 3

| CON-DITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 85$ | $30 \le \psi_q < 50$ |
| 2 | $-5 \le \phi_q < 5$ | $125 \le \theta_q \le 185$ | $30 \le \psi_q < 50$ |
| 3 | $5 \le \phi_q < 15$ | $25 \le \theta_q \le 75$ | $30 \le \psi_q < 50$ |
| 4 | $5 \le \phi_q < 15$ | $125 \le \theta_q \le 185$ | $30 \le \psi_q < 50$ |
| 5 | $15 \le \phi_q < 25$ | $25 \le \theta_q \le 55$ | $30 \le \psi_q < 50$ |
| 6 | $15 \le \phi_q < 25$ | $65 \le \theta_q \le 85$ | $30 \le \psi_q < 50$ |
| 7 | $15 \le \phi_q < 25$ | $125 \le \theta_q \le 155$ | $30 \le \psi_q < 50$ |
| 8 | $25 \le \phi_q < 35$ | $15 \le \theta_q \le 55$ | $30 \le \psi_q < 50$ |
| 9 | $25 \le \phi_q < 35$ | $115 \le \theta_q \le 145$ | $30 \le \psi_q < 50$ |
| 10 | $35 \le \phi_q < 45$ | $-5 \le \theta_q \le 45$ | $30 \le \psi_q < 50$ |
| 11 | $35 \le \phi_q < 45$ | $75 \le \theta_q \le 145$ | $30 \le \psi_q < 50$ |
| 12 | $45 \le \phi_q < 55$ | $-5 \le \theta_q \le 65$ | $30 \le \psi_q < 50$ |
| 13 | $45 \le \phi_q < 55$ | $75 \le \theta_q \le 135$ | $30 \le \psi_q < 50$ |
| 14 | $55 \le \phi_q < 65$ | $-5 \le \theta_q \le 65$ | $30 \le \psi_q < 50$ |
| 15 | $55 \le \phi_q < 65$ | $85 \le \theta_q \le 135$ | $30 \le \psi_q < 50$ |
| 16 | $55 \le \phi_q < 65$ | $175 \le \theta_q \le 185$ | $30 \le \psi_q < 50$ |
| 17 | $65 \le \phi_q < 75$ | $15 \le \theta_q \le 45$ | $30 \le \psi_q < 50$ |
| 18 | $65 \le \phi_q < 75$ | $75 \le \theta_q \le 115$ | $30 \le \psi_q < 50$ |
| 19 | $65 \le \phi_q < 75$ | $155 \le \theta_q \le 185$ | $30 \le \psi_q < 50$ |
| 20 | $75 \le \phi_q < 85$ | $15 \le \theta_q \le 45$ | $30 \le \psi_q < 50$ |
| 21 | $75 \le \phi_q < 85$ | $75 \le \theta_q \le 105$ | $30 \le \psi_q < 50$ |
| 22 | $75 \le \phi_q < 85$ | $145 \le \theta_q \le 185$ | $30 \le \psi_q < 50$ |
| 23 | $85 \le \phi_q < 95$ | $15 \le \theta_q \le 45$ | $30 \le \psi_q < 50$ |
| 24 | $85 \le \phi_q < 95$ | $55 \le \theta_q \le 95$ | $30 \le \psi_q < 50$ |
| 25 | $85 \le \phi_q < 95$ | $145 \le \theta_q \le 165$ | $30 \le \psi_q < 50$ |
| 26 | $95 \le \phi_q < 105$ | $5 \le \theta_q \le 95$ | $30 \le \psi_q < 50$ |
| 27 | $95 \le \phi_q < 105$ | $145 \le \theta_q \le 165$ | $30 \le \psi_q < 50$ |
| 28 | $105 \le \phi_q < 115$ | $-5 \le \theta_q \le 85$ | $30 \le \psi_q < 50$ |
| 29 | $105 \le \phi_q < 115$ | $135 \le \theta_q \le 175$ | $30 \le \psi_q < 50$ |
| 30 | $115 \le \phi_q < 125$ | $-5 \le \theta_q \le 85$ | $30 \le \psi_q < 50$ |
| 31 | $115 \le \phi_q < 125$ | $125 \le \theta_q \le 185$ | $30 \le \psi_q < 50$ |
| 32 | $125 \le \phi_q < 135$ | $25 \le \theta_q \le 75$ | $30 \le \psi_q < 50$ |
| 33 | $125 \le \phi_q < 135$ | $125 \le \theta_q \le 185$ | $30 \le \psi_q < 50$ |
| 34 | $135 \le \phi_q < 145$ | $25 \le \theta_q \le 55$ | $30 \le \psi_q < 50$ |
| 35 | $135 \le \phi_q < 145$ | $65 \le \theta_q \le 85$ | $30 \le \psi_q < 50$ |
| 36 | $135 \le \phi_q < 145$ | $125 \le \theta_q \le 155$ | $30 \le \psi_q < 50$ |
| 37 | $145 \le \phi_q < 155$ | $15 \le \theta_q \le 55$ | $30 \le \psi_q < 50$ |
| 38 | $145 \le \phi_q < 155$ | $65 \le \theta_q \le 75$ | $30 \le \psi_q < 50$ |
| 39 | $145 \le \phi_q < 155$ | $115 \le \theta_q \le 145$ | $30 \le \psi_q < 50$ |
| 40 | $155 \le \phi_q < 165$ | $-5 \le \theta_q \le 45$ | $30 \le \psi_q < 50$ |
| 41 | $155 \le \phi_q < 165$ | $75 \le \theta_q \le 145$ | $30 \le \psi_q < 50$ |
| 42 | $165 \le \phi_q < 175$ | $-5 \le \theta_q \le 65$ | $30 \le \psi_q < 50$ |
| 43 | $165 \le \phi_q < 175$ | $75 \le \theta_q \le 135$ | $30 \le \psi_q < 50$ |
| 44 | $175 \le \phi_q \le 185$ | $-5 \le \theta_q \le 65$ | $30 \le \psi_q < 50$ |
| 45 | $175 \le \phi_q \le 185$ | $85 \le \theta_q \le 135$ | $30 \le \psi_q < 50$ |
| 46 | $175 \le \phi_q \le 185$ | $175 \le \theta_q \le 185$ | $30 \le \psi_q < 50$ |

38

TABLE 4

| CON-DITION | $\phi_q$ RANGE[°] | $\theta_q$ RANGE[°] | $\psi_q$ RANGE[°] |
|---|---|---|---|
| 1 | $-5 \le \phi_q < 5$ | $25 \le \theta_q \le 65$ | $50 \le \psi_q < 70$ |
| 2 | $-5 \le \phi_q < 5$ | $125 \le \theta_q \le 165$ | $50 \le \psi_q < 70$ |
| 3 | $5 \le \phi_q < 15$ | $15 \le \theta_q \le 65$ | $50 \le \psi_q < 70$ |
| 4 | $5 \le \phi_q < 15$ | $105 \le \theta_q \le 165$ | $50 \le \psi_q < 70$ |
| 5 | $15 \le \phi_q < 25$ | $-5 \le \theta_q \le 65$ | $50 \le \psi_q < 70$ |
| 6 | $15 \le \phi_q < 25$ | $75 \le \theta_q \le 185$ | $50 \le \psi_q < 70$ |
| 7 | $25 \le \phi_q < 35$ | $-5 \le \theta_q \le 185$ | $50 \le \psi_q < 70$ |
| 8 | $35 \le \phi_q < 45$ | $-5 \le \theta_q \le 175$ | $50 \le \psi_q < 70$ |
| 9 | $45 \le \phi_q < 55$ | $25 \le \theta_q \le 85$ | $50 \le \psi_q < 70$ |
| 10 | $45 \le \phi_q < 55$ | $95 \le \theta_q \le 145$ | $50 \le \psi_q < 70$ |
| 11 | $55 \le \phi_q < 65$ | $25 \le \theta_q \le 65$ | $50 \le \psi_q < 70$ |
| 12 | $55 \le \phi_q < 65$ | $75 \le \theta_q \le 145$ | $50 \le \psi_q < 70$ |
| 13 | $65 \le \phi_q < 75$ | $15 \le \theta_q \le 135$ | $50 \le \psi_q < 70$ |
| 14 | $75 \le \phi_q < 85$ | $5 \le \theta_q \le 125$ | $50 \le \psi_q < 70$ |
| 15 | $75 \le \phi_q < 85$ | $175 \le \theta_q \le 185$ | $50 \le \psi_q < 70$ |
| 16 | $85 \le \phi_q < 95$ | $-5 \le \theta_q \le 105$ | $50 \le \psi_q < 70$ |
| 17 | $85 \le \phi_q < 95$ | $145 \le \theta_q \le 185$ | $50 \le \psi_q < 70$ |
| 18 | $95 \le \phi_q < 105$ | $-5 \le \theta_q \le 85$ | $50 \le \psi_q < 70$ |
| 19 | $95 \le \phi_q < 105$ | $135 \le \theta_q \le 185$ | $50 \le \psi_q < 70$ |
| 20 | $105 \le \phi_q < 115$ | $25 \le \theta_q \le 75$ | $50 \le \psi_q < 70$ |
| 21 | $105 \le \phi_q < 115$ | $125 \le \theta_q \le 165$ | $50 \le \psi_q < 70$ |
| 22 | $115 \le \phi_q < 125$ | $25 \le \theta_q \le 65$ | $50 \le \psi_q < 70$ |
| 23 | $115 \le \phi_q < 125$ | $125 \le \theta_q \le 165$ | $50 \le \psi_q < 70$ |
| 24 | $125 \le \phi_q < 135$ | $15 \le \theta_q \le 65$ | $50 \le \psi_q < 70$ |
| 25 | $125 \le \phi_q < 135$ | $105 \le \theta_q \le 165$ | $50 \le \psi_q < 70$ |
| 26 | $135 \le \phi_q < 145$ | $-5 \le \theta_q \le 65$ | $50 \le \psi_q < 70$ |
| 27 | $135 \le \phi_q < 145$ | $75 \le \theta_q \le 185$ | $50 \le \psi_q < 70$ |
| 28 | $145 \le \phi_q < 155$ | $-5 \le \theta_q \le 185$ | $50 \le \psi_q < 70$ |
| 29 | $155 \le \phi_q < 165$ | $-5 \le \theta_q \le 175$ | $50 \le \psi_q < 70$ |
| 30 | $165 \le \phi_q < 175$ | $25 \le \theta_q \le 85$ | $50 \le \psi_q < 70$ |
| 31 | $165 \le \phi_q < 175$ | $95 \le \theta_q \le 145$ | $50 \le \psi_q < 70$ |
| 32 | $175 \le \phi_q \le 185$ | $25 \le \theta_q \le 145$ | $50 \le \psi_q < 70$ |

TABLE 5

| CON-DITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 95$ | $70 \le \psi_q < 90$ |
| 2 | $-5 \le \phi_q < 5$ | $105 \le \theta_q \le 185$ | $70 \le \psi_q < 90$ |
| 3 | $5 \le \phi_q < 15$ | $-5 \le \theta_q \le 165$ | $70 \le \psi_q < 90$ |
| 4 | $15 \le \phi_q < 25$ | $-5 \le \theta_q \le 155$ | $70 \le \psi_q < 90$ |
| 5 | $25 \le \phi_q < 35$ | $35 \le \theta_q \le 165$ | $70 \le \psi_q < 90$ |
| 6 | $35 \le \phi_q < 45$ | $35 \le \theta_q \le 185$ | $70 \le \psi_q < 90$ |
| 7 | $45 \le \phi_q < 55$ | $25 \le \theta_q \le 185$ | $70 \le \psi_q < 90$ |
| 8 | $55 \le \phi_q < 65$ | $5 \le \theta_q \le 175$ | $70 \le \psi_q < 90$ |
| 9 | $65 \le \phi_q < 75$ | $-5 \le \theta_q \le 145$ | $70 \le \psi_q < 90$ |
| 10 | $75 \le \phi_q < 85$ | $-5 \le \theta_q \le 135$ | $70 \le \psi_q < 90$ |
| 11 | $85 \le \phi_q < 95$ | $25 \le \theta_q \le 135$ | $70 \le \psi_q < 90$ |
| 12 | $95 \le \phi_q < 105$ | $25 \le \theta_q \le 155$ | $70 \le \psi_q < 90$ |
| 13 | $95 \le \phi_q < 105$ | $175 \le \theta_q \le 185$ | $70 \le \psi_q < 90$ |
| 14 | $105 \le \phi_q < 115$ | $15 \le \theta_q \le 95$ | $70 \le \psi_q < 90$ |
| 15 | $105 \le \phi_q < 115$ | $105 \le \theta_q \le 185$ | $70 \le \psi_q < 90$ |
| 16 | $115 \le \phi_q < 125$ | $-5 \le \theta_q \le 95$ | $70 \le \psi_q < 90$ |
| 17 | $115 \le \phi_q < 125$ | $105 \le \theta_q \le 185$ | $70 \le \psi_q < 90$ |
| 18 | $125 \le \phi_q < 135$ | $-5 \le \theta_q \le 165$ | $70 \le \psi_q < 90$ |
| 19 | $135 \le \phi_q < 145$ | $-5 \le \theta_q \le 155$ | $70 \le \psi_q < 90$ |
| 20 | $145 \le \phi_q < 155$ | $35 \le \theta_q \le 165$ | $70 \le \psi_q < 90$ |
| 21 | $155 \le \phi_q < 165$ | $35 \le \theta_q \le 185$ | $70 \le \psi_q < 90$ |
| 22 | $165 \le \phi_q < 175$ | $25 \le \theta_q \le 185$ | $70 \le \psi_q < 90$ |
| 23 | $175 \le \phi_q \le 185$ | $5 \le \theta_q \le 175$ | $70 \le \psi_q < 90$ |

TABLE 6

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 5$ | $90 \le \psi_q < 110$ |
| 2 | $-5 \le \phi_q < 5$ | $15 \le \theta_q \le 185$ | $90 \le \psi_q < 110$ |
| 3 | $5 \le \phi_q < 15$ | $25 \le \theta_q \le 185$ | $90 \le \psi_q < 110$ |
| 4 | $15 \le \phi_q < 25$ | $35 \le \theta_q \le 185$ | $90 \le \psi_q < 110$ |
| 5 | $25 \le \phi_q < 35$ | $45 \le \theta_q \le 155$ | $90 \le \psi_q < 110$ |
| 6 | $35 \le \phi_q < 45$ | $5 \le \theta_q \le 15$ | $90 \le \psi_q < 110$ |

TABLE 6-continued

| CONDITION | $\phi_q$ RANGE[°] | $\theta_q$ RANGE[°] | $\psi_q$ RANGE[°] |
|---|---|---|---|
| 7 | $35 \le \phi_q < 45$ | $25 \le \theta_q \le 155$ | $90 \le \psi_q < 110$ |
| 8 | $45 \le \phi_q < 55$ | $-5 \le \theta_q \le 165$ | $90 \le \psi_q < 110$ |
| 9 | $55 \le \phi_q < 65$ | $-5 \le \theta_q \le 75$ | $90 \le \psi_q < 110$ |
| 10 | $55 \le \phi_q < 65$ | $95 \le \theta_q \le 185$ | $90 \le \psi_q < 110$ |
| 11 | $65 \le \phi_q < 75$ | $15 \le \theta_q \le 185$ | $90 \le \psi_q < 110$ |
| 12 | $75 \le \phi_q < 85$ | $25 \le \theta_q \le 175$ | $90 \le \psi_q < 110$ |
| 13 | $85 \le \phi_q < 95$ | $15 \le \theta_q \le 155$ | $90 \le \psi_q < 110$ |
| 14 | $95 \le \phi_q < 105$ | $-5 \le \theta_q \le 145$ | $90 \le \psi_q < 110$ |
| 15 | $105 \le \phi_q < 115$ | $-5 \le \theta_q \le 155$ | $90 \le \psi_q < 110$ |
| 16 | $115 \le \phi_q < 125$ | $-5 \le \theta_q \le 5$ | $90 \le \psi_q < 110$ |
| 17 | $115 \le \phi_q < 125$ | $15 \le \theta_q \le 185$ | $90 \le \psi_q < 110$ |
| 18 | $125 \le \phi_q < 135$ | $25 \le \theta_q \le 185$ | $90 \le \psi_q < 110$ |
| 19 | $135 \le \phi_q < 145$ | $35 \le \theta_q \le 185$ | $90 \le \psi_q < 110$ |
| 20 | $145 \le \phi_q < 155$ | $45 \le \theta_q \le 155$ | $90 \le \psi_q < 110$ |
| 21 | $155 \le \phi_q < 165$ | $5 \le \theta_q \le 15$ | $90 \le \psi_q < 110$ |
| 22 | $155 \le \phi_q < 165$ | $25 \le \theta_q \le 155$ | $90 \le \psi_q < 110$ |
| 23 | $165 \le \phi_q < 175$ | $-5 \le \theta_q \le 165$ | $90 \le \psi_q < 110$ |
| 24 | $175 \le \phi_q \le 185$ | $-5 \le \theta_q \le 75$ | $90 \le \psi_q < 110$ |
| 25 | $175 \le \phi_q \le 185$ | $95 \le \theta_q \le 185$ | $90 \le \psi_q < 110$ |

TABLE 7

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $35 \le \theta_q \le 95$ | $110 \le \psi_q < 130$ |
| 2 | $-5 \le \phi_q < 5$ | $105 \le \theta_q \le 155$ | $110 \le \psi_q < 130$ |
| 3 | $5 \le \phi_q < 15$ | $45 \le \theta_q \le 165$ | $110 \le \psi_q < 130$ |
| 4 | $15 \le \phi_q < 25$ | $45 \le \theta_q \le 185$ | $110 \le \psi_q < 130$ |
| 5 | $25 \le \phi_q < 35$ | $-5 \le \theta_q \le 35$ | $110 \le \psi_q < 130$ |
| 6 | $25 \le \phi_q < 35$ | $65 \le \theta_q \le 185$ | $110 \le \psi_q < 130$ |
| 7 | $35 \le \phi_q < 45$ | $-5 \le \theta_q \le 45$ | $110 \le \psi_q < 130$ |
| 8 | $35 \le \phi_q < 45$ | $85 \le \theta_q \le 185$ | $110 \le \psi_q < 130$ |
| 9 | $45 \le \phi_q < 55$ | $15 \le \theta_q \le 45$ | $110 \le \psi_q < 130$ |
| 10 | $45 \le \phi_q < 55$ | $105 \le \theta_q \le 155$ | $110 \le \psi_q < 130$ |
| 11 | $55 \le \phi_q < 65$ | $15 \le \theta_q \le 55$ | $110 \le \psi_q < 130$ |
| 12 | $55 \le \phi_q < 65$ | $115 \le \theta_q \le 155$ | $110 \le \psi_q < 130$ |
| 13 | $65 \le \phi_q < 75$ | $5 \le \theta_q \le 65$ | $110 \le \psi_q < 130$ |
| 14 | $65 \le \phi_q < 75$ | $125 \le \theta_q \le 165$ | $110 \le \psi_q < 130$ |
| 15 | $75 \le \phi_q < 85$ | $-5 \le \theta_q \le 75$ | $110 \le \psi_q < 130$ |
| 16 | $75 \le \phi_q < 85$ | $125 \le \theta_q \le 185$ | $110 \le \psi_q < 130$ |
| 17 | $85 \le \phi_q < 95$ | $-5 \le \theta_q \le 185$ | $110 \le \psi_q < 130$ |
| 18 | $95 \le \phi_q < 105$ | $-5 \le \theta_q \le 5$ | $110 \le \psi_q < 130$ |
| 19 | $95 \le \phi_q < 105$ | $15 \le \theta_q \le 85$ | $110 \le \psi_q < 130$ |
| 20 | $95 \le \phi_q < 105$ | $95 \le \theta_q \le 175$ | $110 \le \psi_q < 130$ |
| 21 | $105 \le \phi_q < 115$ | $25 \le \theta_q \le 155$ | $110 \le \psi_q < 130$ |
| 22 | $115 \le \phi_q < 125$ | $35 \le \theta_q \le 95$ | $110 \le \psi_q < 130$ |
| 23 | $115 \le \phi_q < 125$ | $105 \le \theta_q \le 155$ | $110 \le \psi_q < 130$ |
| 24 | $125 \le \phi_q < 135$ | $45 \le \theta_q \le 165$ | $110 \le \psi_q < 130$ |
| 25 | $135 \le \phi_q < 145$ | $45 \le \theta_q \le 185$ | $110 \le \psi_q < 130$ |
| 26 | $145 \le \phi_q < 155$ | $-5 \le \theta_q \le 35$ | $110 \le \psi_q < 130$ |
| 27 | $145 \le \phi_q < 155$ | $65 \le \theta_q \le 185$ | $110 \le \psi_q < 130$ |
| 28 | $155 \le \phi_q < 165$ | $-5 \le \theta_q \le 45$ | $110 \le \psi_q < 130$ |
| 29 | $155 \le \phi_q < 165$ | $85 \le \theta_q \le 185$ | $110 \le \psi_q < 130$ |
| 30 | $165 \le \phi_q < 175$ | $15 \le \theta_q \le 45$ | $110 \le \psi_q < 130$ |
| 31 | $165 \le \phi_q < 175$ | $105 \le \theta_q \le 155$ | $110 \le \psi_q < 130$ |
| 32 | $175 \le \phi_q \le 185$ | $15 \le \theta_q \le 55$ | $110 \le \psi_q < 130$ |
| 33 | $175 \le \phi_q \le 185$ | $115 \le \theta_q \le 155$ | $110 \le \psi_q < 130$ |

TABLE 8

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $45 \le \theta_q \le 105$ | $130 \le \psi_q < 150$ |
| 2 | $-5 \le \phi_q < 5$ | $115 \le \theta_q \le 175$ | $130 \le \psi_q < 150$ |
| 3 | $5 \le \phi_q < 15$ | $-5 \le \theta_q \le 25$ | $130 \le \psi_q < 150$ |
| 4 | $5 \le \phi_q < 15$ | $65 \le \theta_q \le 105$ | $130 \le \psi_q < 150$ |
| 5 | $5 \le \phi_q < 15$ | $125 \le \theta_q \le 165$ | $130 \le \psi_q < 150$ |
| 6 | $15 \le \phi_q < 25$ | $-5 \le \theta_q \le 35$ | $130 \le \psi_q < 150$ |
| 7 | $15 \le \phi_q < 25$ | $65 \le \theta_q \le 105$ | $130 \le \psi_q < 150$ |
| 8 | $15 \le \phi_q < 25$ | $135 \le \theta_q \le 165$ | $130 \le \psi_q < 150$ |
| 9 | $25 \le \phi_q < 35$ | $5 \le \theta_q \le 35$ | $130 \le \psi_q < 150$ |
| 10 | $25 \le \phi_q < 35$ | $75 \le \theta_q \le 115$ | $130 \le \psi_q < 150$ |
| 11 | $25 \le \phi_q < 35$ | $135 \le \theta_q \le 165$ | $130 \le \psi_q < 150$ |
| 12 | $35 \le \phi_q < 45$ | $15 \le \theta_q \le 35$ | $130 \le \psi_q < 150$ |
| 13 | $35 \le \phi_q < 45$ | $85 \le \theta_q \le 125$ | $130 \le \psi_q < 150$ |
| 14 | $35 \le \phi_q < 45$ | $145 \le \theta_q \le 185$ | $130 \le \psi_q < 150$ |
| 15 | $45 \le \phi_q < 55$ | $5 \le \theta_q \le 45$ | $130 \le \psi_q < 150$ |
| 16 | $45 \le \phi_q < 55$ | $95 \le \theta_q \le 185$ | $130 \le \psi_q < 150$ |
| 17 | $55 \le \phi_q < 65$ | $-5 \le \theta_q \le 45$ | $130 \le \psi_q < 150$ |
| 18 | $55 \le \phi_q < 65$ | $95 \le \theta_q \le 145$ | $130 \le \psi_q < 150$ |
| 19 | $55 \le \phi_q < 65$ | $165 \le \theta_q \le 185$ | $130 \le \psi_q < 150$ |
| 20 | $65 \le \phi_q < 75$ | $-5 \le \theta_q \le 55$ | $130 \le \psi_q < 150$ |
| 21 | $65 \le \phi_q < 75$ | $105 \le \theta_q \le 155$ | $130 \le \psi_q < 150$ |
| 22 | $75 \le \phi_q < 85$ | $-5 \le \theta_q \le 5$ | $130 \le \psi_q < 150$ |
| 23 | $75 \le \phi_q < 85$ | $15 \le \theta_q \le 55$ | $130 \le \psi_q < 150$ |
| 24 | $75 \le \phi_q < 85$ | $65 \le \theta_q \le 85$ | $130 \le \psi_q < 150$ |
| 25 | $75 \le \phi_q < 85$ | $95 \le \theta_q \le 105$ | $130 \le \psi_q < 150$ |
| 26 | $75 \le \phi_q < 85$ | $115 \le \theta_q \le 155$ | $130 \le \psi_q < 150$ |
| 27 | $85 \le \phi_q < 95$ | $35 \le \theta_q \le 65$ | $130 \le \psi_q < 150$ |
| 28 | $85 \le \phi_q < 95$ | $85 \le \theta_q \le 95$ | $130 \le \psi_q < 150$ |
| 29 | $85 \le \phi_q < 95$ | $115 \le \theta_q \le 125$ | $130 \le \psi_q < 150$ |
| 30 | $85 \le \phi_q < 95$ | $135 \le \theta_q \le 165$ | $130 \le \psi_q < 150$ |
| 31 | $95 \le \phi_q < 105$ | $35 \le \theta_q \le 95$ | $130 \le \psi_q < 150$ |
| 32 | $95 \le \phi_q < 105$ | $115 \le \theta_q \le 185$ | $130 \le \psi_q < 150$ |
| 33 | $105 \le \phi_q < 115$ | $45 \le \theta_q \le 95$ | $130 \le \psi_q < 150$ |
| 34 | $105 \le \phi_q < 115$ | $135 \le \theta_q \le 185$ | $130 \le \psi_q < 150$ |
| 35 | $115 \le \phi_q < 125$ | $45 \le \theta_q \le 105$ | $130 \le \psi_q < 150$ |
| 36 | $115 \le \phi_q < 125$ | $115 \le \theta_q \le 175$ | $130 \le \psi_q < 150$ |
| 37 | $125 \le \phi_q < 135$ | $-5 \le \theta_q \le 25$ | $130 \le \psi_q < 150$ |
| 38 | $125 \le \phi_q < 135$ | $65 \le \theta_q \le 105$ | $130 \le \psi_q < 150$ |
| 39 | $125 \le \phi_q < 135$ | $125 \le \theta_q \le 165$ | $130 \le \psi_q < 150$ |
| 40 | $135 \le \phi_q < 145$ | $-5 \le \theta_q \le 35$ | $130 \le \psi_q < 150$ |
| 41 | $135 \le \phi_q < 145$ | $65 \le \theta_q \le 105$ | $130 \le \psi_q < 150$ |
| 42 | $135 \le \phi_q < 145$ | $135 \le \theta_q \le 165$ | $130 \le \psi_q < 150$ |
| 43 | $145 \le \phi_q < 155$ | $5 \le \theta_q \le 35$ | $130 \le \psi_q < 150$ |
| 44 | $145 \le \phi_q < 155$ | $75 \le \theta_q \le 115$ | $130 \le \psi_q < 150$ |
| 45 | $145 \le \phi_q < 155$ | $135 \le \theta_q \le 165$ | $130 \le \psi_q < 150$ |
| 46 | $155 \le \phi_q < 165$ | $15 \le \theta_q \le 35$ | $130 \le \psi_q < 150$ |
| 47 | $155 \le \phi_q < 165$ | $85 \le \theta_q \le 125$ | $130 \le \psi_q < 150$ |
| 48 | $155 \le \phi_q < 165$ | $145 \le \theta_q \le 185$ | $130 \le \psi_q < 150$ |
| 49 | $165 \le \phi_q < 175$ | $5 \le \theta_q \le 45$ | $130 \le \psi_q < 150$ |
| 50 | $165 \le \phi_q < 175$ | $95 \le \theta_q \le 185$ | $130 \le \psi_q < 150$ |
| 51 | $175 \le \phi_q \le 185$ | $-5 \le \theta_q \le 45$ | $130 \le \psi_q < 150$ |
| 52 | $175 \le \phi_q \le 185$ | $95 \le \theta_q \le 145$ | $130 \le \psi_q < 150$ |
| 53 | $175 \le \phi_q \le 185$ | $165 \le \theta_q \le 185$ | $130 \le \psi_q < 150$ |

TABLE 9

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $-5 \le \theta_q \le 35$ | $150 \le \psi_q < 170$ |
| 2 | $-5 \le \phi_q < 5$ | $75 \le \theta_q \le 185$ | $150 \le \psi_q < 170$ |
| 3 | $5 \le \phi_q < 15$ | $5 \le \theta_q \le 35$ | $150 \le \psi_q < 170$ |
| 4 | $5 \le \phi_q < 15$ | $75 \le \theta_q \le 185$ | $150 \le \psi_q < 170$ |
| 5 | $15 \le \phi_q < 25$ | $5 \le \theta_q \le 35$ | $150 \le \psi_q < 170$ |
| 6 | $15 \le \phi_q < 25$ | $75 \le \theta_q \le 105$ | $150 \le \psi_q < 170$ |
| 7 | $15 \le \phi_q < 25$ | $135 \le \theta_q \le 175$ | $150 \le \psi_q < 170$ |
| 8 | $25 \le \phi_q < 35$ | $5 \le \theta_q \le 35$ | $150 \le \psi_q < 170$ |
| 9 | $25 \le \phi_q < 35$ | $75 \le \theta_q \le 105$ | $150 \le \psi_q < 170$ |
| 10 | $25 \le \phi_q < 35$ | $145 \le \theta_q \le 165$ | $150 \le \psi_q < 170$ |
| 11 | $35 \le \phi_q < 45$ | $-5 \le \theta_q \le 35$ | $150 \le \psi_q < 170$ |
| 12 | $35 \le \phi_q < 45$ | $85 \le \theta_q \le 115$ | $150 \le \psi_q < 170$ |
| 13 | $35 \le \phi_q < 45$ | $145 \le \theta_q \le 165$ | $150 \le \psi_q < 170$ |
| 14 | $45 \le \phi_q < 55$ | $-5 \le \theta_q \le 35$ | $150 \le \psi_q < 170$ |
| 15 | $45 \le \phi_q < 55$ | $85 \le \theta_q \le 115$ | $150 \le \psi_q < 170$ |
| 16 | $45 \le \phi_q < 55$ | $145 \le \theta_q \le 165$ | $150 \le \psi_q < 170$ |
| 17 | $55 \le \phi_q < 65$ | $-5 \le \theta_q \le 5$ | $150 \le \psi_q < 170$ |
| 18 | $55 \le \phi_q < 65$ | $65 \le \theta_q \le 115$ | $150 \le \psi_q < 170$ |
| 19 | $55 \le \phi_q < 65$ | $145 \le \theta_q \le 185$ | $150 \le \psi_q < 170$ |
| 20 | $65 \le \phi_q < 75$ | $45 \le \theta_q \le 125$ | $150 \le \psi_q < 170$ |
| 21 | $65 \le \phi_q < 75$ | $155 \le \theta_q \le 185$ | $150 \le \psi_q < 170$ |
| 22 | $75 \le \phi_q < 85$ | $45 \le \theta_q \le 145$ | $150 \le \psi_q < 170$ |
| 23 | $75 \le \phi_q < 85$ | $155 \le \theta_q \le 185$ | $150 \le \psi_q < 170$ |
| 24 | $85 \le \phi_q < 95$ | $45 \le \theta_q \le 155$ | $150 \le \psi_q < 170$ |
| 25 | $95 \le \phi_q < 105$ | $65 \le \theta_q \le 155$ | $150 \le \psi_q < 170$ |
| 26 | $105 \le \phi_q < 115$ | $-5 \le \theta_q \le 15$ | $150 \le \psi_q < 170$ |
| 27 | $105 \le \phi_q < 115$ | $75 \le \theta_q \le 165$ | $150 \le \psi_q < 170$ |
| 28 | $115 \le \phi_q < 125$ | $-5 \le \theta_q \le 35$ | $150 \le \psi_q < 170$ |

TABLE 9-continued

| CONDITION | $\phi_q$ RANGE[°] | $\theta_q$ RANGE[°] | $\psi_q$ RANGE[°] |
|---|---|---|---|
| 29 | $115 \le \phi_q < 125$ | $75 \le \theta_q \le 185$ | $150 \le \psi_q < 170$ |
| 30 | $125 \le \phi_q < 135$ | $5 \le \theta_q \le 35$ | $150 \le \psi_q < 170$ |
| 31 | $125 \le \phi_q < 135$ | $75 \le \theta_q \le 185$ | $150 \le \psi_q < 170$ |
| 32 | $135 \le \phi_q < 145$ | $5 \le \theta_q \le 35$ | $150 \le \psi_q < 170$ |
| 33 | $135 \le \phi_q < 145$ | $75 \le \theta_q \le 105$ | $150 \le \psi_q < 170$ |
| 34 | $135 \le \phi_q < 145$ | $135 \le \theta_q \le 175$ | $150 \le \psi_q < 170$ |
| 35 | $145 \le \phi_q < 155$ | $5 \le \theta_q \le 35$ | $150 \le \psi_q < 170$ |
| 36 | $145 \le \phi_q < 155$ | $75 \le \theta_q \le 105$ | $150 \le \psi_q < 170$ |
| 37 | $145 \le \phi_q < 155$ | $145 \le \theta_q \le 165$ | $150 \le \psi_q < 170$ |
| 38 | $155 \le \phi_q < 165$ | $-5 \le \theta_q \le 35$ | $150 \le \psi_q < 170$ |
| 39 | $155 \le \phi_q < 165$ | $85 \le \theta_q \le 115$ | $150 \le \psi_q < 170$ |
| 40 | $155 \le \phi_q < 165$ | $145 \le \theta_q \le 165$ | $150 \le \psi_q < 170$ |
| 41 | $165 \le \phi_q < 175$ | $-5 \le \theta_q \le 35$ | $150 \le \psi_q < 170$ |
| 42 | $165 \le \phi_q < 175$ | $85 \le \theta_q \le 115$ | $150 \le \psi_q < 170$ |
| 43 | $165 \le \phi_q < 175$ | $145 \le \theta_q \le 165$ | $150 \le \psi_q < 170$ |
| 44 | $175 \le \phi_q \le 185$ | $-5 \le \theta_q \le 5$ | $150 \le \psi_q < 170$ |
| 45 | $175 \le \phi_q \le 185$ | $55 \le \theta_q \le 115$ | $150 \le \psi_q < 170$ |
| 46 | $175 \le \phi_q \le 185$ | $145 \le \theta_q \le 185$ | $150 \le \psi_q < 170$ |

TABLE 10

| CONDITION | $\phi_q$ RANGE[°] | $\theta_q$ RANGE[°] | $\psi_q$ RANGE[°] |
|---|---|---|---|
| 1 | $-5 \le \phi_q < 5$ | $5 \le \theta_q \le 35$ | $170 \le \psi_q \le 190$ |
| 2 | $-5 \le \phi_q < 5$ | $85 \le \theta_q \le 155$ | $170 \le \psi_q \le 190$ |
| 3 | $5 \le \phi_q < 15$ | $5 \le \theta_q \le 35$ | $170 \le \psi_q \le 190$ |
| 4 | $5 \le \phi_q < 15$ | $85 \le \theta_q \le 155$ | $170 \le \psi_q \le 190$ |

TABLE 10-continued

| CONDITION | $\phi_q$ RANGE[°] | $\theta_q$ RANGE[°] | $\psi_q$ RANGE[°] |
|---|---|---|---|
| 5 | $15 \le \phi_q < 25$ | $-5 \le \theta_q \le 25$ | $170 \le \psi_q \le 190$ |
| 6 | $15 \le \phi_q < 25$ | $75 \le \theta_q \le 185$ | $170 \le \psi_q \le 190$ |
| 7 | $25 \le \phi_q < 35$ | $-5 \le \theta_q \le 25$ | $170 \le \psi_q \le 190$ |
| 8 | $25 \le \phi_q < 35$ | $75 \le \theta_q \le 185$ | $170 \le \psi_q \le 190$ |
| 9 | $35 \le \phi_q < 45$ | $-5 \le \theta_q \le 5$ | $170 \le \psi_q \le 190$ |
| 10 | $35 \le \phi_q < 45$ | $75 \le \theta_q \le 115$ | $170 \le \psi_q \le 190$ |
| 11 | $35 \le \phi_q < 45$ | $145 \le \theta_q \le 175$ | $170 \le \psi_q \le 190$ |
| 12 | $45 \le \phi_q < 55$ | $65 \le \theta_q \le 115$ | $170 \le \psi_q \le 190$ |
| 13 | $45 \le \phi_q < 55$ | $145 \le \theta_q \le 175$ | $170 \le \psi_q \le 190$ |
| 14 | $55 \le \phi_q < 65$ | $45 \le \theta_q \le 105$ | $170 \le \psi_q \le 190$ |
| 15 | $55 \le \phi_q < 65$ | $145 \le \theta_q \le 165$ | $170 \le \psi_q \le 190$ |
| 16 | $65 \le \phi_q < 75$ | $55 \le \theta_q \le 105$ | $170 \le \psi_q \le 190$ |
| 17 | $65 \le \phi_q < 75$ | $145 \le \theta_q \le 165$ | $170 \le \psi_q \le 190$ |
| 18 | $75 \le \phi_q < 85$ | $65 \le \theta_q \le 115$ | $170 \le \psi_q \le 190$ |
| 19 | $75 \le \phi_q < 85$ | $145 \le \theta_q \le 185$ | $170 \le \psi_q \le 190$ |
| 20 | $85 \le \phi_q < 95$ | $-5 \le \theta_q \le 25$ | $170 \le \psi_q \le 190$ |
| 21 | $85 \le \phi_q < 95$ | $75 \le \theta_q \le 125$ | $170 \le \psi_q \le 190$ |
| 22 | $85 \le \phi_q < 95$ | $135 \le \theta_q \le 185$ | $170 \le \psi_q \le 190$ |
| 23 | $105 \le \phi_q \le 115$ | $5 \le \theta_q \le 35$ | $170 \le \psi_q \le 190$ |

17. The acoustic wave device according to claim 10, further comprising a protective film provided on the piezo-electric layer to cover the IDT electrode.

18. The acoustic wave device according to claim 17, wherein the protective film includes silicon oxide or silicon nitride.

\* \* \* \* \*